United States Patent [19]
Tadaki et al.

[11] Patent Number: 5,831,300
[45] Date of Patent: Nov. 3, 1998

[54] SEMICONDUCTOR INTEGRATED CIRCUIT DEVICE INCLUDING A MEMORY DEVICE HAVING MEMORY CELLS WITH INCREASED INFORMATION STORAGE CAPACITANCE AND METHOD OF MANUFACTURING SAME

[75] Inventors: Yoshitaka Tadaki, Hanno; Jun Murata, Kunitachi; Toshihiro Sekiguchi, Hidaka; Hideo Aoki, Hamura; Keizo Kawakita, Ome; Hiroyuki Uchiyama, Higashimurayama; Michio Nishimura, Tokorozawa; Michio Tanaka, Ome; Yuji Ezaki, Fussa; Kazuhiko Saitoh, Ibaraki-ken; Katsuo Yuhara, Ome; Songsu Cho, Ibaraki-ken, all of Japan

[73] Assignees: Hitachi, Ltd., Tokyo, Japan; Texas Instruments Incorporated, Dallas, Tex.

[21] Appl. No.: 731,489

[22] Filed: Oct. 16, 1996

Related U.S. Application Data

[63] Continuation of Ser. No. 341,966, Nov. 16, 1994, Pat. No. 5,578,849.

[30] Foreign Application Priority Data

Nov. 19, 1993 [JP] Japan .................................. 5-290777

[51] Int. Cl.$^6$ .................... H01L 27/108; H01L 29/76; H01L 29/94; H01L 31/119
[52] U.S. Cl. .................... 257/298; 257/300; 257/303; 257/306; 257/309; 365/185.01
[58] Field of Search ................................. 257/296, 298, 257/300, 303, 306, 307, 308, 309; 365/185.01

[56] References Cited

U.S. PATENT DOCUMENTS 5,309,386  5/1994  Yusuki et al. .................... 257/309 X
5,398,205  3/1995  Yamaguchi .................... 257/309 X
5,442,212  8/1995  Eimori .................... 257/303
5,578,849  11/1996  Tadaki et al. .................... 257/298

FOREIGN PATENT DOCUMENTS 3072675  3/1991  Japan .
5013673  1/1993  Japan .
6005811  1/1994  Japan .

Primary Examiner—William Mintel
Attorney, Agent, or Firm—Antonelli, Terry, Stout & Kraus, LLP

[57] ABSTRACT

A semiconductor memory device has a semiconductor substrate, word line conductors and bit line conductors, and memory cells provided at intersections between the word line conductors and bit line conductors. Adjacent two memory cells for each bit line conductor form a memory cell pair unit structure, in which first semiconductor regions of the transistors of the adjacent two memory cells are united at their boundary into a single region and are connected to one of the bit line conductors via a bit line connection conductor, the gate electrodes of the transistors of the adjacent two memory cells are connected to word line conductors adjacent to each other, respectively, the second semiconductor regions of the transistors of the adjacent two memory cells are connected to the respective information storage capacitors. A series of memory cell pair unit structures formed under one bit line conductor is positionally shifted with respect to the series of memory cell pair unit structures formed under adjacent first and second bit line conductors on opposite sides of the one bit line conductor, respectively, such that a second information storage capacitor of a memory cell pair unit structure formed under the adjacent first bit line conductor and a first information storage capacitor of a memory cell pair unit structure formed under the adjacent second bit line conductor are located adjacent to a bit line connection conductor of a memory cell pair unit structure formed under the one bit line conductor.

25 Claims, 44 Drawing Sheets

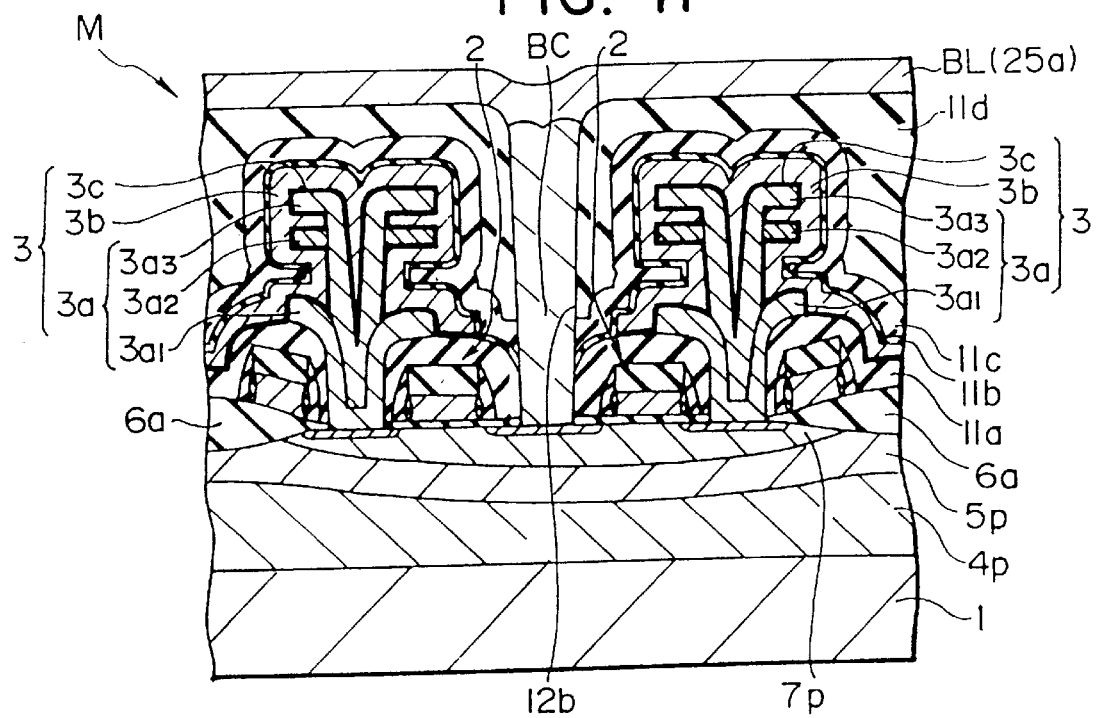
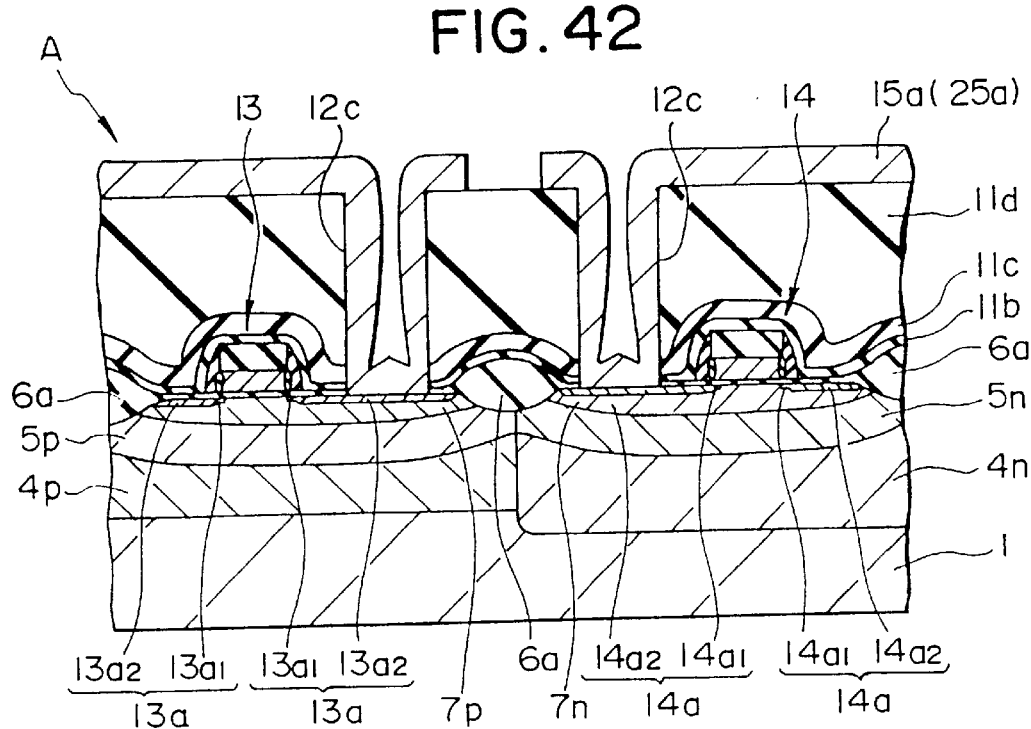

SEMICONDUCTOR INTEGRATED CIRCUIT DEVICE INCLUDING A MEMORY DEVICE HAVING MEMORY CELLS WITH INCREASED INFORMATION STORAGE CAPACITANCE AND METHOD OF MANUFACTURING SAME

This application is a continuation application of application Ser. No. 08/341,966, filed Nov. 16, 1994, now U.S. Pat. No. 5,578,849.

BACKGROUND OF THE INVENTION

The present invention relates to a semiconductor integrated circuit device and manufacturing techniques therefor, and more particularly to techniques which are effectively applied to a semiconductor integrated circuit device having a DRAM (Dynamic RAM). It is first noted that in the following description, an n-channel MOS FET is abbreviated as "nMOS" and a p-channel MOS FET as "pMOS".

The number of bits in DRAMs has been more and more increased. This is because the DRAM has characteristics suitable for enhancing the integration degree: for example, the cell structure of a DRAM is rather simple among all kinds of semiconductor memories; the pattern design is regularly made so that a large scaled design is possible for the DRAM; the cell area can be made small; and so on.

With further progressive increases in the number of bits in DRAMs, an important problem to be solved is how to ensure a sufficient storage capacitance or capacitors constituting memory cells in the DRAM. This problem is caused mainly by the use of a lower voltage in the DRAM, which lower voltage is promoted in view of reduction in an area occupied by each memory cell and in order to ensure the reliability of the device.

FIG. 74 shows an example of a partial plan view of a conventional memory cell array. A memory cell array 50 includes word line conductors (identified by shaded areas) 51 extending in the vertical direction, when viewed on FIG. 74, which are repetitively arranged along the horizontal direction on FIG. 74.

Bit line conductors 52 extending orthogonal or perpendicular to the word line conductors 51 are repetitively arranged in the vertical direction as viewed in FIG. 74. On both sides of each bit line connector 54 connecting a bit line conductor 52 and a MOS FET (hereinafter simply abbreviated as "MOS") 53, memory cells 55 are arranged. Each of the memory cells 55 is constituted of the MOS 53 and a capacitor 56. The capacitor 56 includes a node electrode 58 provided separately for each individual memory cell, a plate electrode 59 provided in common to plural memory cells and a dielectric film sandwiched therebetween.

Conventionally, the memory cells 55 are positionally shifted by one-half of a periodic pattern alternately to the left and to the right on FIG. 74 each time the bit line conductor 52 is repetitively arranged. For this reason, the capacitors 56 in the plurality of memory cells 55 are linearly aligned in the vertical direction on FIG. 74.

The following references disclose respective proposals of layouts of memory cells:

a. JP-A-5-13673 (laid open on Jan. 22, 1993);

b. JP-A-3-72675 (laid open on Mar. 27, 1991); and c. JP-A-6-5811 (laid open on Jan. 14, 1994).

Formation of channel stoppers by ion implantation through field insulating films formed by the LOCOS technique is shown, for example, in the following references:

d. Extended Abstract of the 21st Conference on Solid State Devices and Materials, Tokyo, 1989, pp. 105–108;

e. JP-A-56-87340 (laid open on Jul. 15, 1981);

f. JP-A-62-298161 (laid open on Dec. 25, 1987) corresponding to U.S. Pat. No. 5,116,775; and g. U.S. Pat. No. 3,860,454 (issued on Jan. 14, 1975).

Examples of structures for electrical connection between bit line conductors and switching transistors of memory cells are disclosed in the following references:

h. Sakaw, et al., "A Capacitor-Over-Bit-Line (COB) Cell With a Hemispherical-Grain Storage Node for 64 Mb DRAMs", in IEDM '90, pp. 655–658; and i. JP-A-5-259405 (laid open on Oct. 8, 1993).

Further, examples of structures of an information storage capacitor of a memory cell are disclosed in the following references:

j. JP-A-5-226583 (laid open on Sep. 3, 1993);

k. JP-A-6-77428 (laid open on Mar. 18, 1994); and l. JP-A-5-82750 (laid open on Apr. 1, 1993).

SUMMARY OF THE INVENTION

However, the present inventors, as a result of investigating conventional techniques, found that the conventional memory cell structure has the following problems.

First, as shown in FIG. 74, since the conventional memory cell structure has the capacitors 56 (particularly node electrodes 58 of the capacitors) in the memory cells 55 linearly aligned along the vertical direction on FIG. 74, an area to be allotted to each capacitor can no longer be increased, considering that a spacing should be ensured for separating adjacent capacitors 56 from each other. This linearly aligned configuration gives rise to structural defects. Also, this structure makes it difficult to take a positioning margin between the adjacent capacitors 56 and capacitor connectors 57 (a portion for achieving an electric connection with a source or a drain of a MOS).

It is therefore an object of the present invention to provide techniques which enable the area of a capacitor constituting a memory cell to be increased without incurring an excessive increase in the entire area of a memory cell array. This results in improving an α-ray resistivity of the memory cell, and increasing an output signal from the memory cell.

According to one aspect of the present invention, there is provided a semiconductor memory device comprising a semiconductor substrate, a plurality of word line conductors and a plurality of bit line conductors formed over the substrate, and a plurality of memory cells each provided at an intersection between one of the word line conductors and one of the bit line conductors, wherein:

adjacent two memory cells for each bit line conductor form a memory cell pair unit structure, in which each of the memory cell pair unit structures includes a first information storage capacitor, a first switching transistor, a second switching transistor and a second information storage capacitor arranged in the described order under one of the bit line conductors in a lengthwise direction of the bit line conductors, each of the transistors having a pair of semiconductor regions formed in the substrate and a control electrode formed between the pair of semiconductor regions over the substrate, an electric current being caused to flow between the pair of semiconductor regions when the transistor is conductive responsive to a control signal applied to the control electrode, one of the pair of semiconductor regions of the first transistor and one of the pair of semiconductor regions of the second transistor being united at their boundary into a single region and being connected to one of the bit line conductors via a bit line connection conductor, the gate electrodes of the first and second transistors being connected to word line conductors adjacent to each other, respectively, the others of the pair of semiconductor regions of the first and second transistors being connected to the first and second information storage capacitors, respectively, the first information storage capacitor and the first switching transistor forming one of the adjacent two memory cells, the second information storage capacitor and the second switching transistor forming the other of the adjacent two memory cells; and a series of memory cell pair unit structures formed under one bit line conductor is positionally shifted with respect to a series of memory cell pair unit structures formed under adjacent first and second bit line conductors on opposite sides of the one bit line conductor, respectively, in a direction parallel with the bit lines such that a second information storage capacitor of a memory cell pair unit structure formed under the adjacent first bit line conductor and a first information storage capacitor of a memory cell pair unit structure formed under the adjacent second bit line conductor are located adjacent to a bit line connection conductor of a memory cell pair unit structure formed under the one bit line conductor, as viewed in a direction perpendicular to the substrate.

According to another aspect of the present invention, in a semiconductor integrated circuit device having a semiconductor substrate, word line conductors formed over the substrate, bit line conductors orthogonal or perpendicular thereto, and DRAM cells including switching transistors and information storage capacitors arranged at intersections of the word line conductors and the bit line conductors on the substrate, bit line connection members each for connecting one bit line conductor to the transistors of its associated DRAM cells are positionally shifted in a predetermined direction by a distance, each time the bit line conductor is repeatedly arranged, so that a bit line connection member for one bit line conductor and a bit line connection member for an adjacent bit line nearest to the first-mentioned bit line are on opposite sides of a word line conductor.

According to another aspect of the present invention, a method of manufacturing the semiconductor integrated circuit device comprises the step of properly implanting predetermined impurity ions into a predetermined region in the semiconductor device, after a field insulating film is formed on the semiconductor substrate, for forming a channel stopper layer for element separation in a DRAM cell array and a peripheral circuit region.

According to another aspect of the present invention, a method of manufacturing a semiconductor integrated circuit device comprises the steps of:

(a) depositing a low-resistance polysilicon film, after forming first contact holes each for exposing one semiconductor region of the transistor through a first insulating film covering the DRAM cells and the transistors, in such a degree that the top surface thereof is made substantially planar;

(b) etching back an upper portion of the low-resistance polysilicon film so as to leave the low-resistance polysilicon film only in the first contact holes;

(c) diffusing predetermined impurities from the low-resistance polysilicon film filled in the first contact holes to the one semiconductor region;

(d) forming second contact holes reaching elements in the peripheral circuit region through the first insulating film, and thereafter depositing a predetermined metal film over the semiconductor substrate; and (e) patterning the metal film to form bit line conductors electrically connected to the low-resistance polysilicon film filled in the first contact holes to constitute memory circuits and first level wiring conductors electrically connected to the elements to constitute peripheral circuits.

According to another aspect of the present invention, a method of manufacturing a semiconductor integrated circuit device which includes DRAM cells each having a capacitor of a stacked fin structure has, prior to depositing conductive films for forming second and subsequent fins, a step of flattening an insulating film underlying the conductive film after forming first fins of the capacitors of the stacked fin structure.

According to another aspect of the present invention, a method of manufacturing a semiconductor integrated circuit device which includes DRAM cells each having a capacitor formed of a plurality of stacked fins comprises the steps of:

(a) depositing a first conductive film for forming a first fin for each of the fin-shaped capacitors, after forming contact holes each for exposing one semiconductor region of the transistor through an insulating film for covering the transistor;

(b) etching back an upper portion of the first conductive film to flatten the top surface thereof; and (c) forming second and subsequent fins for each of the capacitors on the flattened top surface of the first conductive film.

According to anther aspect of the present invention, a method of manufacturing a semiconductor integrated circuit device which includes DRAM cells each having a capacitor of a stacked fin structure comprises the steps of:

(a) depositing, after forming a protective insulating film on a first insulating film covering the transistors, a second insulating film on the protective insulating film, an etching rate of the second insulating film being different from that of the protective insulating film;

(b) forming a first conductive film for forming a first fin for each of the capacitors of the stacked fin structure in such a degree that the top surface thereof is flattened, after forming contact holes each for exposing one semiconductor region of the transistors through the first insulating film, the second insulating film and the protective insulating film;

(c) etching back the top surface of the first conductive film to flatten the top surface thereof;

(d) depositing a second conductive film for forming a second and subsequent fins for each of the capacitors on the flattened top surface of the first conductive film with a third insulating film being interposed therebetween; and (e) removing the third insulating film interposed between the second insulating film and the fins with the protective insulating film being used as an etching stopper layer, after the first conductive film and the second conductive film are patterned.

The above and other objects and novel features of the present invention will become apparent from the description of the preferred embodiments when read with reference to the accompanying drawings.

BRIEF DESCRIPTION OF THE DRAWINGS

FIGS. 5–46 are cross-sectional views each showing a main portion of a semiconductor substrate including a memory cell array and cross-sectional views each showing a main portion of the semiconductor substrate including a peripheral circuit at a variety of stages of manufacturing the semiconductor integrated circuit device illustrated in FIG. 1;

DESCRIPTION OF THE PREFERRED EMBODIMENTS (Embodiment 1)

Figure 1:
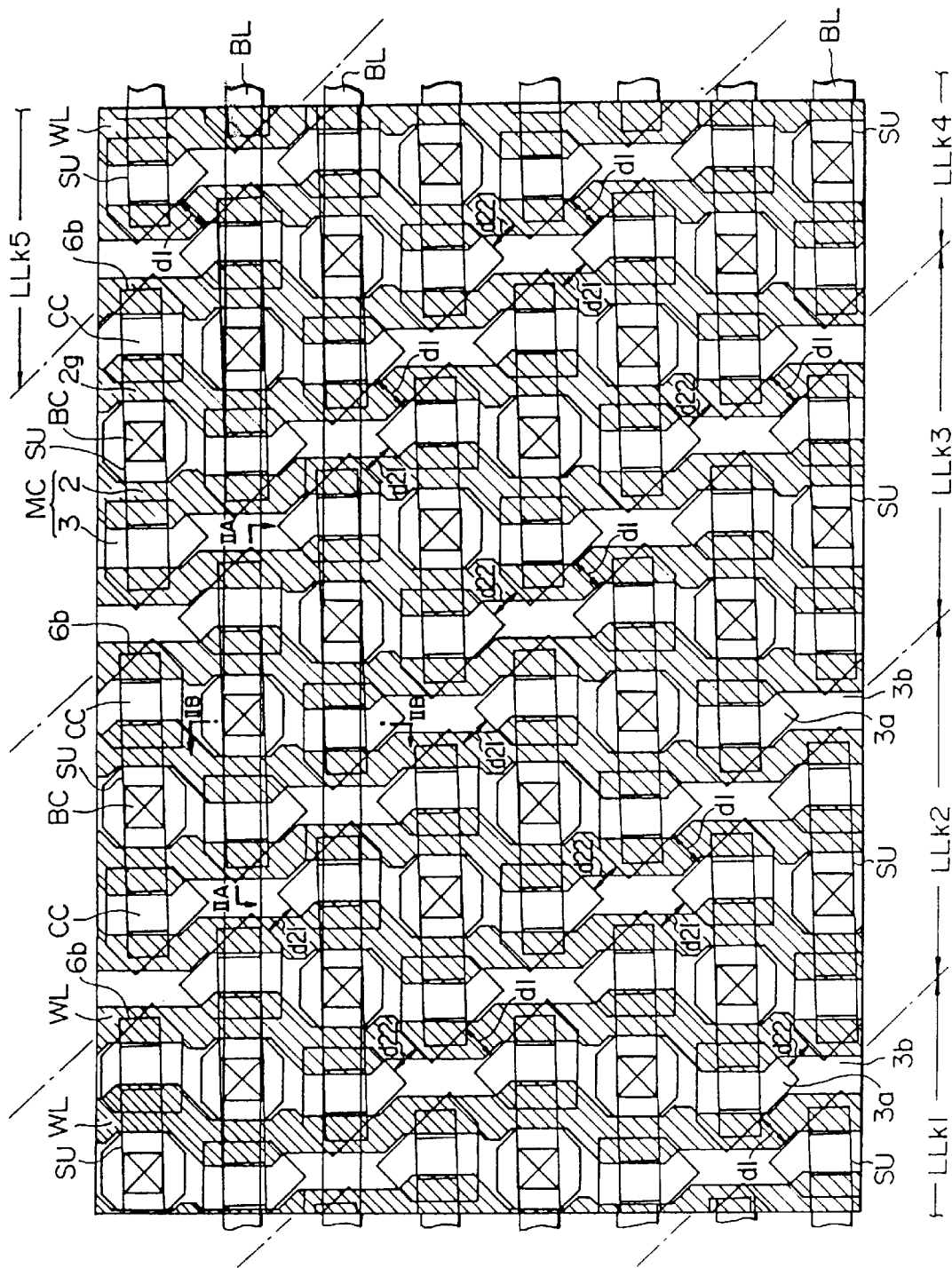
FIG. 1 is a plan view showing a main portion of a semiconductor integrated circuit device according to one embodiment of the present invention.
Figure 2A:
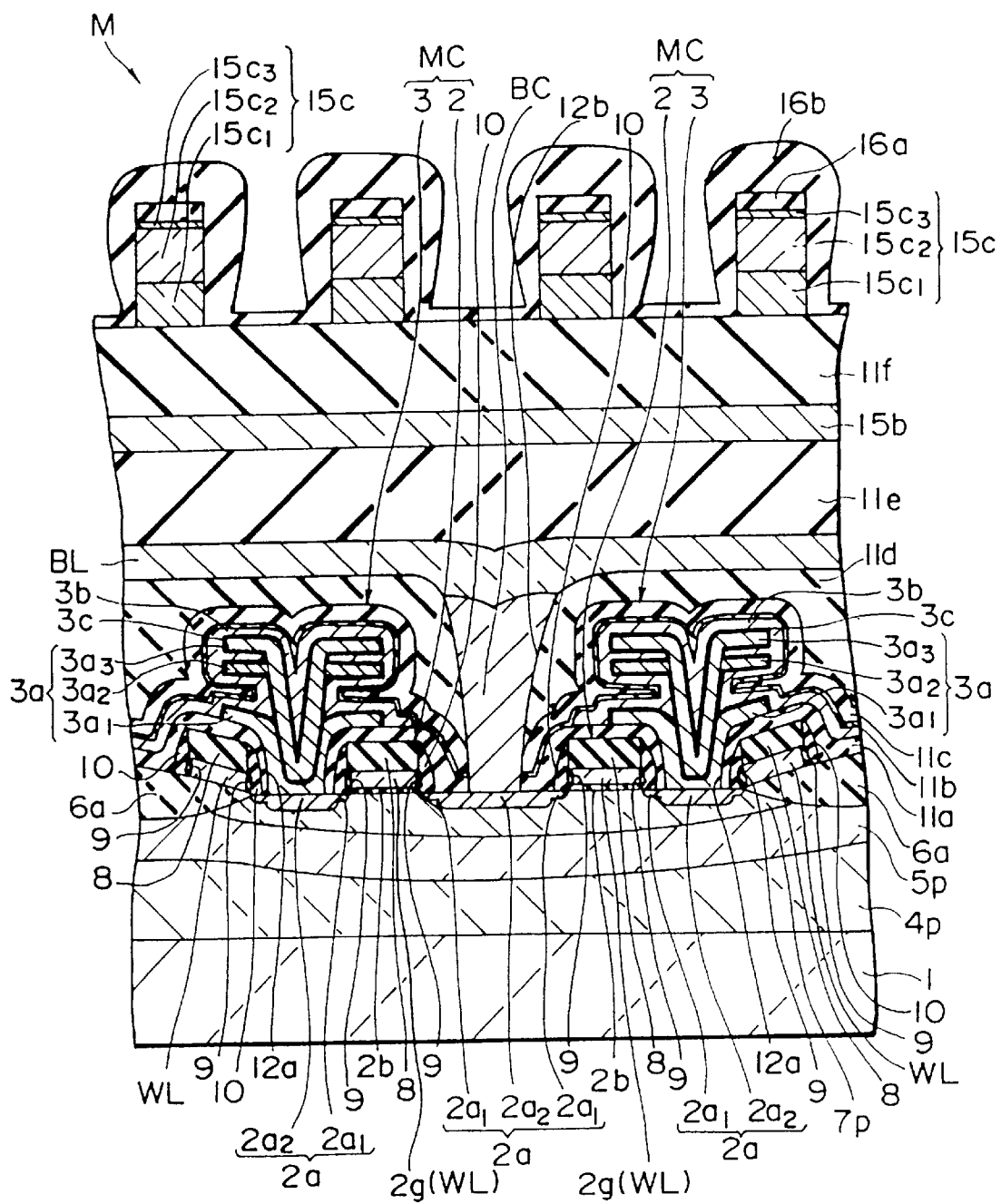
FIG. 2A and FIG. 2B are cross-sectional views taken along line IIA—IIA and line IIB—IIB in FIG. 1, respectively.
Figure 3:
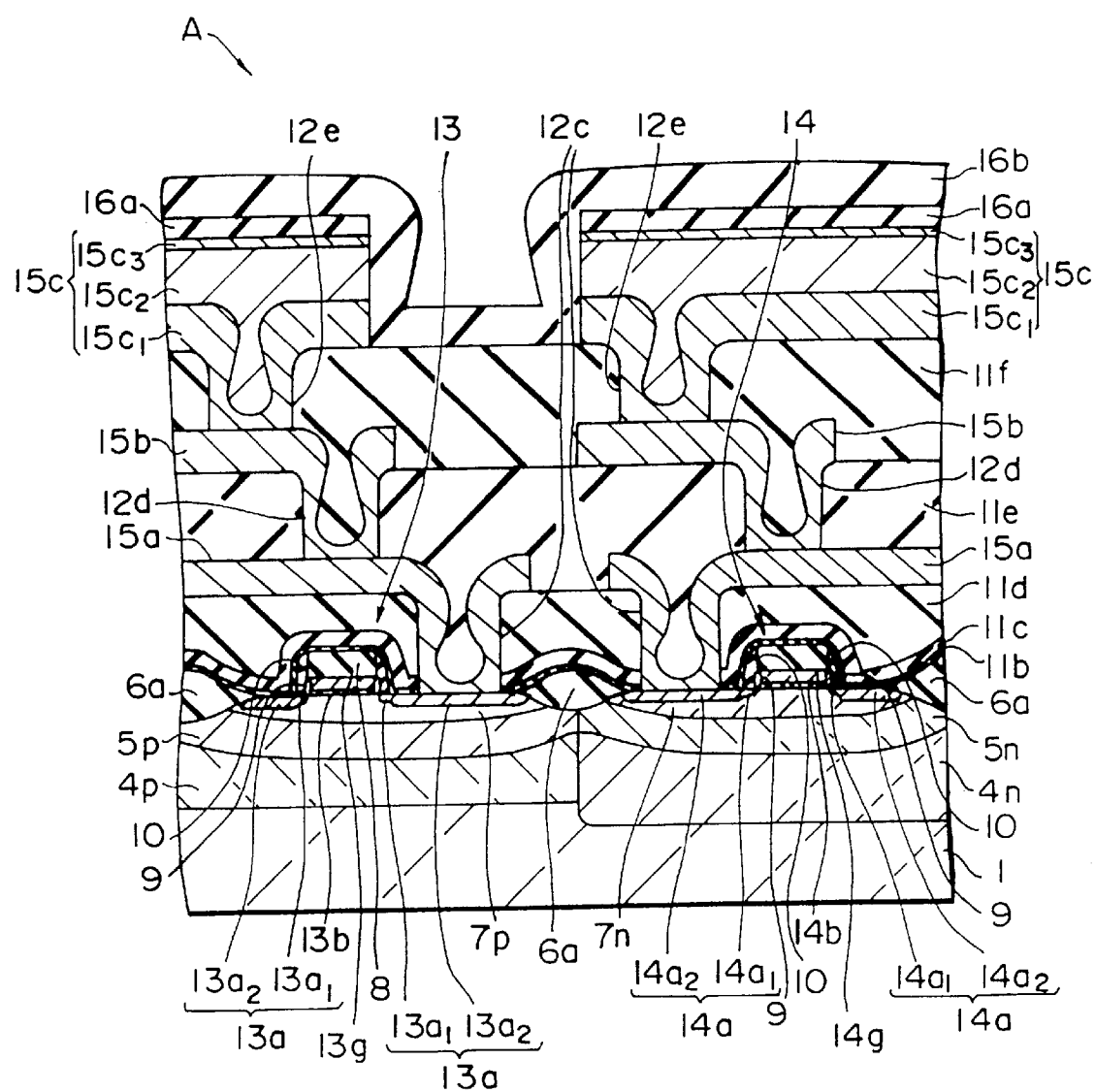
FIG. 3 is a partial sectional view showing a peripheral circuit region of the semiconductor integrated circuit device illustrated in FIG. 1.

FIG. 1 is a plan view showing a main portion of a semiconductor integrated circuit device according to one embodiment of the present invention; FIG. 2A is a cross-sectional view taken along line IIA—IIA in FIG. 1; FIG. 3 is a partial cross-sectional view showing a peripheral circuit region of the semiconductor integrated circuit device; and FIGS. 5–46 are cross-sectional views each showing a main portion of a semiconductor substrate and associated layers at a variety of stages of manufacturing the semiconductor integrated circuit device illustrated in FIG. 1.

The semiconductor integrated circuit device of Embodiment 1 may be, for example, a 64-megabit DRAM device. A main portion of a memory cell array thereof is shown in FIG. 1.

In a memory cell array M, a plurality of word line conductors WL extending in the vertical direction on FIG. 1, which are made of, for example, n-type low-resistance polysilicon, are repetitively arranged over a semiconductor substrate 1 at predetermined intervals along the horizontal direction on FIG. 1. For facilitating the recognition, word line conductors WL in FIG. 1 are filled with hatching.

A plurality of bit line conductors BL extending orthogonal to the extending direction of the word line conductors WL are made of metal such as tungsten, by way of example, and repetitively arranged at predetermined intervals along the vertical direction on FIG. 1 over the semiconductor substrate 1.

When viewed from the direction perpendicular to the semiconductor substrate 1 with respect to each bit line conductor BL, memory cells MC are arranged on both sides of a bit line connection member BC for electrically connecting nMOS regions on the semiconductor substrate 1. Each of the memory cells MC is constituted of, for example, a switching transistor (nMOS 2 in this example) and a capacitor 3. Reference CC represents a capacitor connection portion which specifically includes a contact hole (FIG. 2A) for electrically connecting one of two semiconductor regions for a source and a drain of the nMOS 2 with the capacitor 3 and a contact hole 12f (FIG. 27) between a first fin 3a1 and a second fin 3a2 in the capacitor 3.

Each nMOS 2 is arranged between the bit line connection member BC and the capacitor connection portion CC, and a portion of the word line conductor WL lying therebetween also serves as a gate electrode 2g of the nMOS 2. Thus, adjacent two memory cells constitute a memory cell pair unit structure. The nMOS 2 and the capacitor 3 will be described later.

It should be noted in Embodiment 1 that as the bit line connection members BC are positioned in the downward direction on FIG. 1, i.e., in the direction in which the word line conductors WL extend, the bit line connection member for one bit line conductor and a bit line connection member for an adjacent bit line conductor nearest to the first-mentioned bit line connection member are on opposite sides of a word line conductor, i.e., the latter bit line connection member is shifted with respect to the former one in the direction in which the bit line conductors BL extend. Stated another way, as the bit line conductors BL are repetitively arranged in the downward direction on FIG. 1, the memory cells MC are shifted by a distance substantially corresponding to an arrangement pitch of the word line conductors WL in the right direction on FIG. 1.

It may be thought that the memory cellar pair unit structure is geometrically constituted of a bit line connection member BC, two memory cells MC on both sides thereof, and a separating space between capacitors of these two memory cells and capacitors 3 of memory cells adjacent to these two memory cells. Then, each time the bit line conductor BL is repetitively arranged in the downward direction on FIG. 1, a series of the unit structures is shifted by a quarter of the length of a periodic pattern in the right direction on FIG. 1. Therefore, the arrangement of the memory cells MC described above is repeated for every four bit line conductors BL.

Also, in Embodiment 1, the capacitors 3 are arranged near four sides of each bit line connection member BC, as illustrated in FIG. 1. Stated another way, the bit line connection member BC in a unit structure formed under a bit line conductor is also adjacent to the capacitors 3 of one and the other unit structures formed under two bit line conductors adjacent to the bit line conductor, so that the bit line connection member BC is consequently surrounded by such four capacitors 3. Then, the distances from the bit line connection member BC to the four capacitors 3 near the four sides thereof are substantially equal. In other words, uniform repetition is ensured.

In Embodiment 1, by virtue of the arrangement of the memory cells MC as described above, the following effects, for example, can be produced.

First, since the capacitors 3 are not sequentially placed under adjacent bit line conductors along the vertical direction on FIG. 1, the distance between the adjacent capacitors 3 can be elongated in the vertical direction in FIG. 1, the distance may be used as an extended region for each of the capacitors 3.

Second, since the capacitors 3 will not be sequentially placed in the vertical direction in FIG. 1, a larger area may be allotted for each of the capacitors 3, and a wider margin may be taken for the positioning of the capacitors 3 with the capacitor connection member CC, thus resulting in suppressing defects which would possibly occur in these portions.

Third, by positioning the bit line connection member BC at a corner portion of the capacitor 3 (a portion of the capacitor 3 opposite to a side of the bit line connection member BC) which would otherwise be removed during the pattern formation process, the area for the memory cell array M can be effectively utilized.

With these effects in combination, the area of each capacitor 3 can be extended without incurring a significant increase in the entire area of the memory cell array M.

Figure 75:
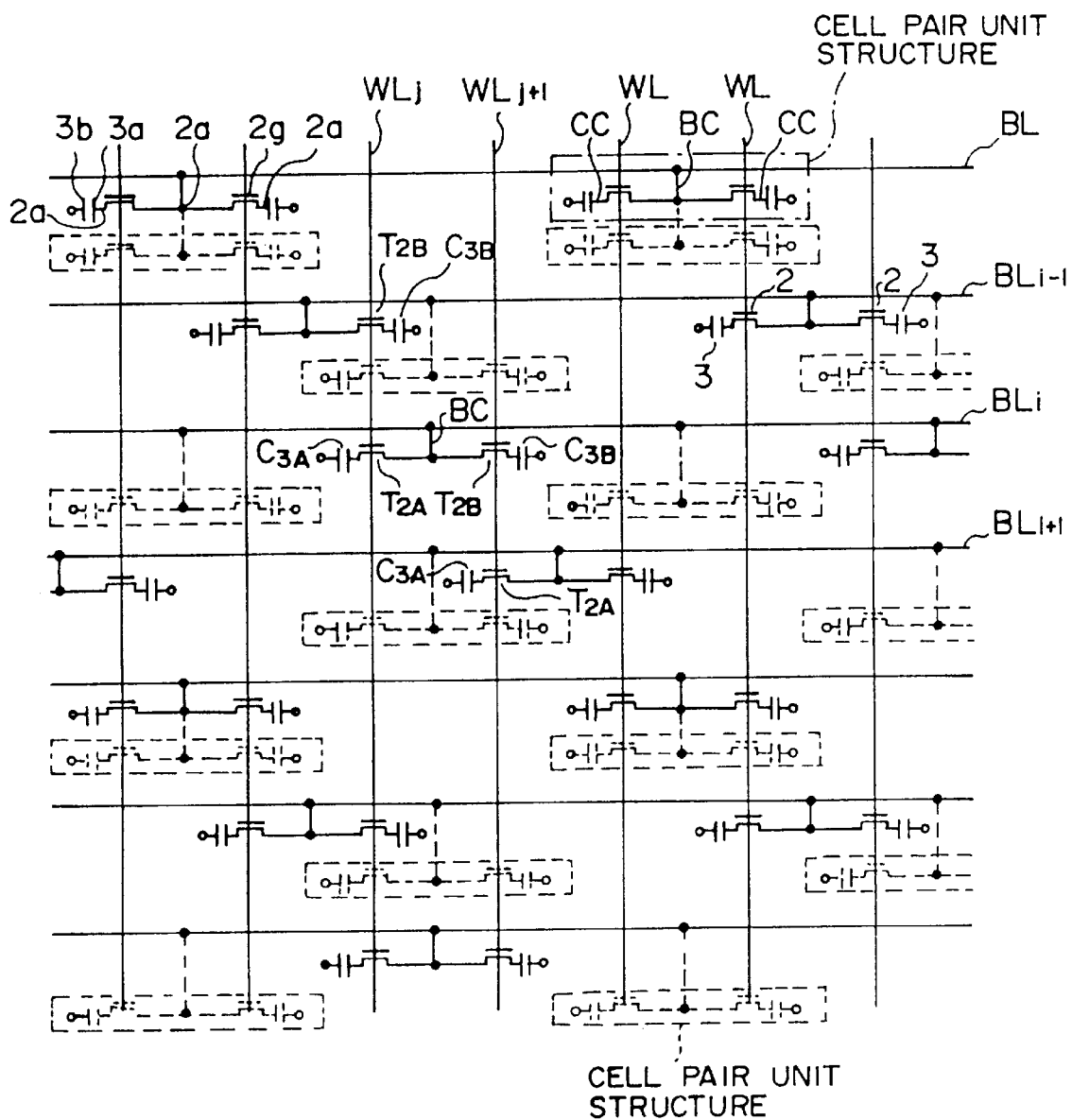
FIG. 75 shows a connection circuit diagram of memory cell array portions in the semiconductor integrated circuit devices shown in FIGS. 1 and 74.

Next, a cross-sectional view of the memory cell array M of FIG. 1 taken along line IIA—IIA and a partial sectional view of a peripheral circuit region are shown in FIGS. 2A and 3, respectively. Reference is also made to FIG. 75 which shows a circuit connection diagram for the memory cell array M.

The semiconductor substrate 1 is made of, for example, p-type silicon (Si) monocrystal. In the semiconductor substrate 1, a p-well 4p is formed in the memory cell array M and a peripheral circuit region A. The p-well 4p is doped with p-type impurities, for example, boron. Also, in the semiconductor substrate 1, an n-well 4n is formed in the peripheral circuit region A. The n-well 4n is doped with n-type impurities, for example, phosphorus.

The p-well 4p is formed with a channel stopper layer 5p of, for example, p-type. This channel stopper layer 5p is doped with p-type impurities, for example, boron. On the other hand, the n-well is formed with a channel stopper layer 5n of, for example, n-type. This channel stopper layer 5n is doped with n-type impurities, for example, phosphorus.

On the channel stopper layer 5p within the p-well 4p, a p-type semiconductor region 7p is formed in an element forming region 6b surrounded by a field insulating film 6a. This semiconductor region 7p is doped with p-type impurities, for example, boron.

Also, on the channel stopper layer 5n within the n-well 4n, an n-type semiconductor region 7n is formed in an element forming region 6b surrounded by the field insulating film 6a. This semiconductor region 7n is doped with n-type impurities, for example, phosphorus. Incidentally, the field insulating film 6a is made of, for example, silicon dioxide ($SiO_2$).

Formed at the p-type semiconductor region 7p in the memory cell array M are nMOS's 2 and capacitors 3 each constituting the memory cell MC.

The nMOS 2 has an LDD (Lightly Doped Drain) structure, and is specifically constituted of a pair of semiconductor regions 2a formed in the semiconductor region 7p, a gate insulating film 2b formed over the semiconductor substrate 1, and the gate electrode 2g formed on the gate insulating film 2b.

The pair of semiconductor regions 2a are provided for constituting a source and a drain of the nMOS 2. Each of the semiconductor regions 2a comprises an $n^-$-type semiconductor region 2a1 formed near the gate electrode 2g and an $n^+$-type semiconductor region 2a2 formed outside thereof, both of which are formed by doping, for example, n-type impurities such as phosphorus thereinto.

One of the semiconductor regions 2a constituting the nMOS 2 (the semiconductor region 2a in a central portion of FIG. 2A) for the memory cell MC also serves as one of the semiconductor regions 2a of the nMOS 2 for the adjacent memory cell MC. Stated another way, the central semiconductor region 2a in FIG. 2 is a common region to the two adjacent memory cells MC.

The gate insulating film 2b is made of, for example, $SiO_2$. The gate electrode 2g, which is part of the word line conductor WL as mentioned above, is made of, for example, n-type low-resistance polysilicon. Incidentally, an insulating film 9 formed on the side surface of an insulating film 8 formed on the gate electrode 2g and on the side surface of the gate electrode 2g is made of, for example, $SiO_2$. Also, a side wall 10 formed on the side surfaces of the gate electrode 2g and the insulating film 8 is an insulating film for forming the LDD structure, and made of, for example, $SiO_2$.

A capacitor of a stacked fin structure, for example, is employed as the capacitor 3. The capacitor 3 is constituted of a capacitor electrode 3a, another capacitor electrode 3b surrounding the capacitor electrode 3a, and a capacitor insulating film 3c formed between the capacitor electrodes 3a and 3b.

One of the capacitor electrode 3a, which is made of, for example, low-resistance polysilicon, has, for example, three fins 3a1–3a3. This capacitor electrode 3a is electrically connected to the semiconductor region 2a of the nMOS 2 through a contact hole 12a formed through an insulating film 11a (first insulating film) over the semiconductor substrate 1.

The other capacitor electrode 3b, which is made of, for example, n-type low-resistance polysilicon, is electrically connected with a powering conductor, as will be later described, and set at a predetermined potential. The capacitor insulating film 3c in turn is made of, for example, silicon nitride ($Si_3N_4$) or constituted of a lamination including a $Si_3N_4$ layer and a $SiO_2$ layer. The insulating film 11a is made of, for example, $SiO_2$.

Figure 74:
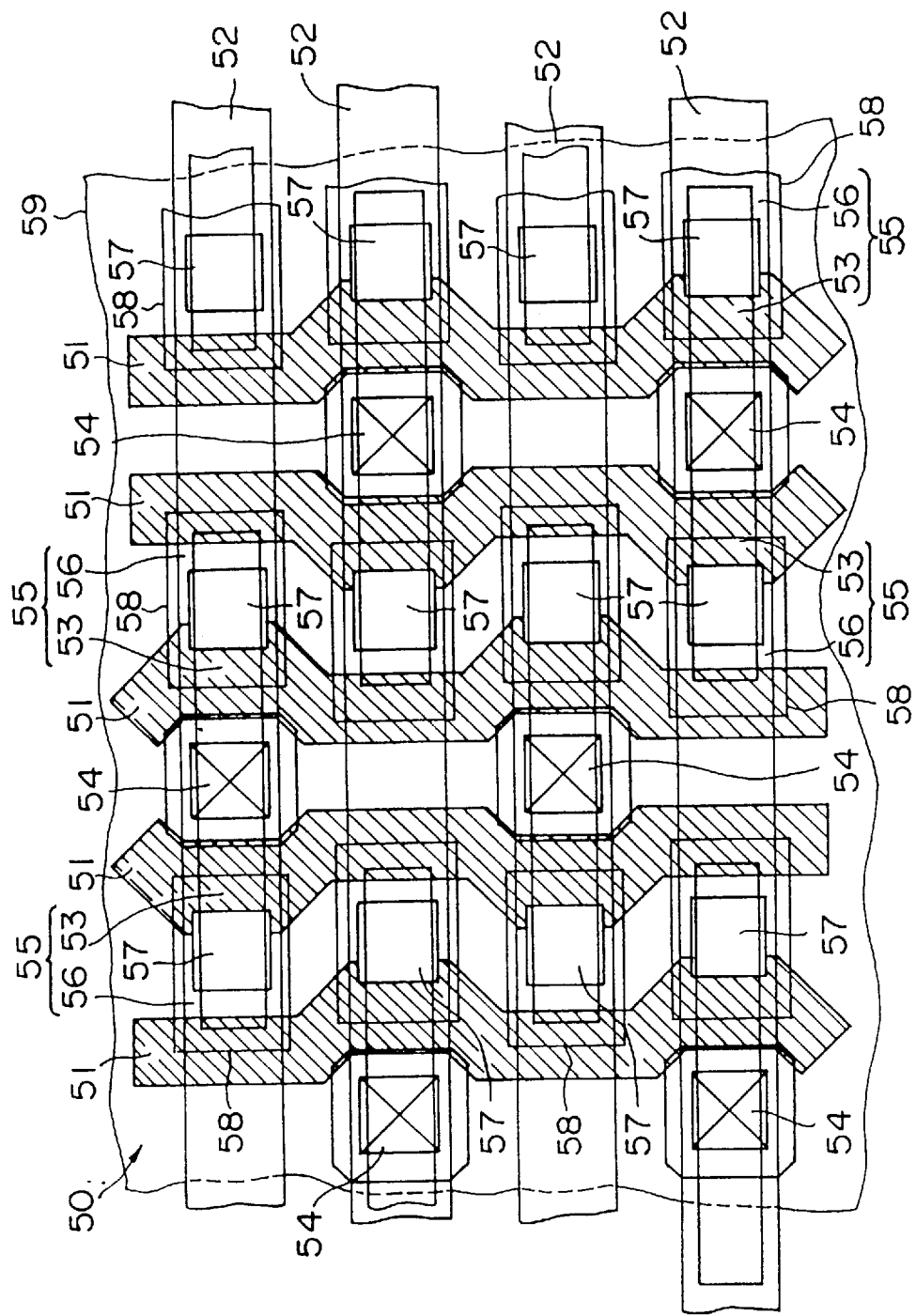
FIG. 74 is a plan view showing part of a memory cell array of a conventional DRAM.

Reference is now made to FIG. 75. In FIG. 75, each of the cell pair unit structures is drawn by one-dot chain lines and surrounded by a broken-line block, or drawn by solid lines and surrounded by a broken-line block. The former represents a unit structure connected and arranged in accordance with the embodiment of the present invention, while the latter represents a unit structure connected and arranged in accordance with the prior art (see FIG. 74).

Each of the unit structures extends over two adjacent word line conductors. Considering a single cell pair unit structure arranged under one bit line conductor $BL_i$, a word line conductor $WL_j$ connected to a control electrode 2g of a transistor $T_{2A}$ included in the unit structure is also connected to a control electrode 2g of a second transistor $T_{2B}$ in a cell pair unit structure arranged under a bit line conductor $BL_{i-1}$ adjacent to the bit line conductor $BL_i$. Another word line conductor $WL_{j+1}$ connected to a control electrode 2g of a transistor $T_{2B}$ in a unit structure arranged under the bit line conductor $BL_i$ is also connected to a control electrode $2g$ of a first transistor $T_{2A}$ in a cell pair unit structure arranged under a bit line conductor $BL_{i+1}$ adjacent to the bit line conductor $BL_i$.

Referring now to FIG. 3, an nMOS 13 having the LDD structure, for example, is also formed over the semiconductor substrate 1 in the peripheral circuit region A. The nMOS 13 is constituted of a pair of semiconductor regions 13$a$ formed in the semiconductor region 7$p$, a gate insulating film 13$b$ formed over the semiconductor substrate 1, and a gate electrode 13$g$ formed on the gate insulating film 13$b$.

The pair of semiconductor regions 13$a$ are provided for constituting source and drain regions for the nMOS 13, wherein each of the semiconductor regions 13$a$ comprises an $n^-$-type semiconductor region 13$a$1 formed near the gate electrode 13$g$ and an $n^+$-type semiconductor region 13$a$2 formed outside thereof. The $n^-$-type semiconductor region 13$a$1 is doped with n-type impurities, for example, phosphorus, while the $n^+$-type semiconductor region 13$a$2 is doped with n-type impurities, for example, arsenic (As).

A pMOS 14 having the LDD structure, for example, is also formed over the semiconductor substrate 1 in the peripheral circuit region A. The pMOS 14 is constituted of a pair of semiconductor regions 14$a$ formed within the semiconductor region 7$n$, a gate insulating film 14$b$ formed over the semiconductor substrate 1, and a gate electrode 14$g$ formed on the gate insulating film 14$b$.

The pair of semiconductor regions 14$a$ are provided for constituting source and drain regions for the pMOS 14. Each of the semiconductor regions 14$a$ comprises a $p^-$-type semiconductor region 14$a$1 arranged near the gate electrode 14$g$ and a $p^+$-type semiconductor region 14$a$2 arranged outside thereof, both of which are formed by doping, for example, p-type impurities such as boron thereinto.

Incidentally, the gate insulating films 13$b$, 14$b$ of the nMOS 13 and the pMOS 14 are made of, for example, $SiO_2$, while the gate electrodes 13$g$, 14$g$ are made of, for example, n-type low-resistance polysilicon.

Referring again to FIG. 2A, together with FIG. 3, on the insulating film 11$a$, an insulating film (first insulating film) 11$b$ made of, for example, $SiO_2$ is deposited so as to cover the capacitors 3, the nMOS's 13 and the pMOS's 14. Also, an insulating film (first insulating film) 11$c$ made of, for example, $SiO_2$ is deposited on the insulating film 11$b$. Further, an insulating film (first insulating film) 11$d$ made of, for example, $SiO_2$ is deposited on the insulating film 11$c$.

The bit line conductors BL are formed on the insulating film 11$d$. Each of the bit line conductors BL is electrically connected to the semiconductor region 2$a$ of the nMOS 2 through a bit line connection member BC in a contact hole (first contact hole) 12$b$ formed through the insulating films 11$a$–11$d$. In Embodiment 1, the contact hole 12$b$ is filled with, for example, n-type low-resistance polysilicon.

With the prior art technique for filling the contact hole 12$b$ only with metal, if the contact hole 12$b$ were shifted, the filled metal would extend over both the semiconductor region 2$a$ and the semiconductor substrate 1 at the bottom end of the contact hole 12$b$, resulting in occasionally short-circuiting the semiconductor region 2$a$ with the semiconductor substrate 1. Also, if a metal is used as a filling material, impurities cannot be diffused into the lightly doped semiconductor region, so that the contact resistance for the semiconductor region cannot be decreased.

As a prior art method for avoiding these problems, a technique has been proposed to form bit line conductors of polycide. However, in this case, since wiring conductors for connection between nMOS's and pMOS's exist in a peripheral circuit region, the bit line conductors BL cannot be used as wiring conductors for the peripheral circuit region.

In Embodiment 1, since the contact hole 12$b$ is filled with low-resistance polysilicon, this structure is free from the problem of short-circuiting due to the above-mentioned shifted bit line conductors BL, the problem on the contact resistance between the bit line conductor BL and the semiconductor region 2$a$, and so on. In addition, this structure enables first level wiring conductors 15$a$ for the peripheral circuit region to be formed on the same layer as the bit line conductors BL, using the same metal film for providing the bit line conductors BL.

The above features of Embodiment 1 leads to reducing a region for forming a sense amplifier circuit which is an element in the peripheral circuit region. This reduction is accomplished mainly by the following reasons:

(1) first, the sense amplifier circuit can be constituted of the first level wiring conductor 15$a$ having a minimum machining dimension rule similar to the wiring conductors in the memory cell array M; and (2) secondly, wiring conductors for the sense amplifier circuit and column selection wiring conductors, which have conventionally been arranged together at a layer level one level higher than the bit line conductors BL, can be arranged in separate layer levels. Specifically, in contrast with the prior art in which wiring conductors for the sensor amplifier circuit and the column selection wiring conductors had to be arranged in a single wiring layer so that a relatively large area had to be taken for forming the sense amplifier circuit, Embodiment 1 is free from such area restraint.

The first level wiring conductors 15$a$ constituting the peripheral circuit region are each electrically connected to the semiconductor region 13$a$ of the nMOS 13 and the semiconductor region 14$a$ of the pMOS 14 through a contact hole (second contact hole) 12$c$ formed through the insulating films 11$b$–11$d$.

Also, an insulating film 11$e$ made of, for example, $SiO_2$ is formed on the insulating film 11$d$ so as to cover the bit line conductors BL. Then, second layer wiring conductors 15$b$ are formed on the top surface of the insulating film 11$e$, and an insulating film 11$f$ is also formed for covering the second layer wiring conductors 15$b$.

The second layer wiring conductors 15$b$ are made of, for example, tungsten, and electrically connected to the first level wiring conductors 15$a$ through the contact holes 12$d$ formed through the insulating film 11$e$. The insulating film 11$f$ in turn is made of, for example, $SiO_2$, and third layer wiring conductors 15$c$ are formed on the top surface of the insulating film 11$f$.

The third layer wiring conductors 15$c$ comprise a metal film 15$c$1 made of, for example, tungsten, a metal film 15$c$2 made of, for example, aluminum(Al)-silicon(Si)-copper(Cu) alloy, and a metal film 15$c$3 made of, for example, tungsten, which are stacked in this order from the lower layer. The third layer wiring conductors 15$c$ are electrically connected to the second layer wiring conductors 15$c$ through contact holes 12$e$ formed through the insulating film 11$f$.

It should be noted that if it is desired that the second layer wiring conductors 15$b$ are provided with a lower resistance, the second layer wiring conductors 15$b$ may be formed of a metal film similar to the third layer wiring conductors 15$c$ which has a tungsten film, an Al-Si-Cu alloy film and a tungsten film stacked in this order.

A surface protection film 16$a$ made of, for example, $Si_3N_4$ is formed on the third layer wiring conductors 15$c$. Further, on the insulating film 11f, a surface protection film 16b is deposited for covering the third layer wiring conductors 15c and the surface protection film 16a. This surface protection film 16b is made of, for example, $SiO_2$.

Figure 4:
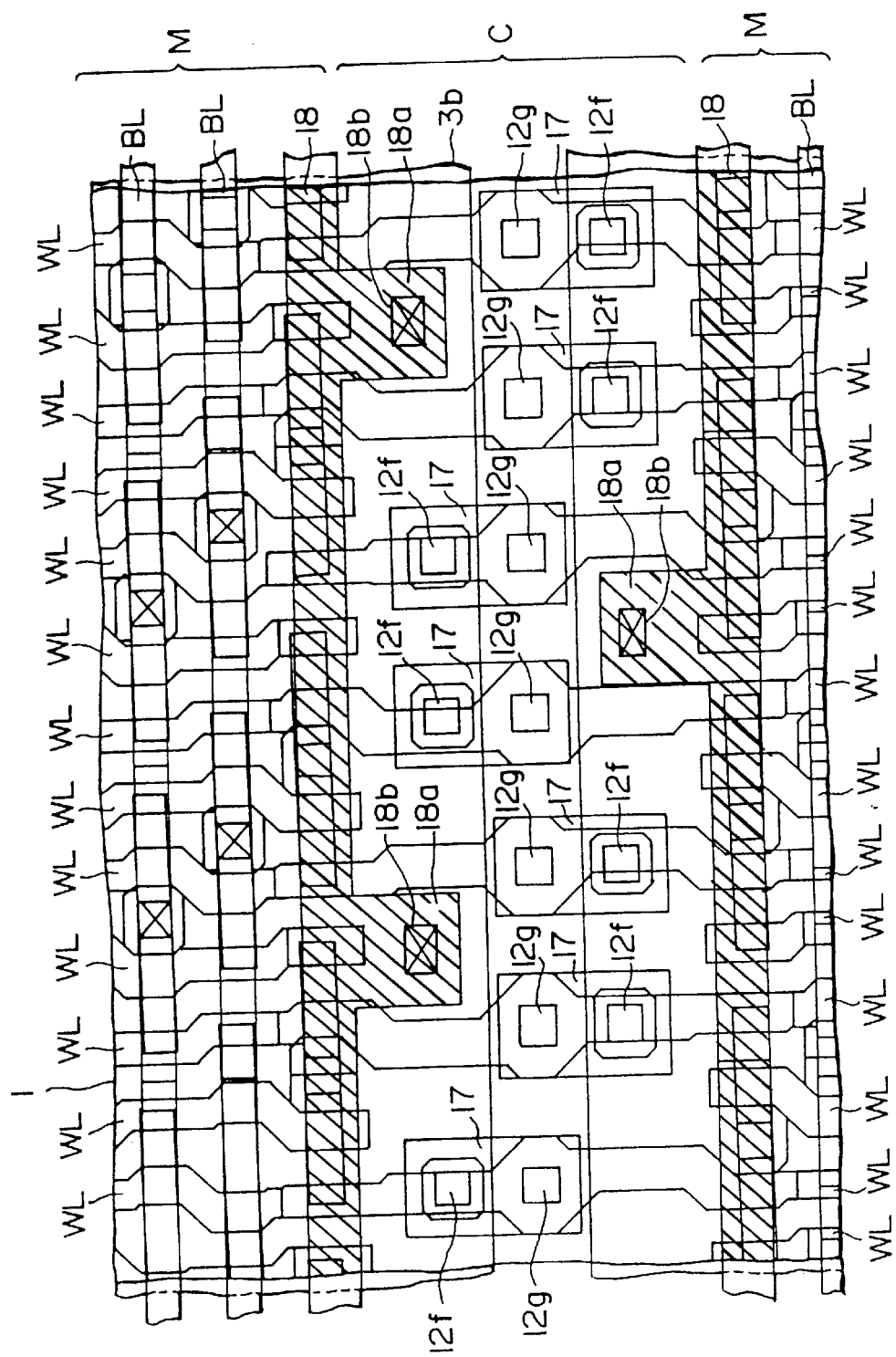
FIG. 4 is a plan view showing another main portion of the semiconductor integrated circuit device illustrated in FIG. 1.

Next, FIG. 4 shows a plan view of a main portion of a connection area provided for connecting the word line conductors WL with the third layer wiring conductors 15c.

This connection area C is arranged such that it is sandwiched between adjacent memory array cells M. Each of the third layer wiring conductors 15c (see FIGS. 2 and 3) is electrically connected to a rectangular connection conductor 17 formed on the first level wiring conductor 15a (see FIG. 3) through a contact hole 12f, and is further electrically connected to a word line conductor WL through a contact hole 12g which connects the connection conductor 17 with the word line conductor WL. Incidentally, the connection conductors 17 are made of, for example, tungsten.

It should be pointed out that in Embodiment 1, the mutually adjacent connection conductors 17 are spaced by such, an interval that allows a word line conductor WL to intervene therebetween. Since this arrangement can alleviate a spacing required between mutually adjacent connection conductors 17, a larger positioning margin can be taken for them.

In Embodiment 1, a powering conductor 18 is also arranged on the outermost side of each memory cell array M. In FIG. 4 the powering conductors 18 are shown with hatching for facilitating the distinction thereof from other regions.

The powering conductors 18 are provided for supplying the aforementioned capacitor electrodes 3b (see FIG. 2) with a predetermined potential, and are arranged on the outermost side of the respective memory cell arrays M in parallel with the bit line conductors BL such that they comply with the regularity of the repetitive arrangement for the bit line conductors BL.

This enables an improved reliability of the outermost bit line conductors BL in the respective memory cell arrays M. This is because the powering conductor 18 thus arranged can prevent deformation or the like of the outermost bit line conductor BL in each memory cell array M, when the pattern of the bit line conductor BL is transferred which would occur unless the wiring conductor 18 were provided.

Each of the powering conductors 18 is provided with powering pads 18a protruding toward the connection area C at predetermined intervals. Each of the powering pads 18a has a contact hole 18b formed therein for electrical connection to the common electrode 3b of the capacitors 3. The powering pads 18a of the two powering conductors 18 extending in parallel with each other are interdigitally arranged with the connection area C intervening therebetween. Stated another way, between mutually adjacent powering pads 18a of one powering conductor 18, a powering pad 18a of the adjacent powering conductor 18 is positioned. In this way, the distance between two adjacent powering conductors 18 can be reduced while maintaining an area required for the powering pads 18a.

Next, a manufacturing method of the semiconductor integrated circuit device according to Embodiment 1 will be described with reference to FIGS. 5–46. Note that odd-numbered ones among these figures show the memory cell array M, while even-numbered ones show the peripheral circuit region A.

Figure 5:
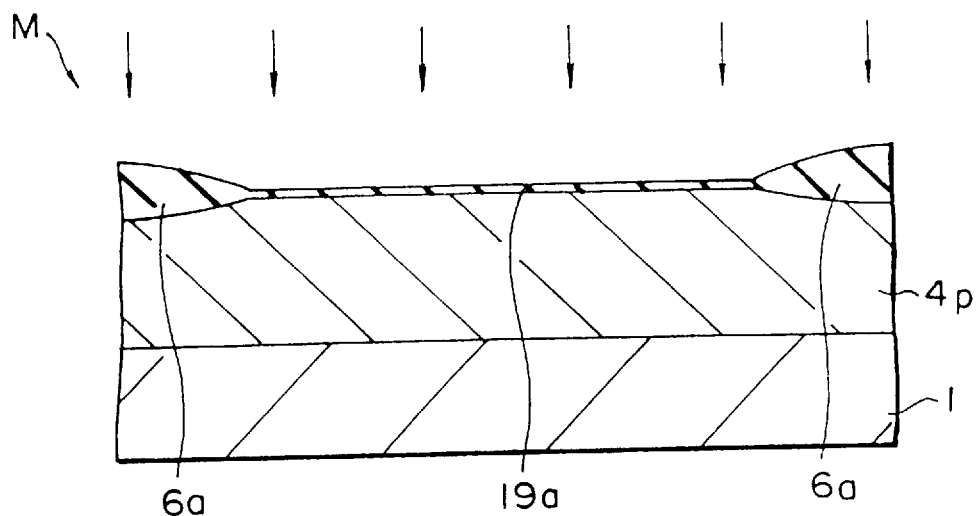
Figure 6:
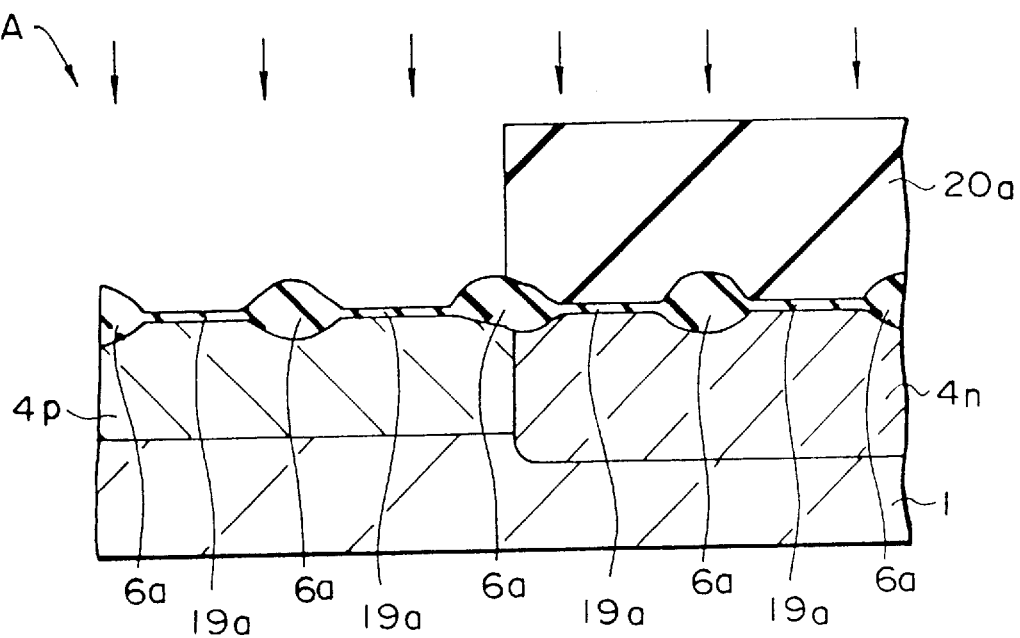

FIGS. 5 and 6 respectively show a main portion of a semiconductor substrate 1 in a manufacturing process for the semiconductor integrated circuit device according to Embodiment 1.

The semiconductor substrate 1 is formed of, for example, p-type Si monocrystal, on which a p-well 4p and an n-well 4n are formed.

The n-well 4n is formed by providing an ion implanting mask for exposing only a region for the n-well 4n on the semiconductor substrate 1, then implanting n-type impurities such as phosphorus, for example, into the semiconductor substrate 1 by an ion implanting method, and then annealing the semiconductor substrate 1.

The p-well 4p in turn is formed by providing an ion implanting mask for exposing only a region for the p-well 4p on the semiconductor substrate 1, then implanting, for example, boron fluorite ($BF_2$) into the semiconductor substrate 1 by the ion implanting method, and then annealing the semiconductor substrate 1.

On the top surface of the semiconductor substrate 1, a field insulating film 6a for element separation has already been formed by, for example, a LOCOS (Local Oxidization of Silicon) method. Also, an insulating film 19a made of, for example, $SiO_2$ has already been formed on an element forming region 6b surrounded by the field insulating film 6a over the semiconductor substrate 1.

For the semiconductor substrate 1 thus processed, channel stopper layers for element separation are formed, for example, by the following method.

First, after a photo resist pattern 20a (hereinafter simply called "the resist pattern") for exposing only a region for the p-well 4p is formed over the semiconductor substrate 1 by photolithography techniques, p-type impurities such as boron, for example, are implanted into the semiconductor substrate 1 by the ion implanting method or the like with the resist pattern 20a used as an ion implanting mask (FIGS. 5 and 6).

Figure 7:
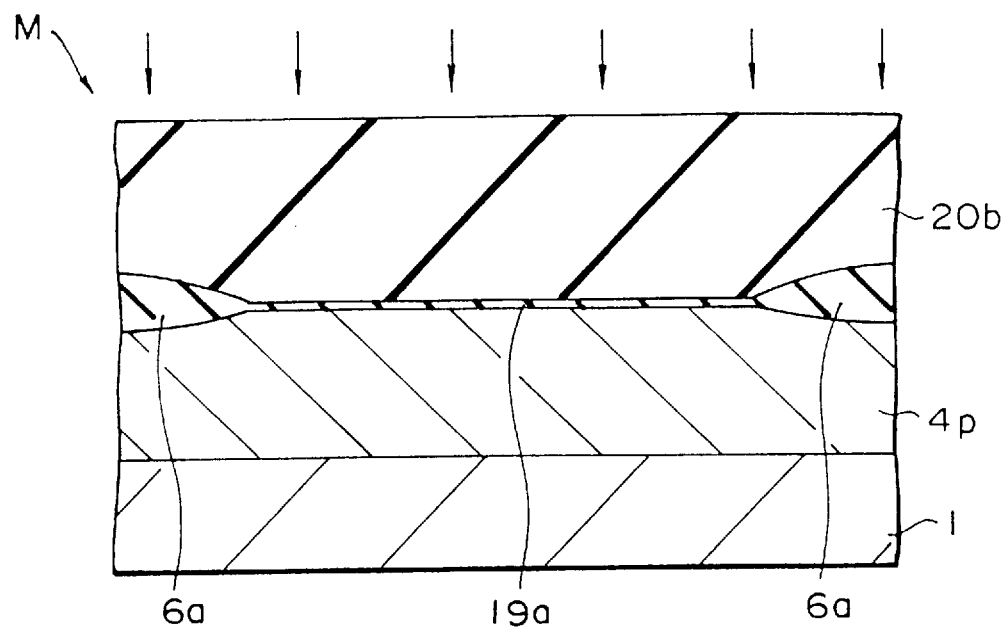
Figure 8:
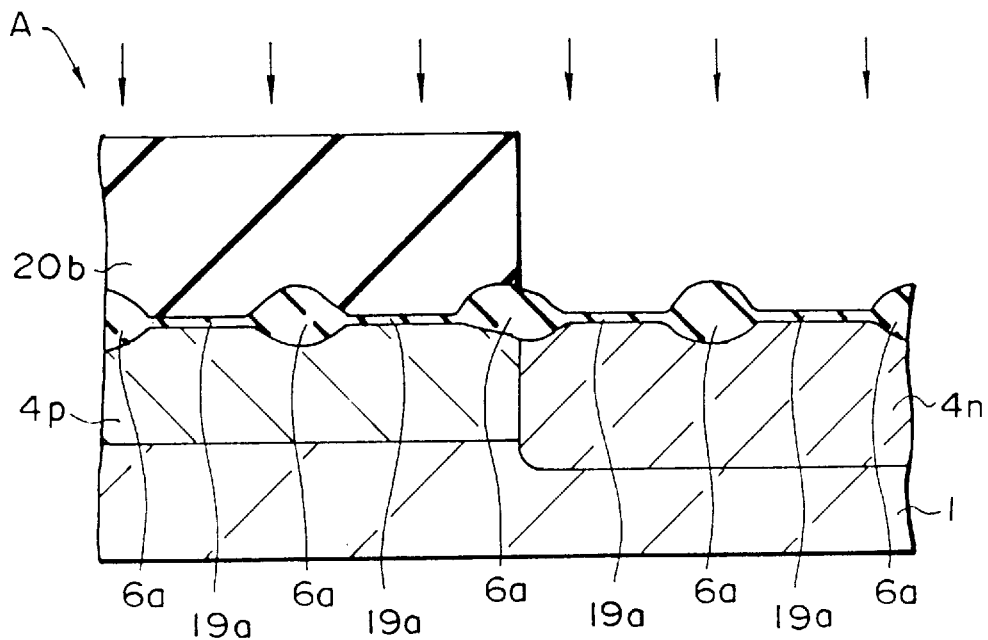

Subsequently, after the resist pattern 20a is removed, a resist pattern 20b for exposing only a region for the n-well 4n is formed over the semiconductor substrate 1 by the photolithography techniques as shown in FIGS. 7 and 8.

Thereafter, n-type impurities such as phosphorus, for example, are implanted into the semiconductor substrate 1 by the ion implanting method or the like with the resist pattern 20b used as an ion implanting mask (FIGS. 7 and 8), and then the resist pattern 20b is removed.

Figure 9:
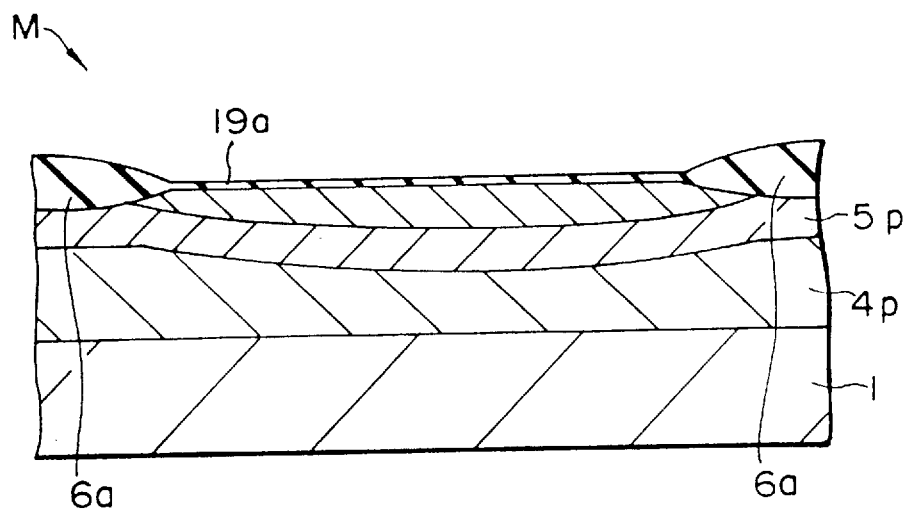
Figure 10:
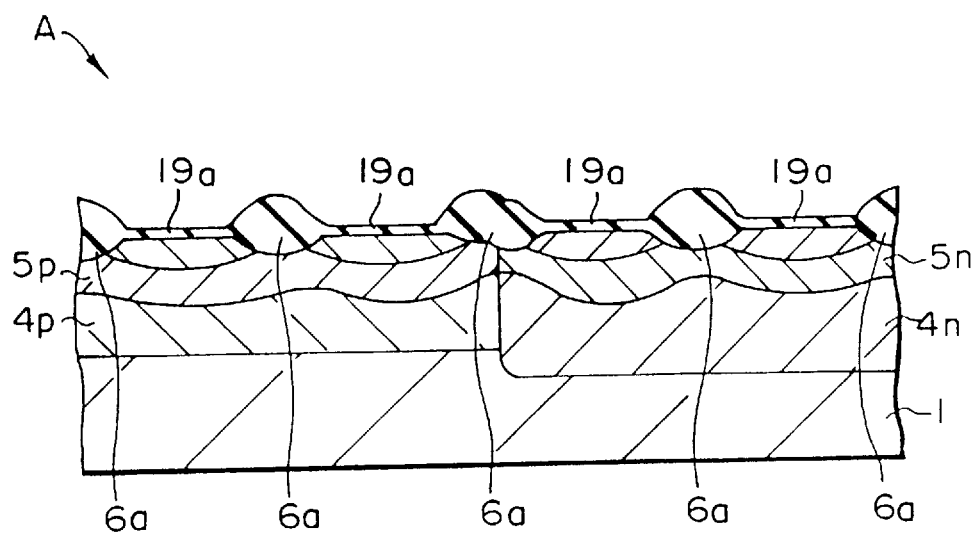

After the resist pattern 20b is removed, the semiconductor substrate 1 is annealed in an atmosphere of a mixed gas consisting of nitrogen ($N_2$), as a principal component, and oxygen ($O_2$) to form channel stopper layers 5p, 5n over the semiconductor substrate 1, as shown in FIGS. 9 and 10.

It should be noted that in Embodiment 1, the channel stopper layers 5p, 5n are formed by the ion implanting method or the like after forming the field insulating film 6a. By thus forming the channel stopper layers 5p, 5n, the following effects can be produced.

First, since the channel stopper layers 5p, 5n are formed by the ion implanting method, which provides a high formation controllability, the formed positions, impurity concentrations, and so on thereof are favorably controlled.

Secondly, the method of forming the channel stopper layers according to this embodiment can prevent a narrow channel effect which would occur if a prior art method were used to form channel stopper layers before forming the field insulating film 6a. Therefore, the MOS's constituting memory cells can be made finer. The narrow channel effect in this case is a phenomenon which is caused by impurities for the channel stopper layers diffusing toward the channel.

Embodiment 1 can prevent the narrow channel effect by the following reason, in addition to the fact that a good formation controllability is provided because the ion implanting method is used to form the channel stopper layers 5p, 5n. That is, in Embodiment 1, since impurity ions are implanted for the channel stoppers after the field insulating film 6a is formed, the impurity ions are implanted into a region deeper than the location of the field insulating film 6a, and consequently the impurity ions are hardly diffused toward the channel.

Additionally, in Embodiment 1, since the channel stopper layers 5p, 5n are formed also for the peripheral circuit region A by the method as described above, the following effects can be produced.

First, since the narrow channel effect can be prevented also in the MOS's in the peripheral circuit region A, the MOS's in the peripheral circuit region A can be made finer. That is, Embodiment 1 can respond to the requirement of a finer structure of the peripheral circuit region A.

Secondly, since the channel stopper layers 5p, 5n are formed simultaneously with the formation of the channel stopper layers 5p, 5n in the memory cell array M, the number of exposure masks and the number of manufacturing processes can be reduced.

Next, a basic structure of MOS.ET is formed over the semiconductor integrated circuit 1, for example, by the following method.

Figure 11:
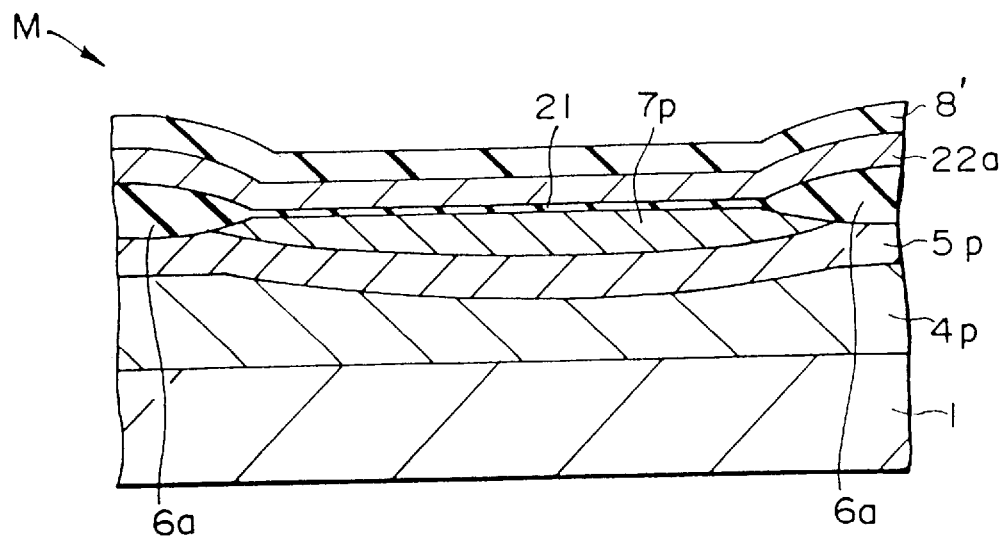
Figure 12:
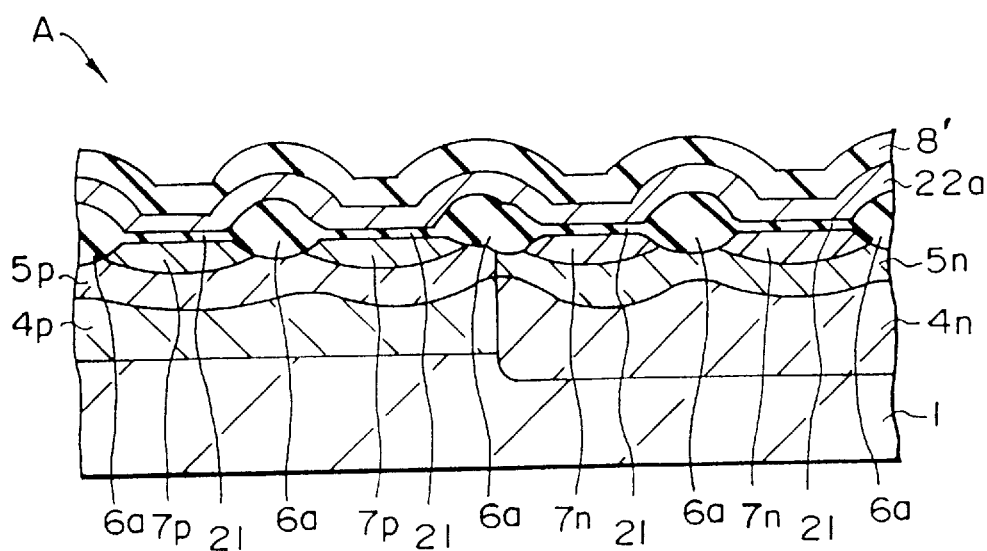

First, as shown in FIGS. 11 and 12, predetermined impurities are implanted into respective element forming regions 6b surrounded by the field insulating film 6a over the semiconductor substrate 1 by the ion implanting method or the like to form p-type and n-type semiconductor regions 7p, 7n, so as to provide the electric characteristics required for elements to be formed in the associated element forming regions.

Subsequently, after insulating films (not shown) formed on the element forming regions 6b are removed to expose the surface of the semiconductor substrate 1, the semiconductor substrate 1 is subjected to thermal oxidization processing or the like to form a gate insulating film 21 on the exposed surface of the semiconductor substrate 1.

After the formation of the gate insulating film 21, a conductive film 22a made of, for example, n-type low-resistance polysilicon is deposited over the semiconductor substrate 1 by a CVD method or the like. A reactive gas used in this process may be, for example, a mixed gas consisting of silane ($SiH_4$) and phosphine ($PH_3$).

Next, an insulating film 8' made of, for example, $SiO_2$ is deposited on the conductive film 22a by the CVD method or the like. A reactive gas used in this process may be, for example, a mixed gas consisting of nitrogen oxide ($N_2O$) and $SiH_4$.

Subsequently, after a resist pattern (not shown) for forming a gate electrode is formed on the insulating film 8' by the photolithography techniques, the insulating film 8' is patterned by a dry etching method or the like with the resist pattern used as an etching mask.

Figure 13:
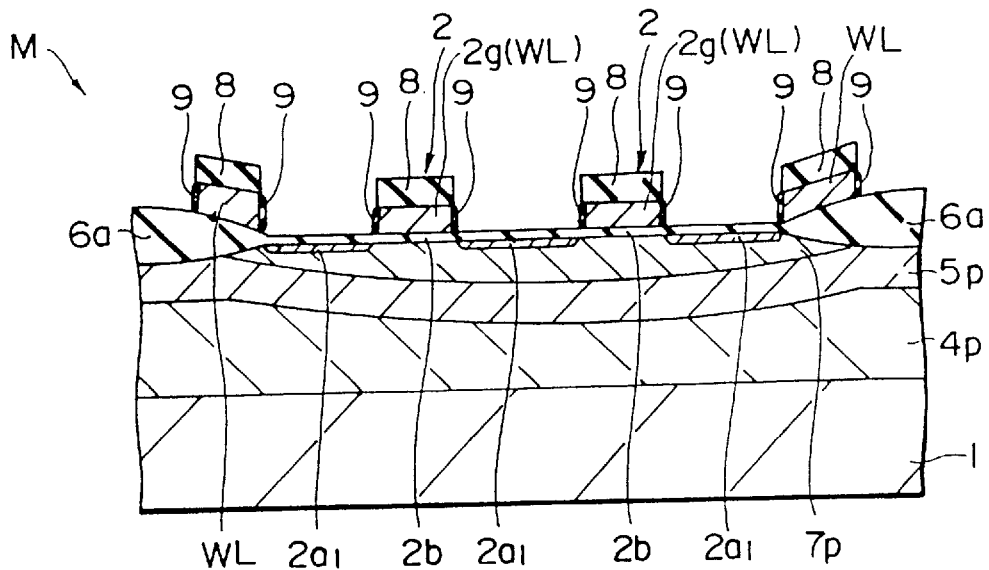
Figure 14:
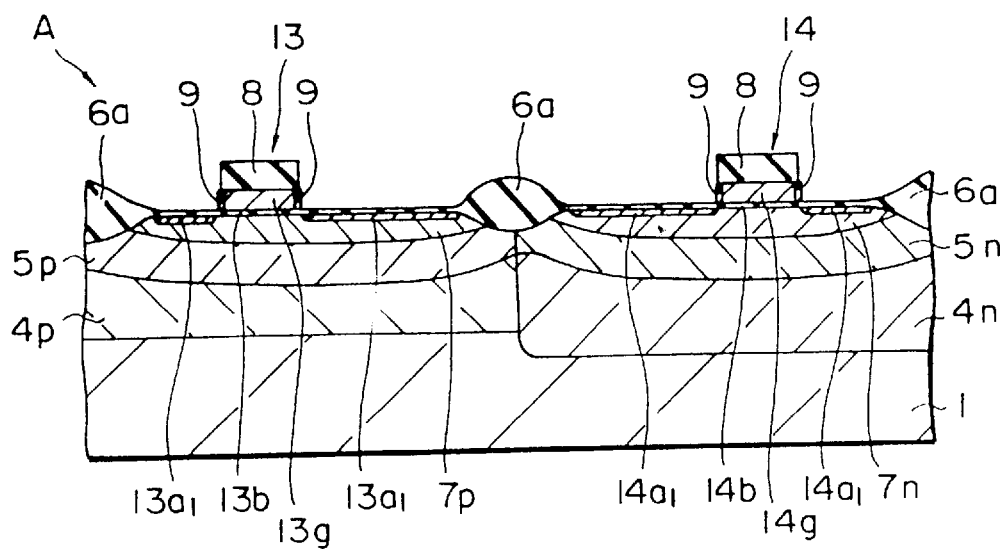

Then, after the resist pattern is removed, the conductive film 22a is patterned by the dry etching method or the like, with the patterned insulating film 8' used as an etching mask, to form gate electrodes 2g, 13g, 14g, word line conductors WL, and an insulating film 8 over the semiconductor substrate 1, as shown in FIGS. 13 and 14.

Next, the semiconductor substrate 1 is subjected to light thermal oxidization processing to form insulating films 9 on side surfaces of the respective gate electrodes 2g, 13g, 14g.

Subsequently, after forming a resist pattern (not shown) for covering the entire surface except for an upper portion of the p-well 4p over the semiconductor substrate 1 by the photolithography techniques, n-type impurities such as phosphorus, for example, are implanted into the semiconductor substrate 1 by the ion implanting method or the like, with the resist pattern and the gate electrodes 2g, 13g used as ion implanting masks.

Then, after the resist pattern used in the ion implantation process is removed, the semiconductor substrate 1 is subjected to a heat treatment to form n⁻-type semiconductor regions 2a1, 13a1 within the semiconductor region 7p.

Next, after forming a resist pattern (not shown) for covering the entire surface except for an upper portion of the n-well 4n over the semiconductor substrate 1 by the photolithography techniques, p-type impurities such as boron, for example, are implanted into the semiconductor substrate 1 by the ion implanting method or the like, with the formed resist pattern and the gate electrode 14g used as ion implanting masks.

Subsequently, after the resist pattern used in the ion implantation process is removed, the semiconductor substrate 1 is subjected to a heat treatment to form a p⁻-type semiconductor region 14a1 within the semiconductor region 7n. In this way, the basic structures of the nMOS's 2, 13 and pMOS 14 are formed over the semiconductor substrate 1.

Figure 15:
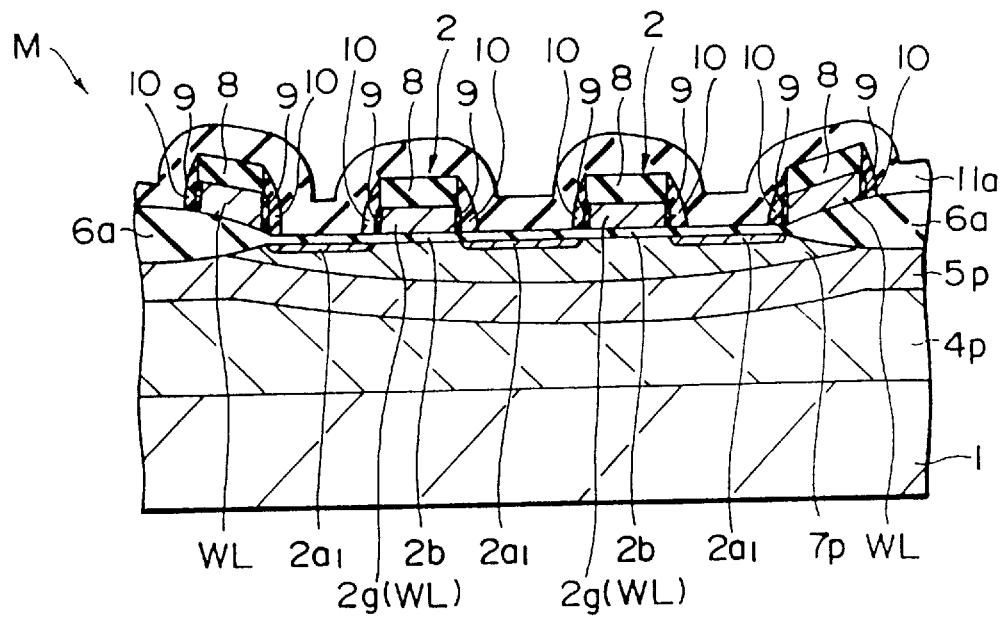
Figure 16:
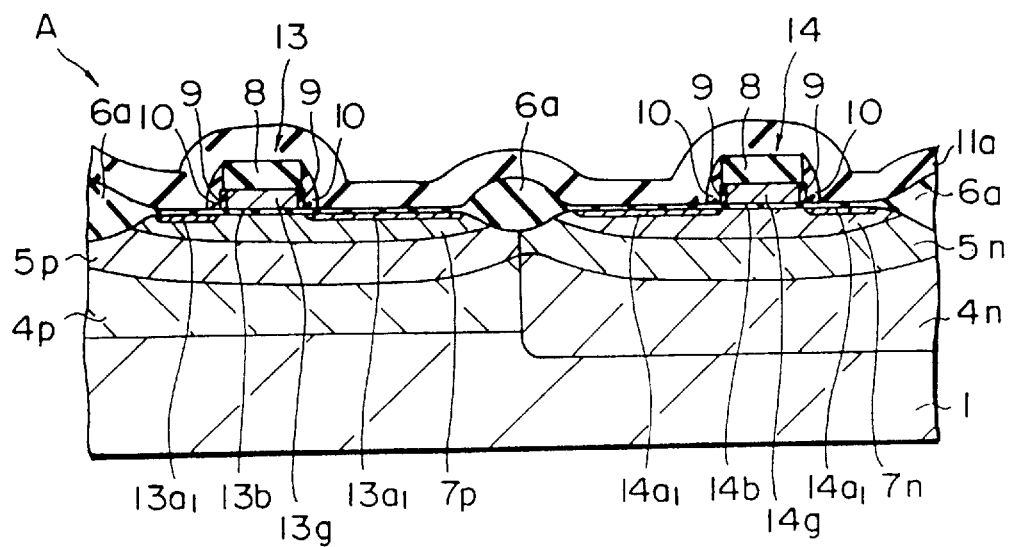

Then, after depositing an insulating film made of, for example, $SiO_2$ over the semiconductor substrate 1 by the CVD method or the like, the insulating film is etched back to form side walls on side surfaces of the gate electrodes 2g, 13g, 14g and the insulating film 8, as shown in FIGS. 15 and 16.

After the formation of the side walls 10, an insulating film 11a made of, for example, $SiO_2$ is deposited over the semiconductor substrate 1 by the CVD method or the like. A reactive gas used in this process may be, for example, a mixed gas consisting of $N_2O$ and $SiH_4$.

Next, capacitors constituting the memory cells are formed over the semiconductor substrate 1, for example, by the following method.

Figure 17:
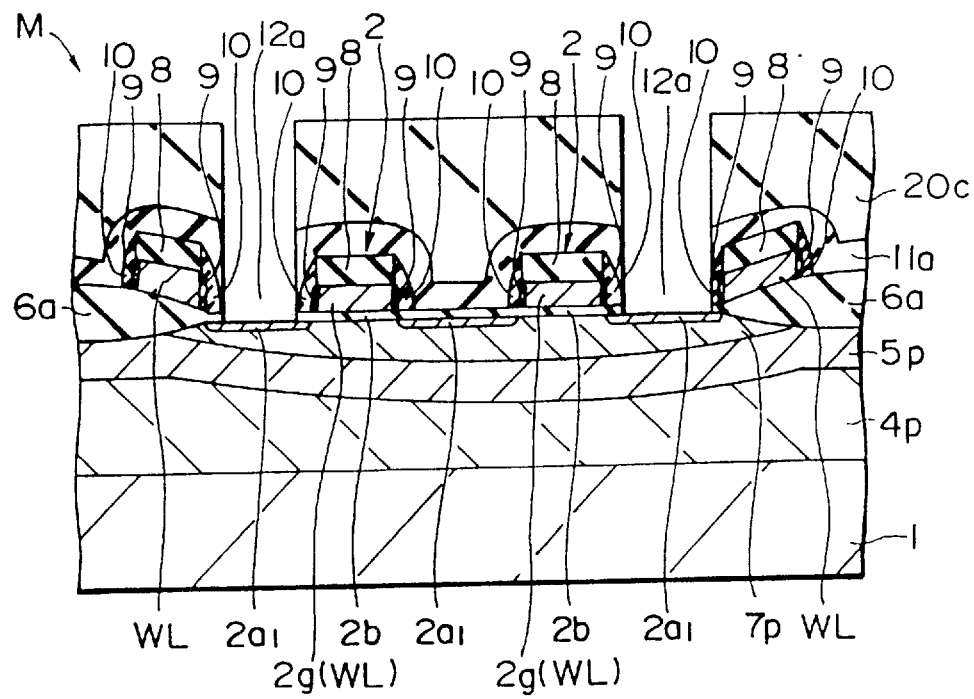
Figure 18:
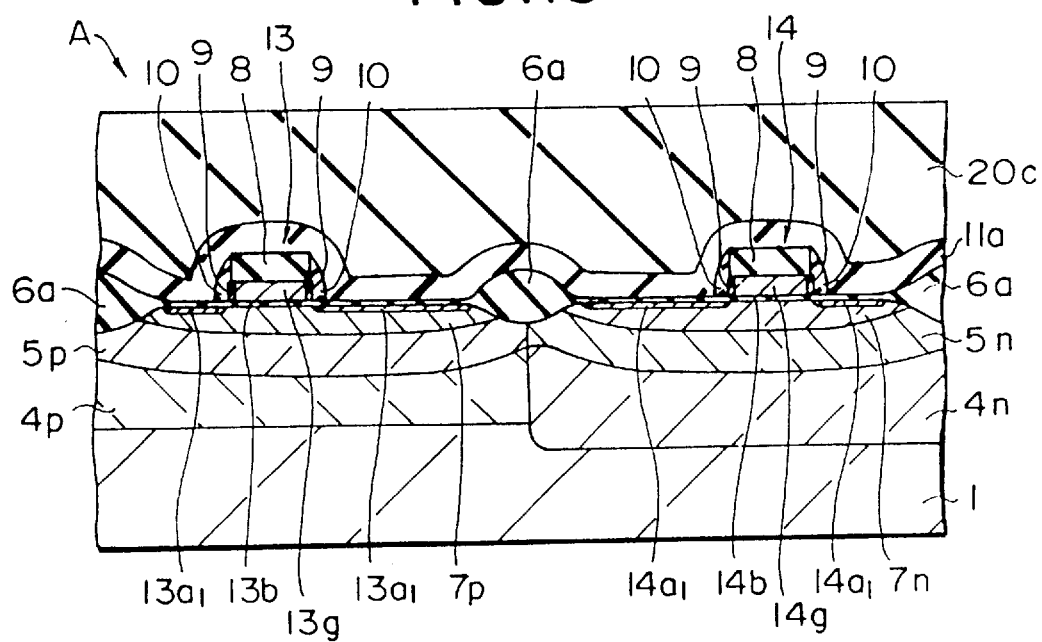

First, as shown in FIGS. 17 and 18, a resist pattern 20c for exposing only an upper portion of the n⁻-type semiconductor region 2a1 on the outer side of the nMOS 2 is formed on the insulating film 11a by the photolithography techniques. Then, with the photo resist pattern 20c used as an etching mask, portions of the insulating film 11a, which are not covered with the resist pattern. 20c, are etched away to form contact holes 12a through the insulating film 11a so as to expose portions of the n⁻-type semiconductor region 2a1. After the formation of the contact holes 12a, the resist pattern 20c is removed.

Figure 19:
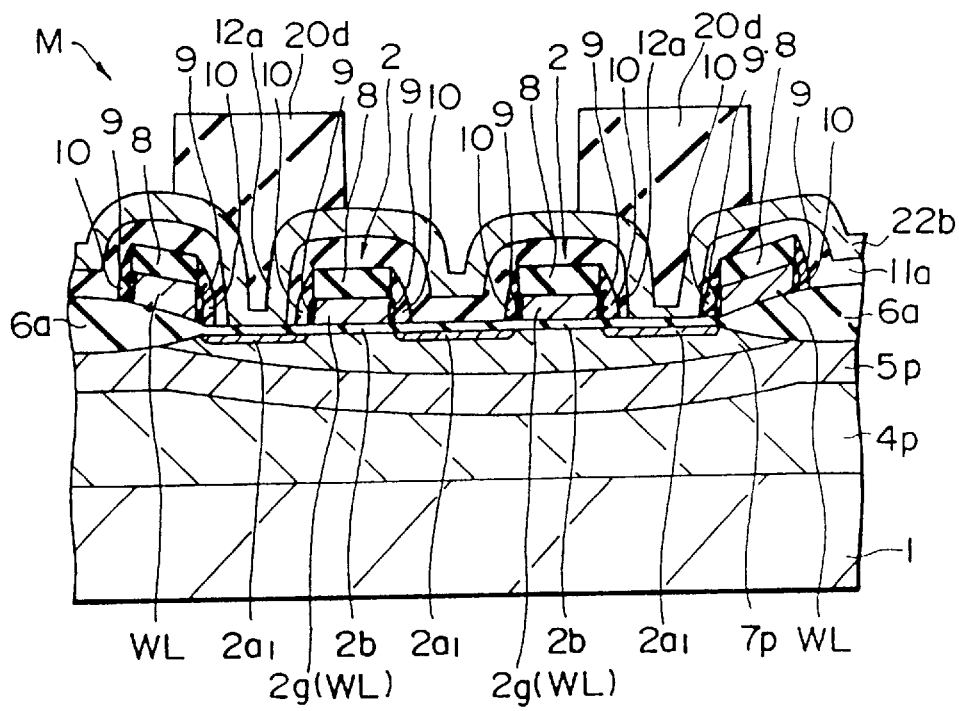
Figure 20:
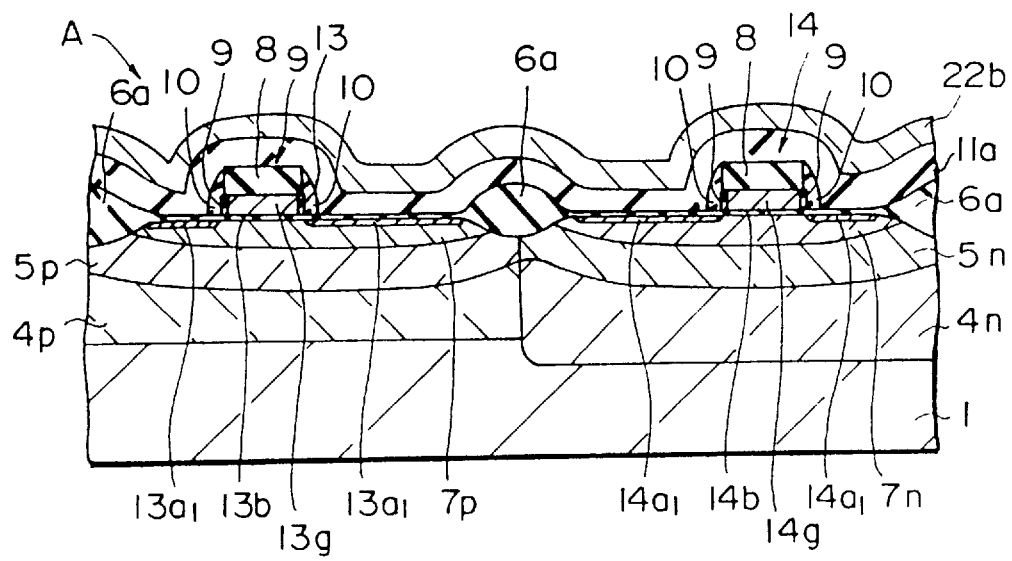

Subsequently, as shown in FIGS. 19 and 20, a conductive film (first conductive film) 22b made of, for example, n-type low-resistance polysilicon is deposited over the semiconductor substrate 1 by the CVD method or the like. A reactive gas used in this process may be, for example, a mixed gas consisting of silane ($SiH_4$) and $PH_3$.

The semiconductor substrate 1 is annealed, for example, in a $N_2$ gas atmosphere, so that the n-type impurity in the conductive film 22b is diffused into the substrate 1 to form an n⁺-type semiconductor region 2a2.

Figure 21:
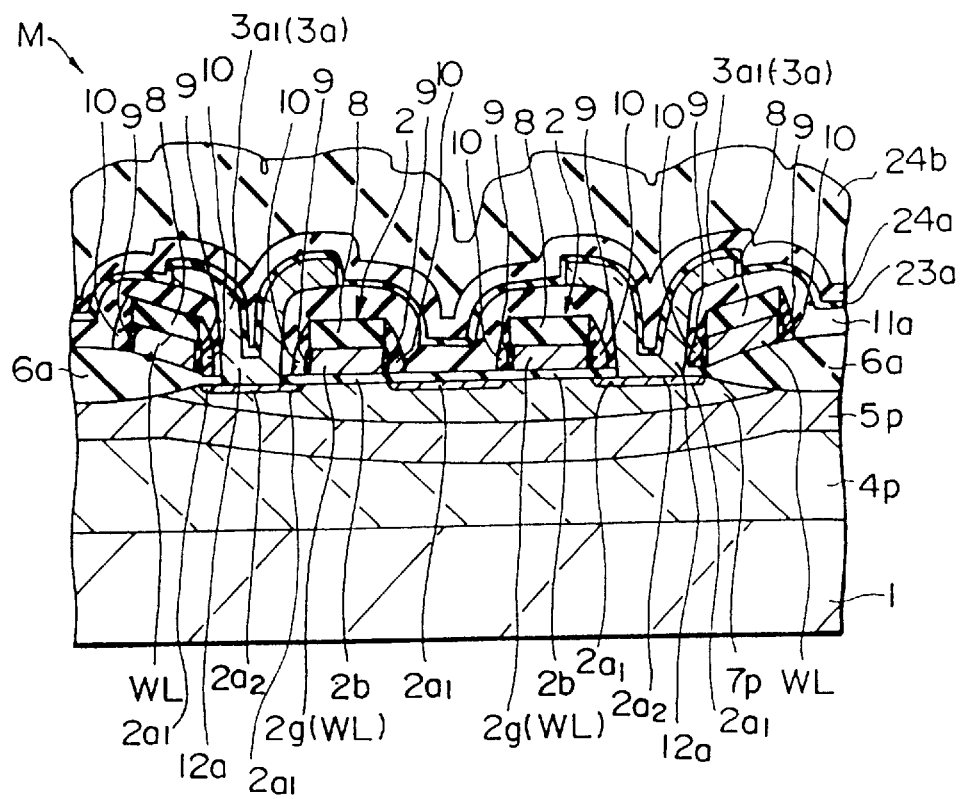
Figure 22:
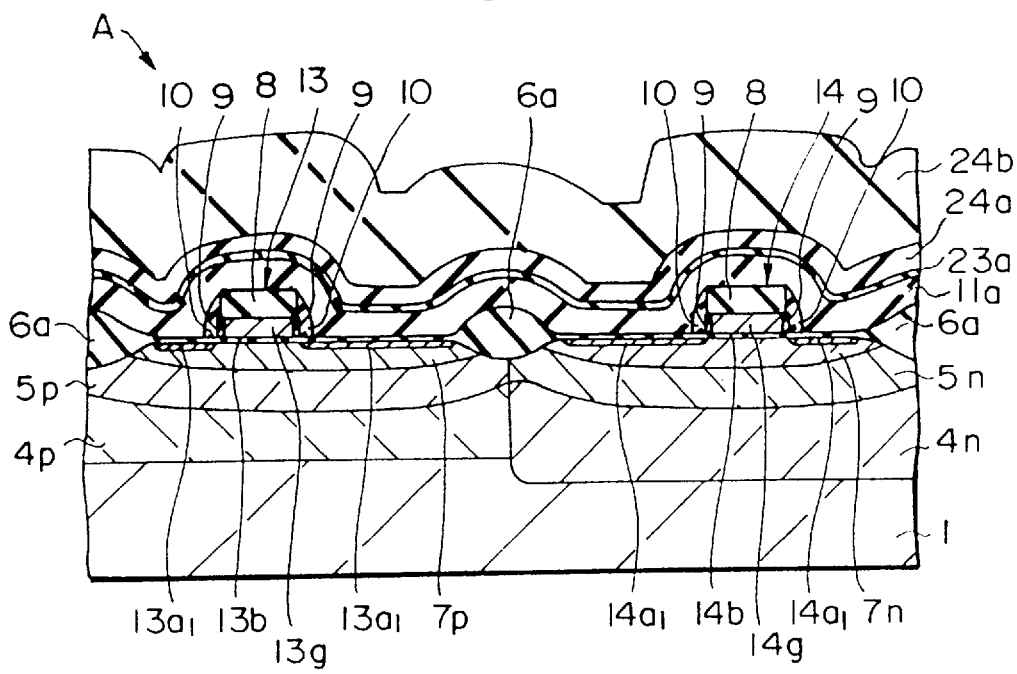

After the deposition of the conductive film 22b, a resist pattern 20d for covering only capacitor forming regions is formed on the conductive film 22b by the photolithography techniques. Then, with the resist pattern 20d used as an etching mask, the conductive film 22b is patterned by the dry etching method or the like to form a first fin 3a1 for each capacitor electrode 3a, as shown in FIGS. 21 and 22.

Next, an insulating film. 23a made of, for example, $Si_3N_4$ is deposited over the semiconductor substrate 1 by the CVD method or the like. A reactive gas used in this process may be, for example, a mixed gas consisting of silane dichloride ($SiH_2Cl_2$) and ammonia ($NH_3$).

Subsequent to the deposition of the insulating film 23a, an insulating film 24a made of, for example, $SiO_2$ is deposited on this insulating film 23a by the CVD method or the like. A reactive gas used in this process may be, for example, a mixed gas consisting of $SiH_4$ and $N_2O$.

Thereafter, an insulating film 24b made of, for example, BPSG (Boro Phospho Silicate Glass) is deposited on the insulating film 24a by the CVD method or the like. A reactive gas used in this process may be, for example, a mixed gas composed of TEOS (Tetraethoxysilane) and $O_2$ with predetermined amounts of boron and phosphorus added thereto.

The insulating films 23a, 24a and 24b serve as an insulating base film for conductive films for forming second and third fins 3a2 and 3a3.

Figure 23:
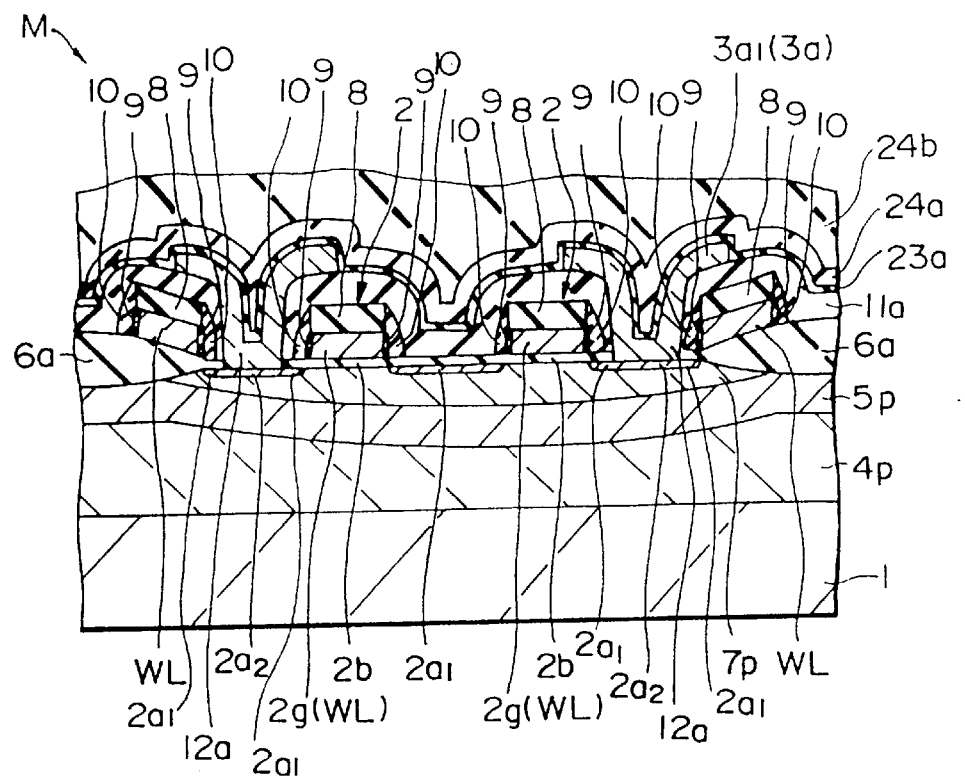
Figure 24:
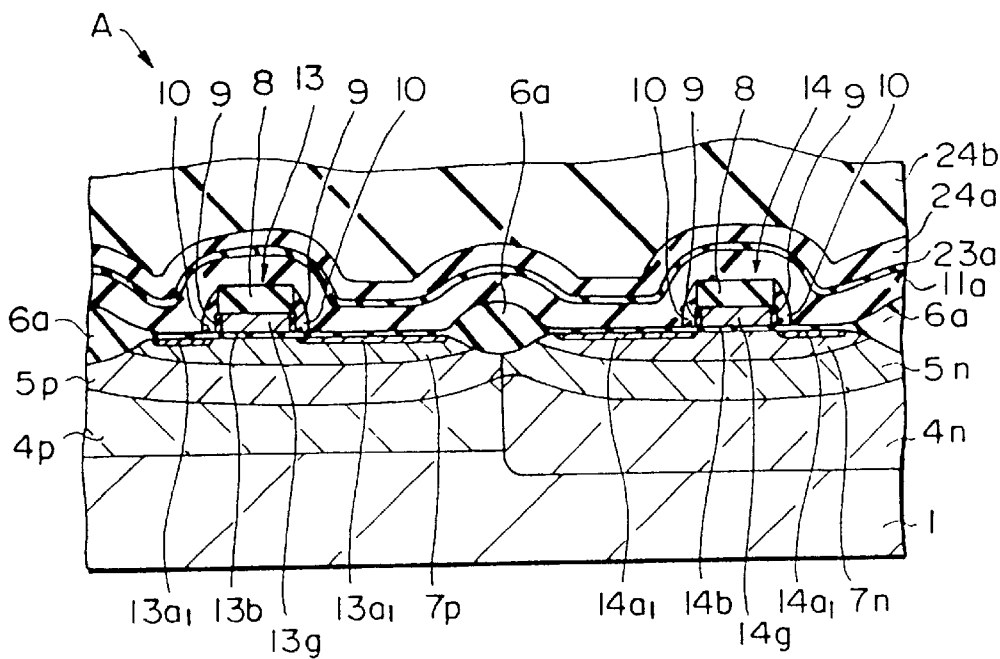

Next, the semiconductor substrate 1 with the films formed thereon is annealed, for example, in an atmosphere of a mixed gas consisting of $N_2$ and $O_2$ to flatten the top surface of the insulating film 24b, as shown in FIGS. 23 and 24.

Figure 25:
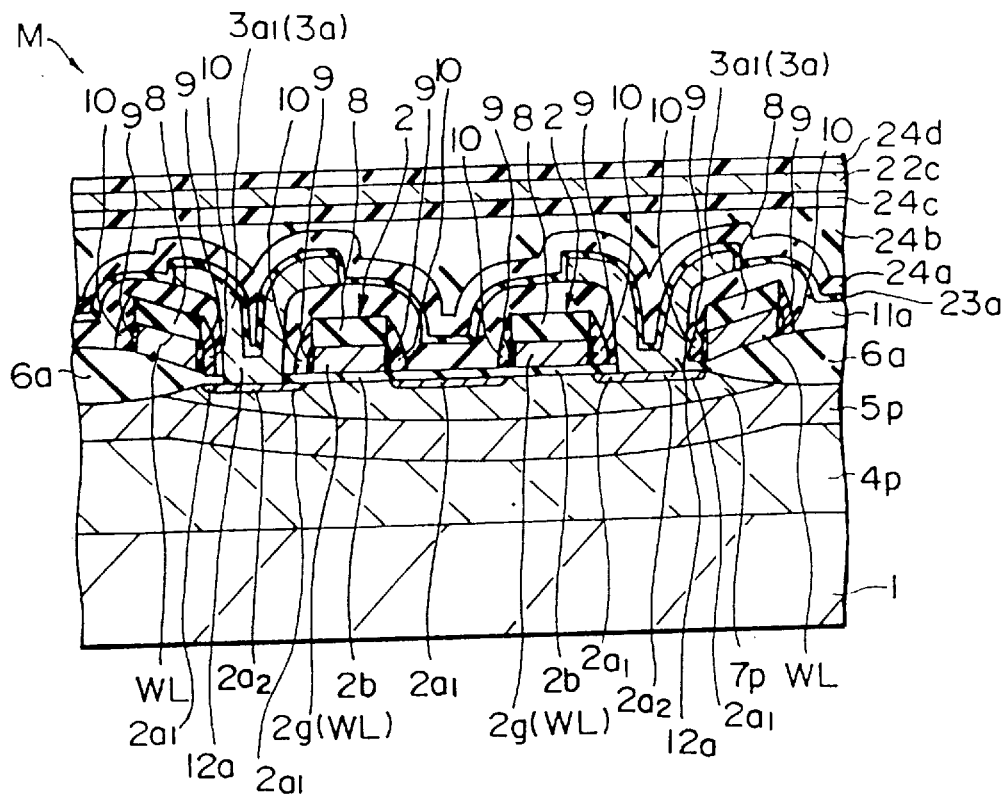
Figure 26:
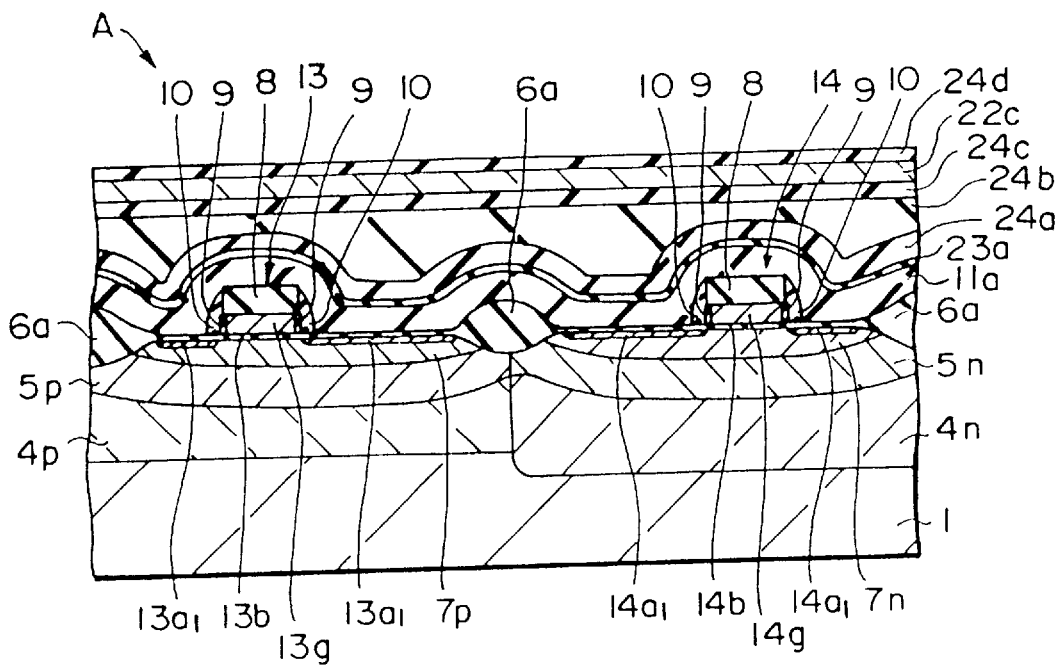

Subsequently, after etching back an upper portion of the insulating film 24b, the semiconductor substrate 1 with the films formed thereon is annealed, for example, in an atmosphere of a mixed gas consisting of $N_2$ and $O_2$ to further flatten the top surface of the insulating film 24, as shown in FIGS. 25 and 26.

Stated another way, in Embodiment 1, after the first fin 3a1 is formed for the capacitor 3 (see FIG. 2), the top surface of the insulating film 24b is flattened to serve as a good base for second and third fins 3a2, 3a3 for the capacitor 3.

In this way, the conductive films for forming the second and third fins 3a2, 3a3 can be made planar. This results in producing, for example, the following effects.

First, defective formation of the second and third fins 3a2, 3a3, caused by an uneven base, can be suppressed.

Secondly, the conductive films will not be over-etched when forming the second and third fins 3a2, 3a3.

Thirdly, since the conductive films can be formed into the second and third fins 3a2, 3a3 with an improved pattern machining accuracy, a pattern dimension accuracy can also be improved for the fins 3a2, 3a3.

Also, since the conductive films for forming the second and third fins are made planar, a capacitor insulating film can be made thinner. With such a thinner insulating film, the storage capacitance of the capacitor can be increased.

The flattening technique as described above becomes increasingly effective and important for ensuring the reliability of the capacitors 3 as the number of fins constituting the capacitors 3 is increased.

Next, an insulating film (third insulating film) 24c made of, for example, $SiO_2$ is deposited on the top surface of the flattened insulating film 24b by the CVD method or the like. A reactive gas used in this process may be, for example, a TEOS gas.

Subsequently, a conductive film (second conductive film) 22c made of, for example, n-type low-resistance polysilicon is deposited on the insulating film 24c by the CVD method or the like. A reactive gas used in this process may be, for example, a mixed gas consisting of silane ($SiH_4$) and $PH_3$. It should be noted that the conductive film 22c is provided for forming the second fin 3a2 for each capacitor 3.

Thereafter, an insulating film (third insulating film) 24d made of, for example, $SiO_2$ is deposited on the conductive film 22c by the CVD method or the like. A reactive gas used in this process may be, for example, a mixed gas consisting of $SiH_4$ and $N_2O$.

Figure 27:
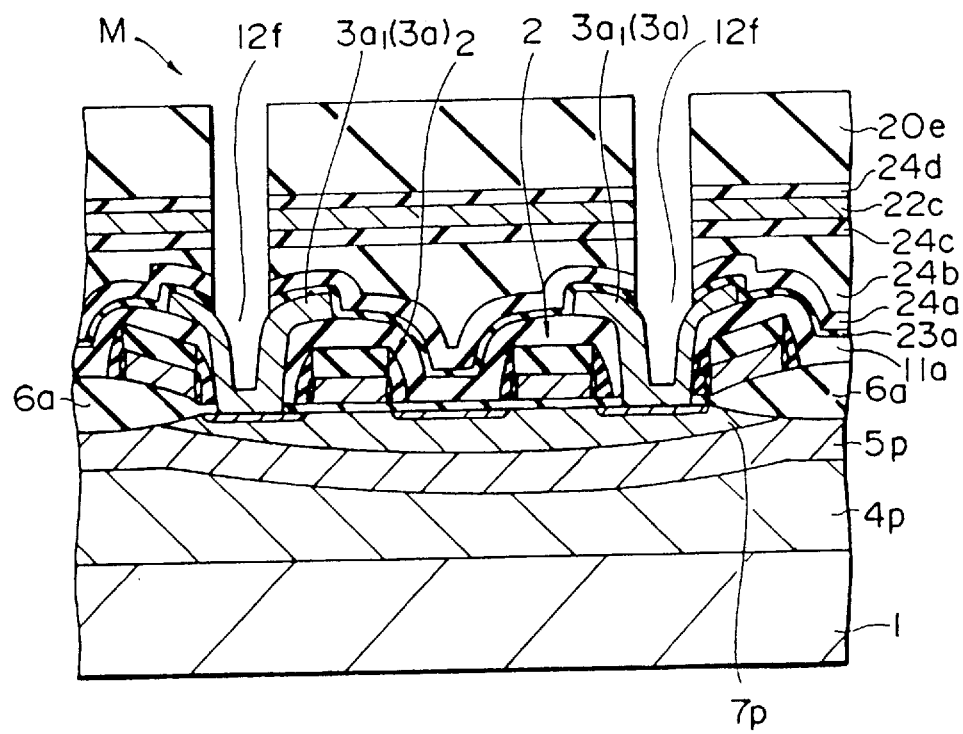
Figure 28:
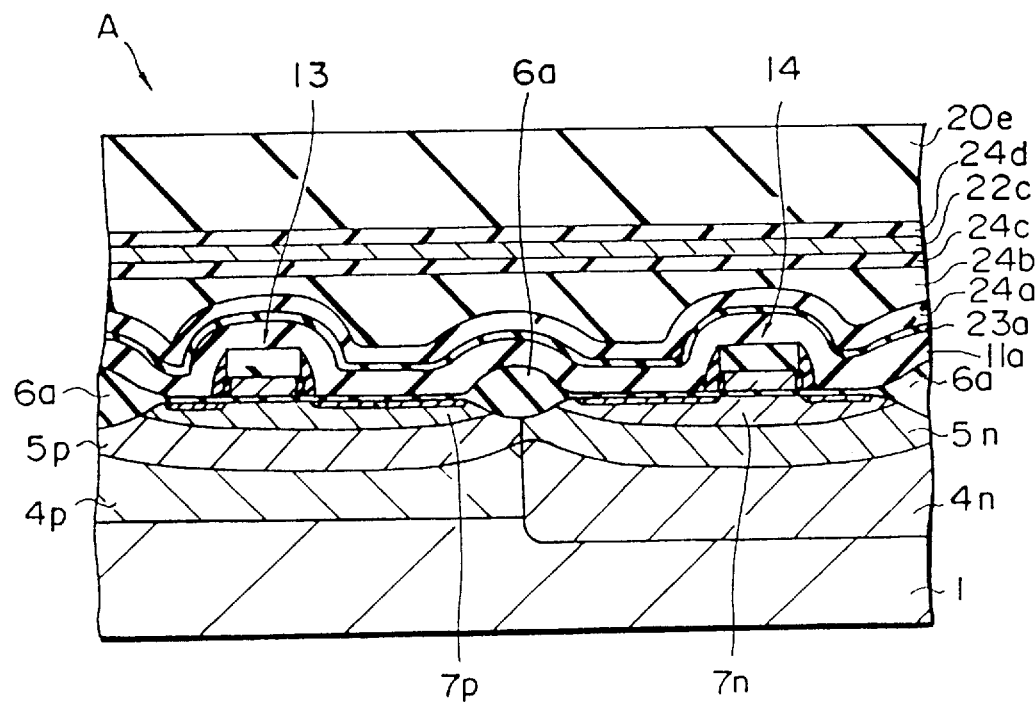

Next, as shown in FIGS. 27 and 28, a resist pattern 20e for exposing only an upper portion of a central region on the top surface of the fin 3a1 is formed on the insulating film 24d by the photolithography techniques.

Subsequent to the formation of the resist pattern 20e, a contact hole 12f is formed through the conductive film 22c and the insulating film 23a, 24a–24d by a dry etching method or the like, with the resist pattern 20e used as an etching mask, so as to expose a central portion of the top surface of the fin 3a1. Then, the resist pattern 20e is removed.

Figure 29:
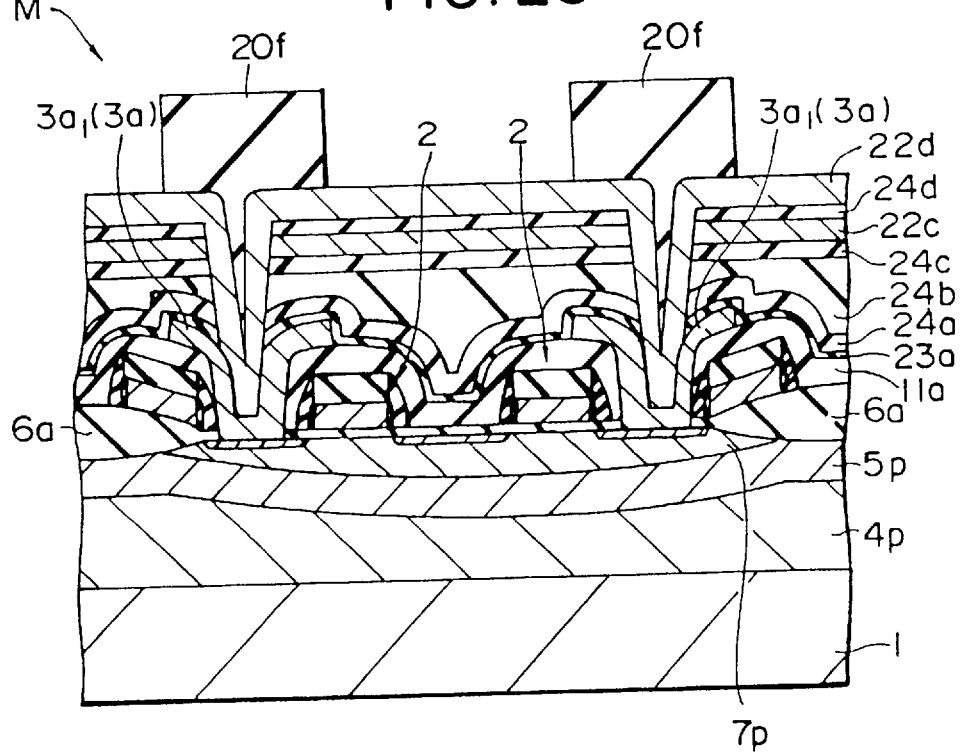
Figure 30:
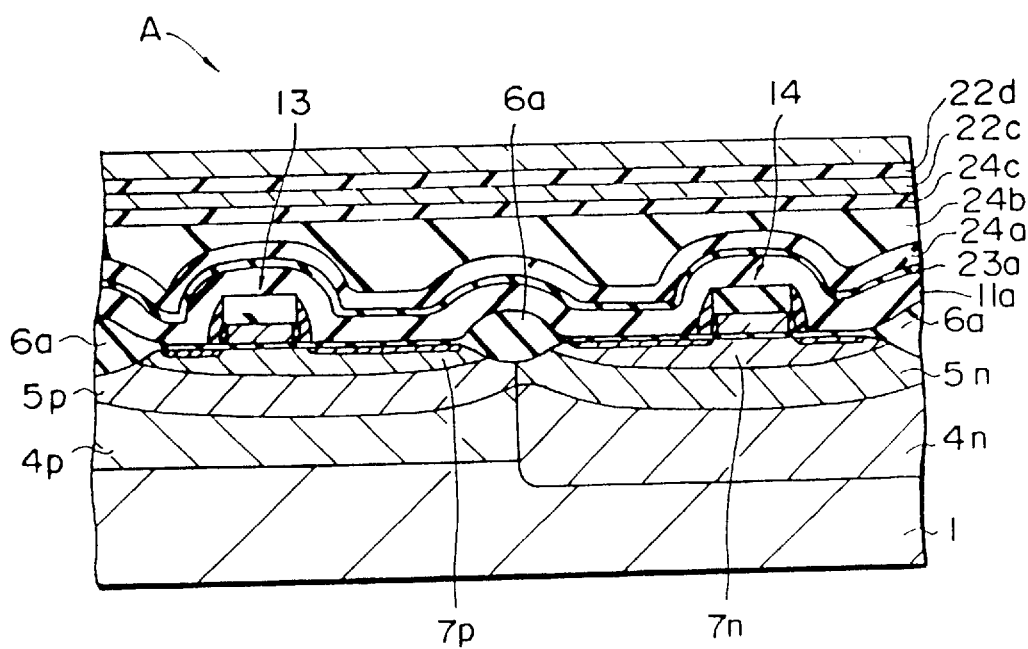

Thereafter, as shown in FIGS. 29 and 30, a conductive film (second conductive film) 22d made of, for example, n-type low-resistance polysilicon is deposited over the semiconductor substrate 1 by the CVD method or the like. A reactive gas used in this process may be, for example, a mixed gas consisting of $SiH_4$ and $PH_3$. It should be noted that the conductive film 22d is provided for forming the third fin 3a3 for the capacitor 3.

Next, after forming a resist pattern 20f for forming the capacitors on the conductive film 22d by the photolithography techniques, portions of the conductive film 22c and the insulating film 24d, which are not covered with the resist pattern 20f, are removed by the dry etching method or the like, with the resist pattern 20f used as an etching mask.

Figure 31:
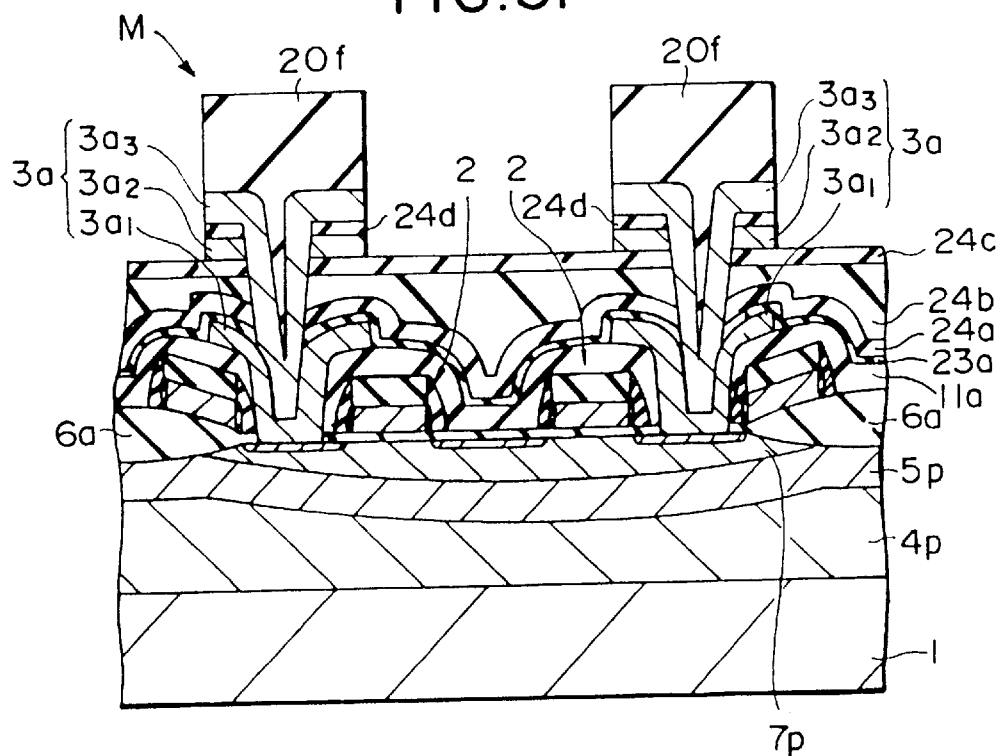
Figure 32:
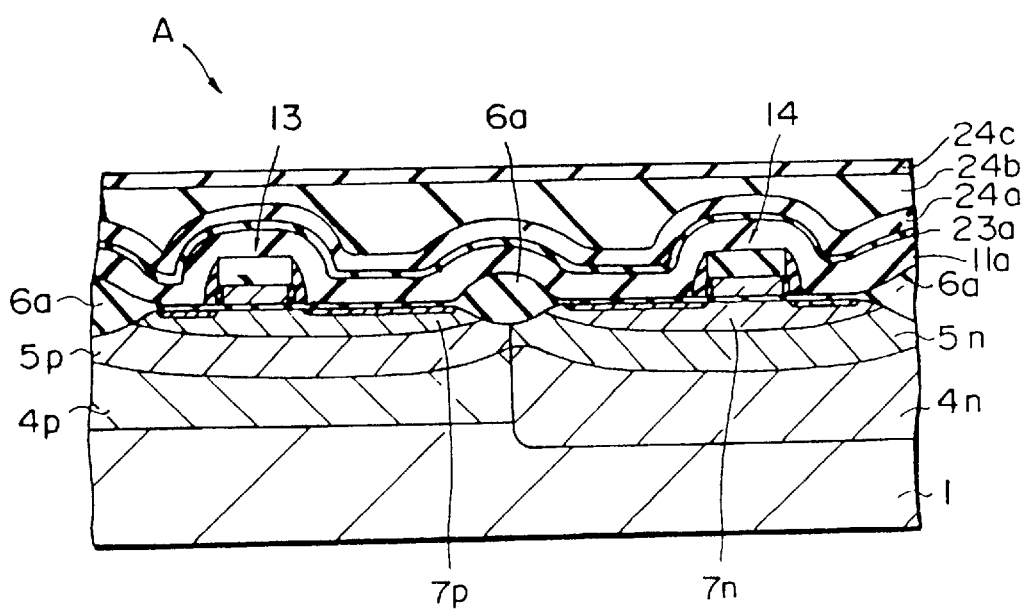

By patterning the conductive films 22c, 22d and the insulating film 24d in this way, the second and third fins 3a2, 3a3 are formed to complete each capacitor electrode 3a, as shown in FIGS. 31 and 32.

Subsequently, after removing the resist pattern 20f, the insulating films 24a–24c are removed by a wet etching method or the like. Then, the insulating film 23a is removed by using, for example, hot phosphoric acid or the like to expose the surfaces of the capacitor electrodes 3a.

Figure 33:
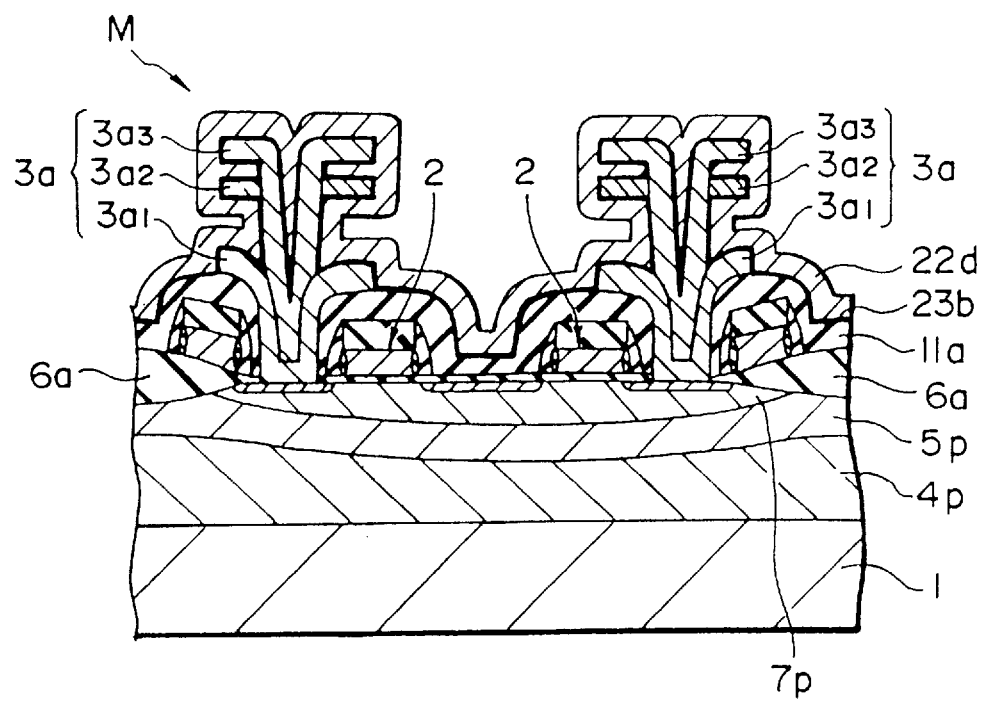
Figure 34:
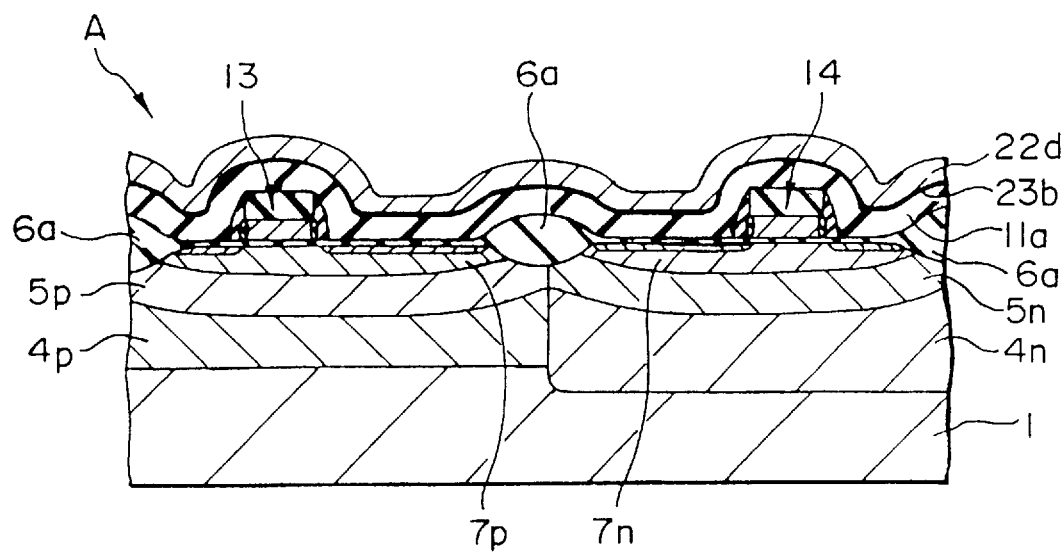

After removing the insulating film 23a, an insulating film 23b made of, for example, $Si_3N_4$ is deposited on the surfaces of the capacitor electrodes 3a and the insulating film 11a by the CVD method or the like, as shown in FIGS. 33 and 34. A reactive gas used in this process may be, for example, a mixed gas consisting of $SiH_2Cl_2$ and $NH_3$.

Next, the surface of the insulating film 23b is oxidized in an atmosphere of a mixed gas consisting of, for example, $O_2$ and hydrogen ($H_2$), and then a conductive film 22d made of, for example, n-type low-resistance polysilicon is formed on the insulating film 23b by the CVD method or the like. A reactive gas used in this process may be, for example, a mixed gas consisting of $SiH_4$ and $PH_3$.

Figure 35:
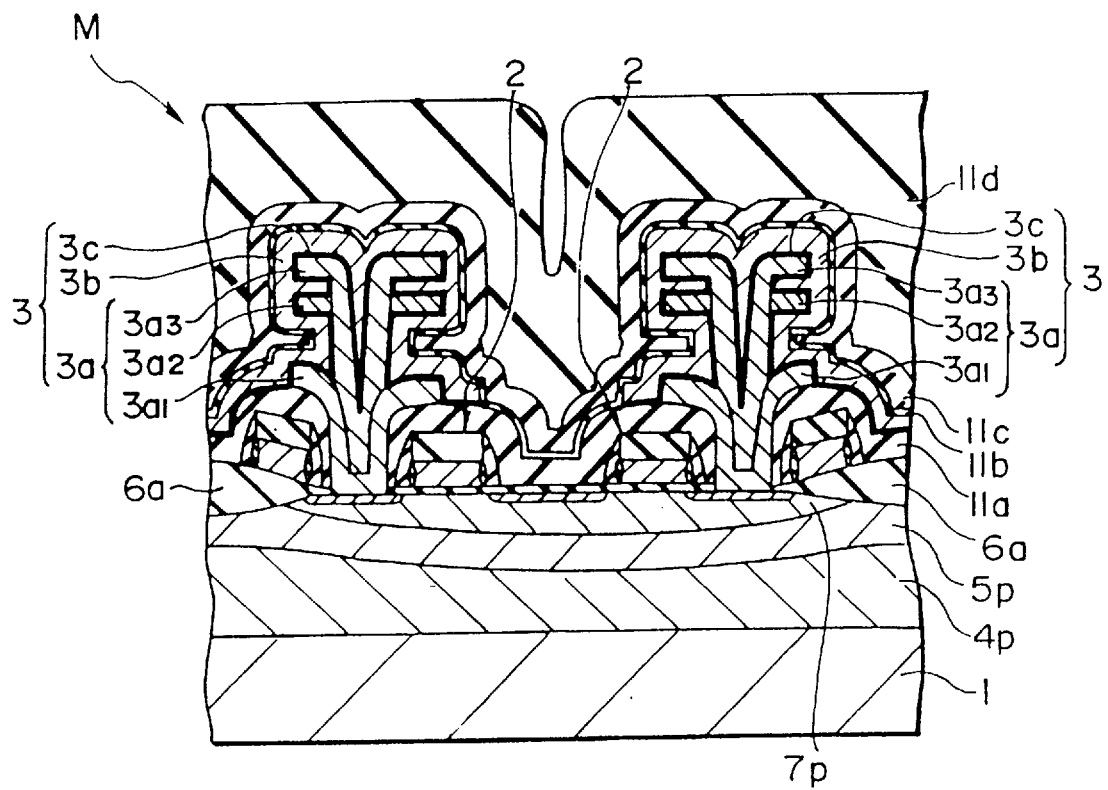

Subsequently, the conductive film 22d is patterned by photo resist techniques to form capacitor electrodes 3b, thus completing the capacitors 3, as shown in FIG. 35.

Figure 36:
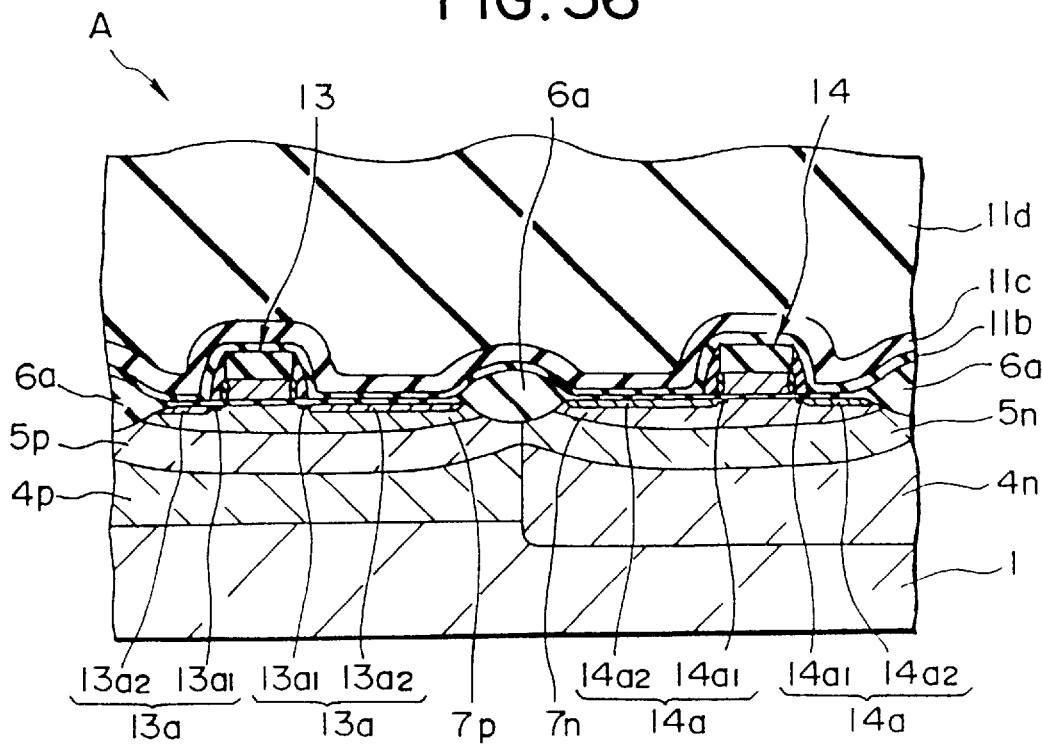

After the capacitors 3 are made, an insulating film 11b is formed over the semiconductor substrate 1 by the CVD method or the like, as shown in FIGS. 35 and 36. A reactive gas used in this process may be, for example, a TEOS gas.

Next, after forming a resist pattern (not shown) for covering the entire surface except for an upper portion of the nMOS region in the peripheral circuit region on the insulating film 11b, n-type impurities such as As, for example, are doped into the semiconductor region 7p with the newly formed resist pattern and the gate electrode 13g of the nMOS 13 used as ion implanting masks.

Subsequent to the As doping process, the resist pattern is removed. Then, a resist pattern (not shown) for covering the entire surface except for an upper portion of the pMOS region in the peripheral circuit region is formed on the insulating film 11b. This resist pattern and the gate electrode 14g of the pMOS 14 are used as ion implanting masks to dope p-type impurities such as boron, for example, into the semiconductor region 7n.

Then, after removing the resist pattern, the semiconductor substrate 1 with the films so far formed thereon is annealed in a $N_2$ gas atmosphere to form an $n^+$-type semiconductor region 13a2 for the nMOS 13 and a $p^+$-type semiconductor region 14a2 for the pMOS 14, thus completing the LDD structure of the nMOS 13 and the pMOS 14 in the peripheral circuit region.

Next, bit line conductors are formed over the semiconductor integrated circuit 1, for example, by the following method.

First, an insulating film 11c made of, for example, $SiO_2$ is deposited on the insulating film 11b by the CVD method or the like. A reactive gas used in this process may be, for example, a mixed gas consisting of $SiH_4$ and $N_2O$.

Subsequently, an insulating film 11d made of, for example, BPSG is deposited on the insulating film 11c by the CVD method or the like. A reactive gas used in this process may be a mixed gas composed of a TEOS gas with phosphorus and boron added thereto.

Figure 37:
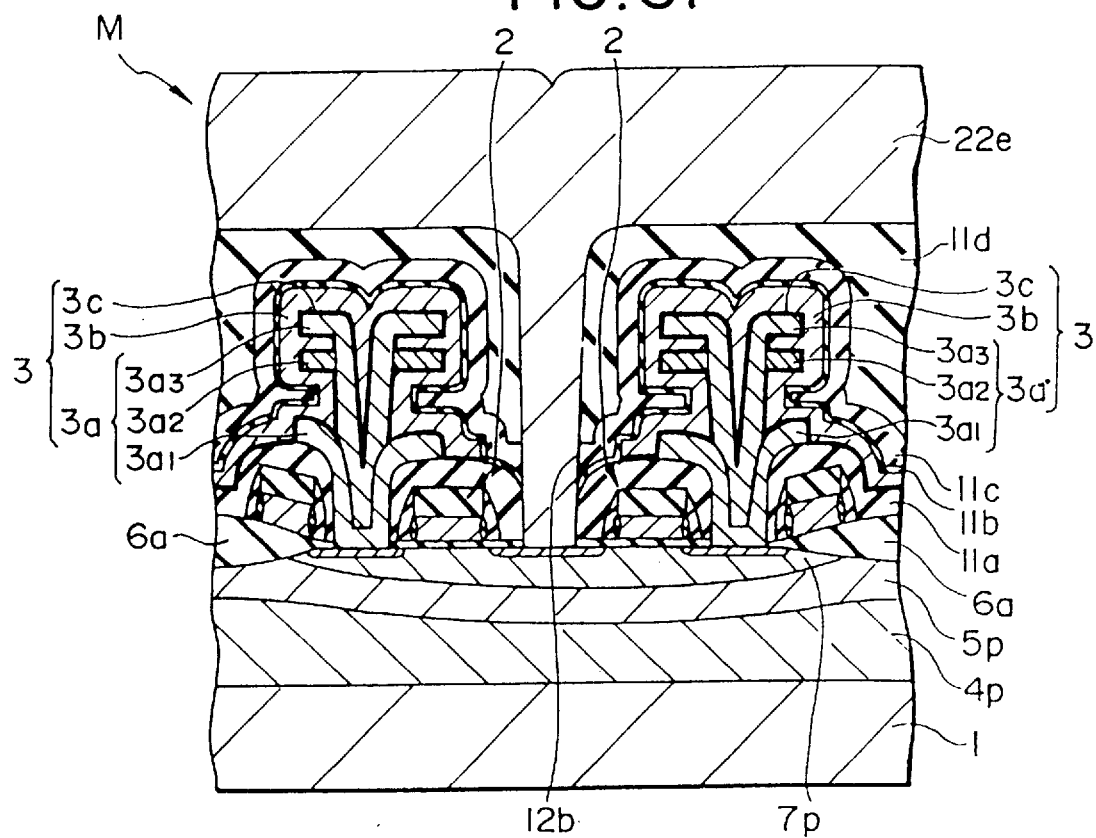
Figure 38:
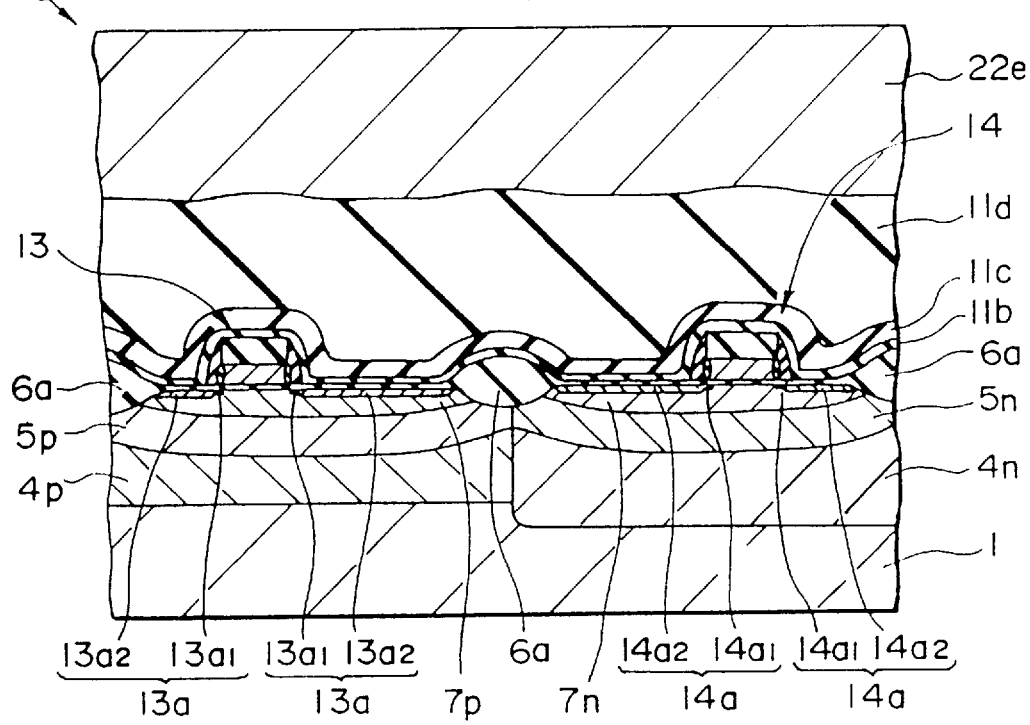

Then, after the semiconductor substrate 1 with the films so far formed thereon is annealed in an atmosphere of a mixed gas, for example, consisting of $N_2$ and $O_2$ to flatten the top surface of the insulating film 11d, an upper portion of the insulating film 11d is etched back, and the semiconductor substrate 1 with the films so far formed thereon is again annealed to flatten the top surface of the insulating film 11d, as shown in FIGS. 37 and 38.

Next, after forming a contact hole 12b through the insulating film 11d so as to expose the top surface of a portion of the $n^-$-type semiconductor region 2a1 in the nMOS 2 by the photolithography techniques, a conductive film 22e made of, for example, n-type low-resistance polysilicon doped with a high concentration n-type impurity (e.g., phosphorus) is deposited on the insulating film 11d. A reactive gas used in this process may be, for example, a mixed gas consisting of $SiH_4$ and $PH_3$.

Figure 39:
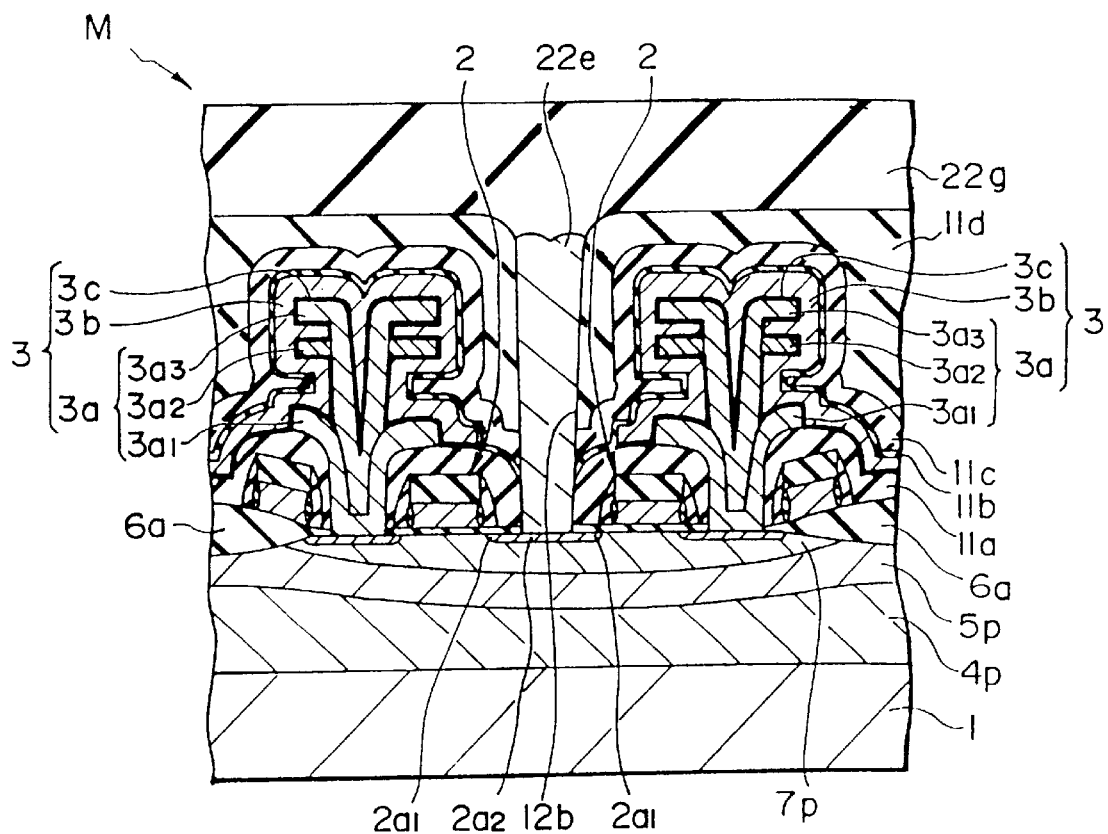

Subsequent to the formation of the contact hole 12b, an upper portion of the conductive film 22e is etched back so as to fill the conductive film 22e only in the contact hole 12b, as shown in FIG. 39. The filled conductive film 22e forms part of the bit line connection member BC.

The semiconductor substrate 1 is annealed, for example, in a $N_2$ gas atmosphere, so that the n-type impurity in the filled conductive film 22e is diffused into the substrate 1 to form another $n^+$-type semiconductor region 2a2.

Figure 40:
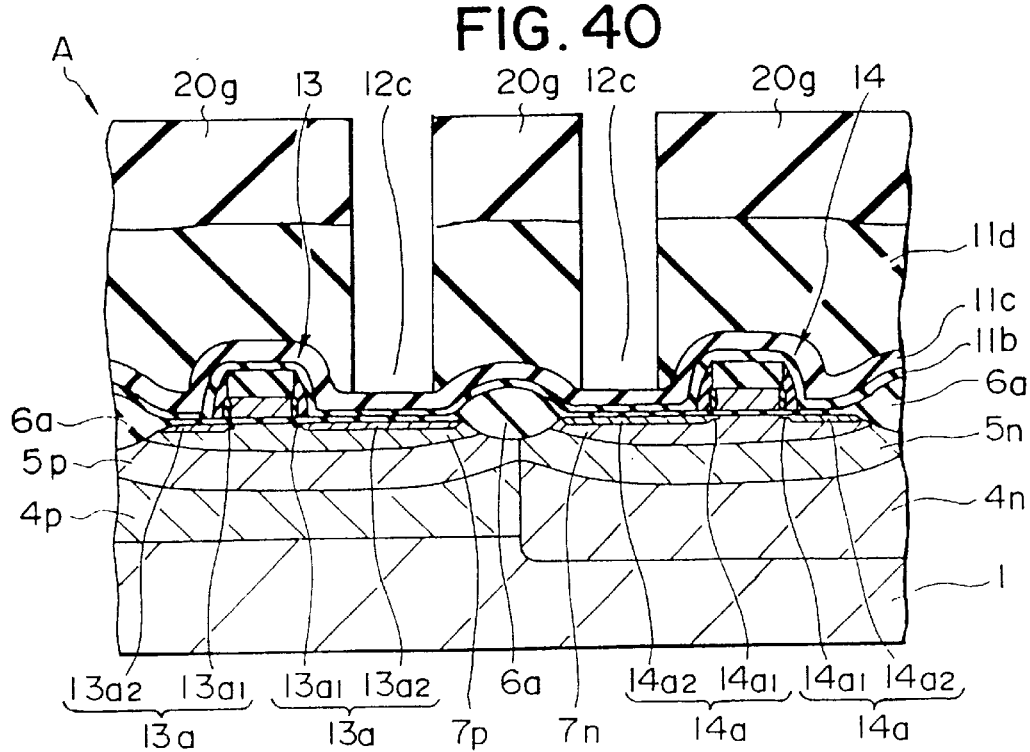

Thereafter, as shown in FIGS. 39 and 40, a resist pattern 20g is formed on the insulating film 11d by the photolithography techniques for exposing only upper portions of one $n^+$-type semiconductor region 13a2 of the nMOS 13 and one $p^+$-type semiconductor region 14a2 of the pMOS 14 in the peripheral circuit region. Then, with the resist pattern 20g used as an etching mask, contact holes 12c are formed through the insulating film 11d for exposing the semiconductor regions 13a2, 14a2.

Next, after removing the resist pattern 20g, a metal film 25a made of, for example, tungsten is formed over the semiconductor substrate 1 as shown in FIGS. 41 and 42.

The metal film 25a is formed by first depositing a metal film made of tungsten or the like over the semiconductor substrate 1 by a sputtering method, the CVD method or the like and then depositing a metal film made of tungsten or the like on the metal film by the CVD method or the like. A reactive gas used in the CVD processing may be, for example, a mixed gas consisting of tungsten hexafluoride ($WF_6$) and $H_2$.

Subsequent to the formation of the metal film 25a, the metal film 25a is patterned by normal photolithography techniques to form bit line conductors BL for constituting memory circuits over the semiconductor substrate 1, and simultaneously with this patterning, first level wiring conductors 15a are patterned for constituting peripheral circuits.

Briefly, in Embodiment 1, the metal film 25a for constituting the bit line conductors BL is used to also form the first level wiring conductors 15a for constituting the peripheral circuits on the same layer level as the bit line conductors BL. As a result, the following effects are produced.

First, since the contact holes 12c of substantially a uniform depth can be provided for connecting the first level wiring conductors 15a with the nMOS 13 and the pMOS 14, the reliability of the contact therebetween can be improved.

Conventionally, the depths of contact holes for connecting the first level wiring conductors for peripheral circuits with elements in the peripheral circuit region have not been uniformly formed, for example, by the following reasons. Since wiring conductors for peripheral circuits are conventionally formed in a layer higher than a layer in which bit line conductors are formed, an extra layer formed of an insulating film intervenes between the wiring conductors for peripheral circuits and the elements. Thus, possible variations in the thickness of the intervening insulating film also result in varying the depths of respective contact holes 12c extending from the wiring layer on the insulating film to the elements.

Secondly, since the wiring layer for the bit line conductors BL may be used as a wiring layer for the first level wiring conductors 15a, the freedom in arrangement of wiring conductors can be improved.

Next, second level wiring conductors and third level wiring conductors are formed over the semiconductor substrate 1, for example, by the following method.

Figure 43:
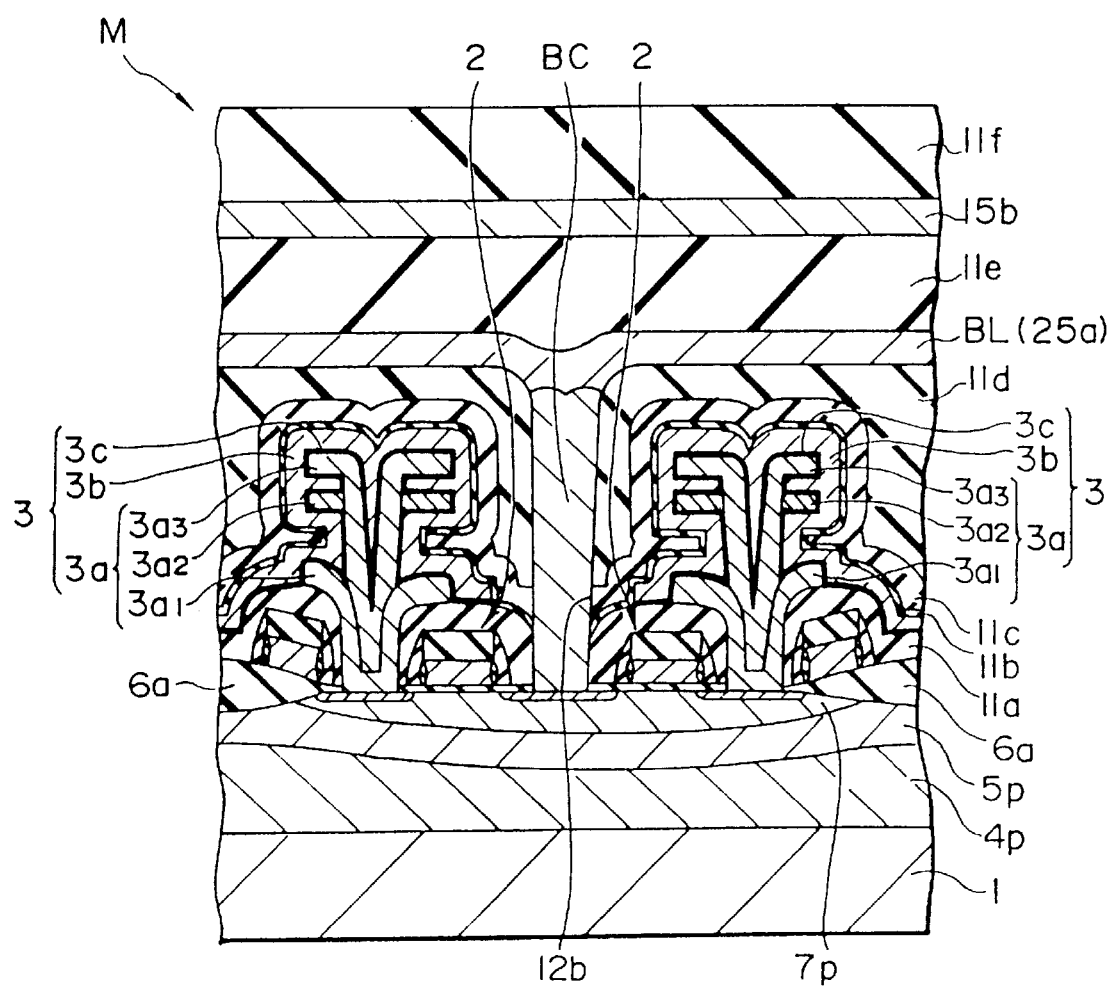
Figure 44:
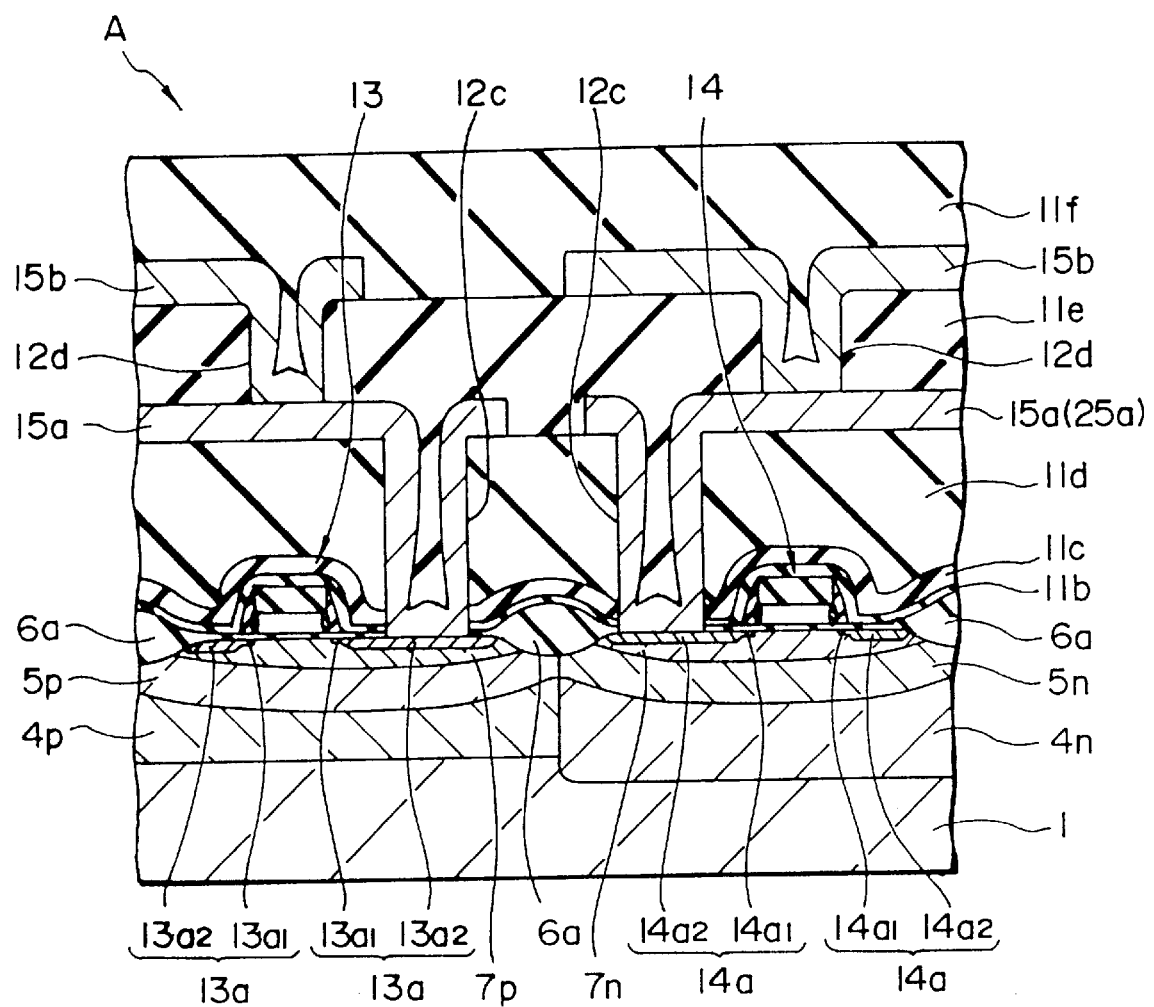

First, as shown in FIGS. 43 and 44, an insulating film 11e is formed on the insulating film 11d so as to cover the bit line conductors BL and the first level wiring conductors 15a. The insulating film 11e is formed, for example, in the following manner.

An insulating film made of, for example, $SiO_2$ is initially deposited on the insulating film 11d by the CVD method or the like using, for example, a mixed gas consisting of TEOS, helium (He) and $O_2$, and then an SOG (Spin On Glass) film, for example, is coated on the insulating film.

Subsequently, an upper portion of the two-layer structured insulating film is etched back to flatten the top surface thereof, and thereafter an insulating film made of, for example, $SiO_2$ is deposited on the insulating film by the CVD method or the like using, for example, a mixed gas consisting of TEOS and $O_2$, thus completing the formation of the insulating film 11e.

Next, after forming the insulating film 11e, contact holes 12d are formed through the insulating film 11e in the peripheral circuit region A so as to expose portions of the first level wiring conductors 15a. Then, the second level wiring conductors 15b are formed on the insulating film 11e in a manner similar to the first level wiring conductors 15a.

Subsequent to the formation of the second level wiring conductors 15b, an insulating film 11f is formed on the wiring conductors 15b. This insulating film 11f may also be formed, for example, in a manner similar to the insulating film 11e.

Figure 45:
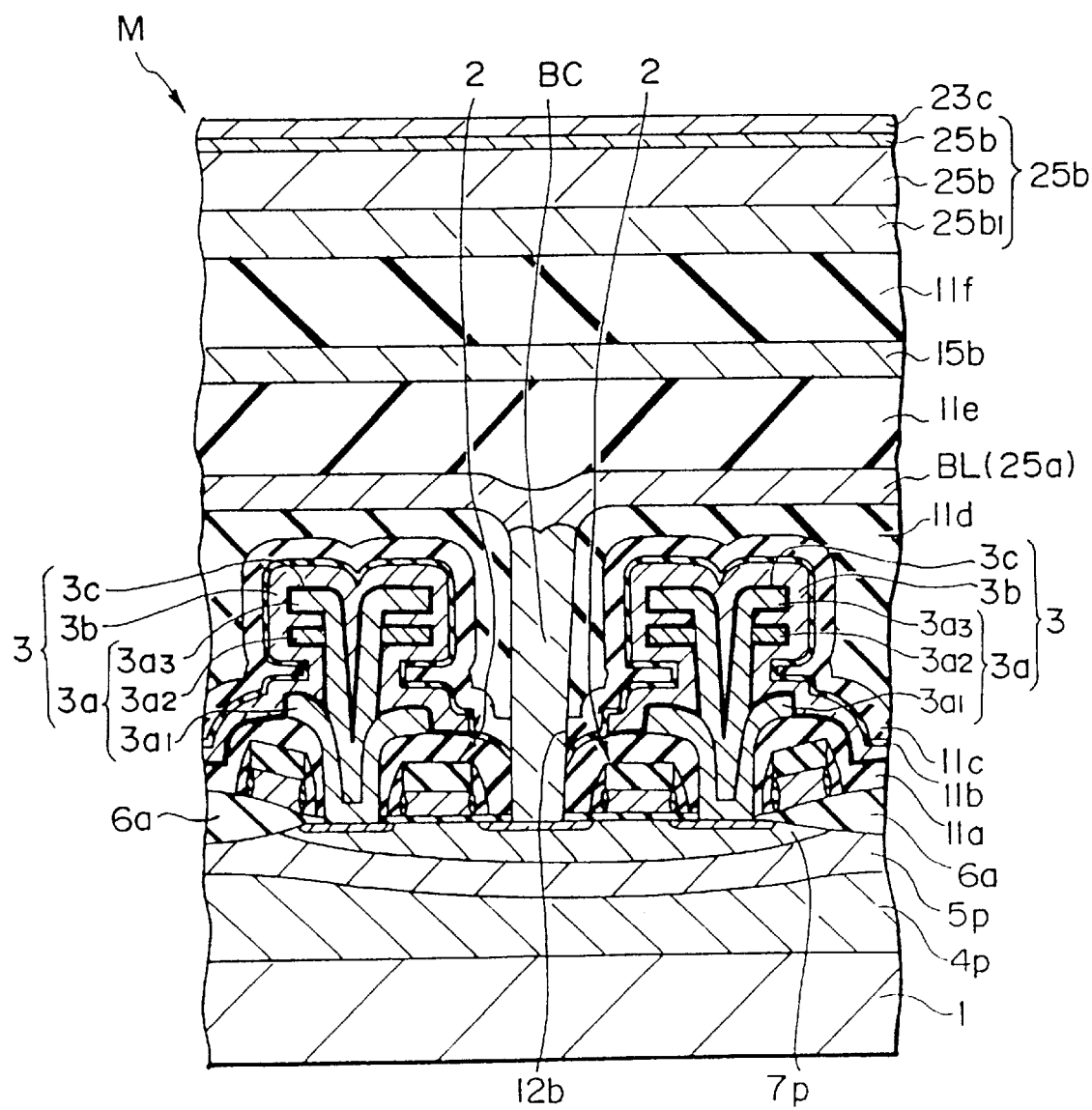
Figure 46:
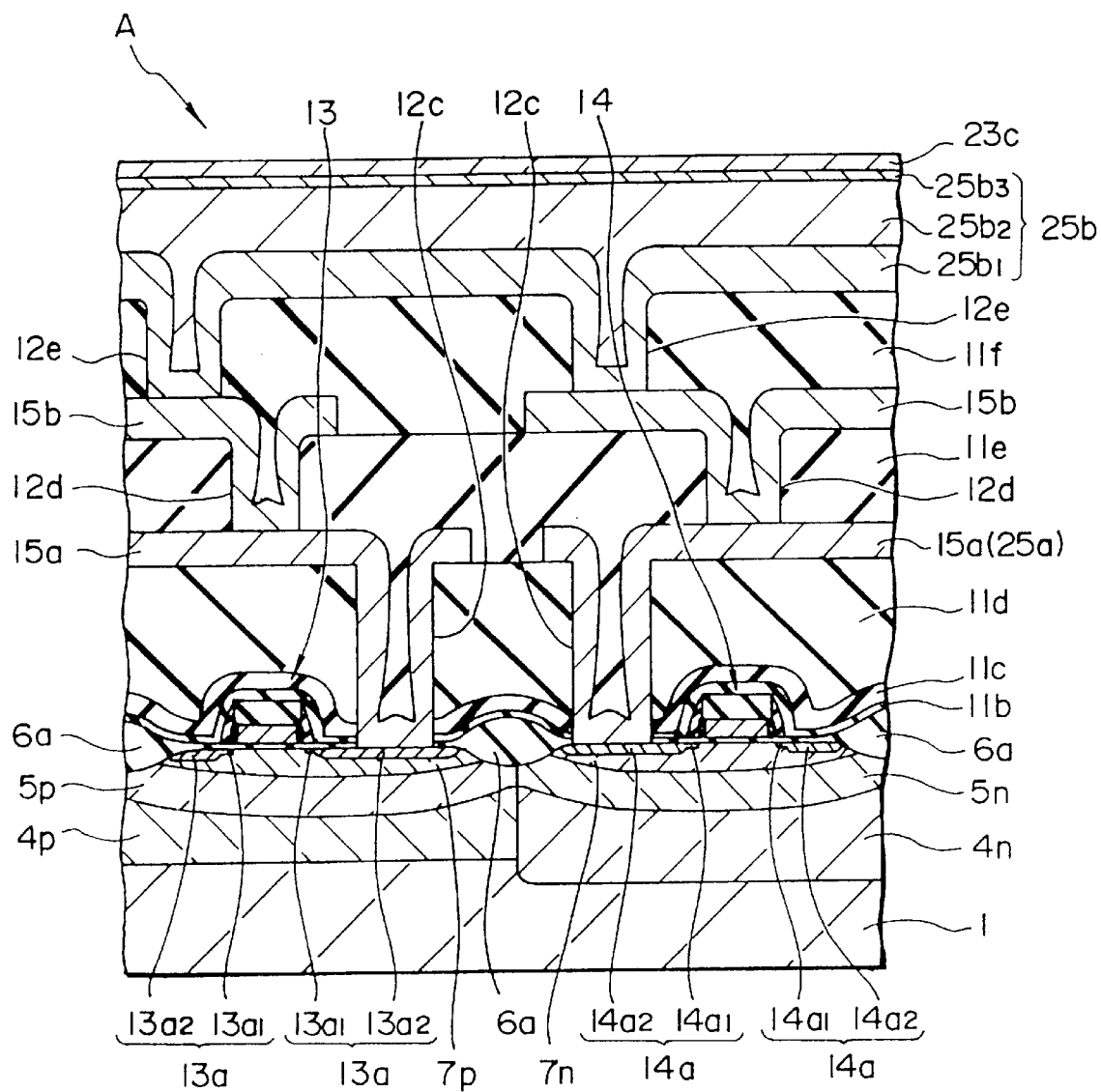

Thereafter, as shown in FIGS. 45 and 46, contact holes 12e are formed through the insulating film 11f in the peripheral circuit region A so as to expose portions of the second level wiring conductors 15b. Then, a metal film 25b is formed on the insulating film 11f, for example, in the following manner.

First, a metal film made of, for example, tungsten is deposited on the insulating film 11f, for example, by the sputtering method, the CVD method or the like. Then, a metal film made of tungsten or the like is deposited on the metal film by a blanket CVD method to form a metal film 25b1. A reactive gas used for the blanket CVD processing may be, for example, a mixed gas consisting of $WF_6$ and $H_2$.

Subsequently, a metal film 25b2 made of, for example, Al-Cu-Si alloy is deposited on the metal film 25b1 by the sputtering method or the like. Further, on the metal film 25b2, a metal film 25b3 made of, for example, tungsten is deposited by a sputtering method or the like, thus completing the metal film 25b.

After the formation of the metal film 25b, an insulating film 23c made of, for example, $Si_3N_4$ is deposited on the metal film 25b3 by the CVD method or the like. A reactive gas used in this process may be, for example, a mixed gas consisting of $SiH_4$, $NH_3$ and $N_2$.

Thereafter, the metal film 25b and the insulating film 23c are patterned by normal photolithography techniques to form the third level wiring conductors 15c and a surface protection film 16a, as shown in FIGS. 2 and 3.

After forming the third level wiring conductors 15c, a surface protection film 16b made of, for example, $SiO_2$ is formed on the insulating film 11f by the CVD method or the like so as to cover the third level wiring conductors 15c. A reactive gas used in this process may be, for example, a mixed gas consisting of TEOS, He and $O_2$.

According to Embodiment 1 as described above, the following effects can be produced.

(1) The cell pair unit structure having a bit line connection member BC and two memory cells MC arranged on both sides of the bit line connection member BC are positionally shifted in the right direction on FIG. 1 by a quarter of the periodic pattern each time the bit line conductor BL is repetitively arranged in the downward direction on FIG. 1, so that the capacitors 3 are not sequentially arranged along the vertical direction on FIG. 1. Thus, the distance between adjacent capacitors 3 in the vertical direction on FIG. 1 can be made longer, and a positioning margin between the capacitors and the capacitor connection member CC can be made wider.

(2) By positioning the bit line connection member BC at a corner portion of the capacitor 3 (a portion of the capacitor 3 opposite to a side of the bit line connection member BC) which would otherwise be removed during the pattern formation, the area for the memory cell array M can be effectively utilized.

(3) With the effects (1) and (2), the area of each capacitor 3 can be extended without incurring a significant increase in the entire area of the memory cell array M.

(4) Since the contact holes 12b, through which the bit line conductors BL are connected to the semiconductor region 2a of the nMOS 2 in the memory cell MC, are filled with, for example, low-resistance polysilicon, this structure is free from the problem of short-circuiting due to a shifted bit line conductor BL, the problem on the contact resistance between the bit line conductor BL and the semiconductor region 2a, and so on. In addition, this structure enables the first level wiring conductors 15a for peripheral circuits to be formed on the same layer level as the bit line conductors BL, by using a metal film for providing the bit line conductors BL.

(5) The above effect (4) also contributes to the formation of a uniform depth for the contact holes 12c each for connecting the first level wiring conductor 15a to the nMOS 13 or the pMOS 14 in the peripheral circuit region A, whereby the reliability of the connection made therethrough can be improved.

(6) Since the effect (4) also allows the wiring layer for the bit line conductors BL, which has conventionally not been able to be used for wiring conductors constituting peripheral circuits, to be used as a wiring layer for the first level wiring conductors 15a constituting peripheral circuits, a region for arranging wiring conductors can be extended. In this way, the peripheral circuit region A can be reduced. Also, a freedom in arranging wiring conductors in the peripheral circuit region a can be improved.

(7) In the connection area C (FIG. 4) for connecting the third level wiring conductors 15c to the word line conductors WL, mutually adjacent connection conductors 17 are separated by such a spacing that allows one word line conductor WL to intervene therebetween, so that a wiring spacing required between the mutually adjacent connection conductors 17 can be alleviated, thus making it possible to provide a larger positioning margin as well as to reduce the connection area C.

(8) By arranging the powering conductor 18 on the outermost side of each memory cell array M in parallel with the bit line conductors BL such that it complies with the regularity of the repetitive arrangements for the bit line conductors BL, the powering conductor 18 can prevent thinning of the outermost bit line conductor BL in each memory cell array M which would occur if such a wiring conductor 18 were not provided, thus improving the reliability of the outermost bit line conductors BL in the respective memory cell arrays M. This effect further leads to improving the yield rate and reliability of semiconductor integrated circuit devices.

(9) Since the channel stopper layers 5p, 5n are formed using an ion implanting method or the like after forming the field insulating film 6, good channel stopper layers 5p, 5n can be formed without giving rise to the narrow channel effect in the nMOS 2 constituting the memory cell MC. It is therefore possible to make the nMOS 2 constituting the memory cell MC in a fine structure.

(10) Since the channel stopper layers 5p, 5n are also formed for the peripheral circuit region A using a method as described above, the narrow channel effect can be prevented also in the nMOS 13 and the pMOS 14 in the peripheral circuit region A, so that the nMOS 13 and the pMOS 14 can also be made fine. Stated another way, this formation of the channel stopper layers can respond to requirements to a fine structure of the peripheral circuit region A.

(11) Since the channel stopper layers 5p, 5n are formed in the peripheral circuit region A simultaneously with the formation of the channel stopper layers 5p, 5n in the memory cell array M, the number of exposure masks and the number of manufacturing processes can be reduced.

(12) Since the effect (10) contributes to preventing the narrow channel effect in the MOS region or the like in the memory cell array M and the peripheral circuit region A, the yield rate and reliability of the semiconductor integrated circuit device can be improved.

(13) The top surface of the insulating film 24b, which serves as the base for the second and third fins 3a2, 3a3 for the capacitors 3, is flattened after forming the first fin 3a1 for the capacitors 3, the conductive films 22c, 22d for forming the second and third fins 3a2, 3a3 can be made planar, thus making it possible to improve the reliability and pattern dimension accuracy of the capacitors 3.

(14) By flattening the top surface of the insulating film 24b, which serves as the base for the second and third fins 3a2, 3a3 for the capacitors 3, after forming the first fin 3a1 for the capacitor 3, the conductive films 22c, 22d for forming the second and third fins 3a2, 3a3 can be made planar, so that the thickness of the capacitor insulating film 3c can be reduced. The reduced thickness of the insulating film 3c enables the storage capacitance of the capacitor 3 to be increased.

(15) By first forming the first fin 3a1 and later forming the second and third fins 3a2, 3a3 when forming the fin-shaped capacitors 3, a resist pattern used as an etching mask need not be made thick. Therefore, even if an exposure apparatus only provides a low resolution, the capacitors 3, for example, having three fins 3a1–3a3 can be favorably made.

Turning again to FIG. 1, the unit structures are arranged to form oblique sequence unit structures LLk1, LLk2, . . . , LLk5 substantially parallel with each other. The oblique sequences of unit structures SU slope in an upper left to lower right direction. As has been described with reference to FIG. 2A, each capacitor 3 in each of the unit structures has a node electrode 3a provided separately for each memory cell, a plate electrode 3b provided in common to plural memory cells and a dielectric film 3c sandwiched therebetween. The distance d1 between the node electrode 3a of the first capacitor 3 of any one of the unit structures SU in any one oblique sequence (e.g., LLk3) and that of the second capacitor 3 of a unit structure SU in an oblique sequence (e.g., LLk2) adjacent to the first-mentioned oblique sequence is determined or defined by delineation limits or minimal lithography sizes. In other words, the distances d1 between the node electrodes 3a of the capacitors 3 of the unit structures in adjacent two oblique sequences as viewed in a direction perpendicular to the sloping direction of the oblique sequences are determined or defined by delineation limits or minimal lithography sizes.

In FIG. 1, the switching transistors of adjacent two memory cells are formed in an elongated element forming region 6b which is surrounded by field insulating films 6a (FIG. 2A). All of the elongated element forming regions 6b are sloped in the same direction relative to the bit line conductors BL such that the longitudinal direction thereof is not in parallel with the extending (lengthwise) direction of the bit line conductors BL. The element forming region 6b is included in the above-mentioned memory cell pair unit structure. The element forming regions 6b are sloped in order to prevent the bit line connection members BC of the memory cell pair unit structures, formed under the layer in which the bit line conductors BL exist, from being formed unnecessarily close to switching transistors of the memory cell pair unit structures formed under the adjacent bit line conductors due to mis-alignment.

Figure 2B:
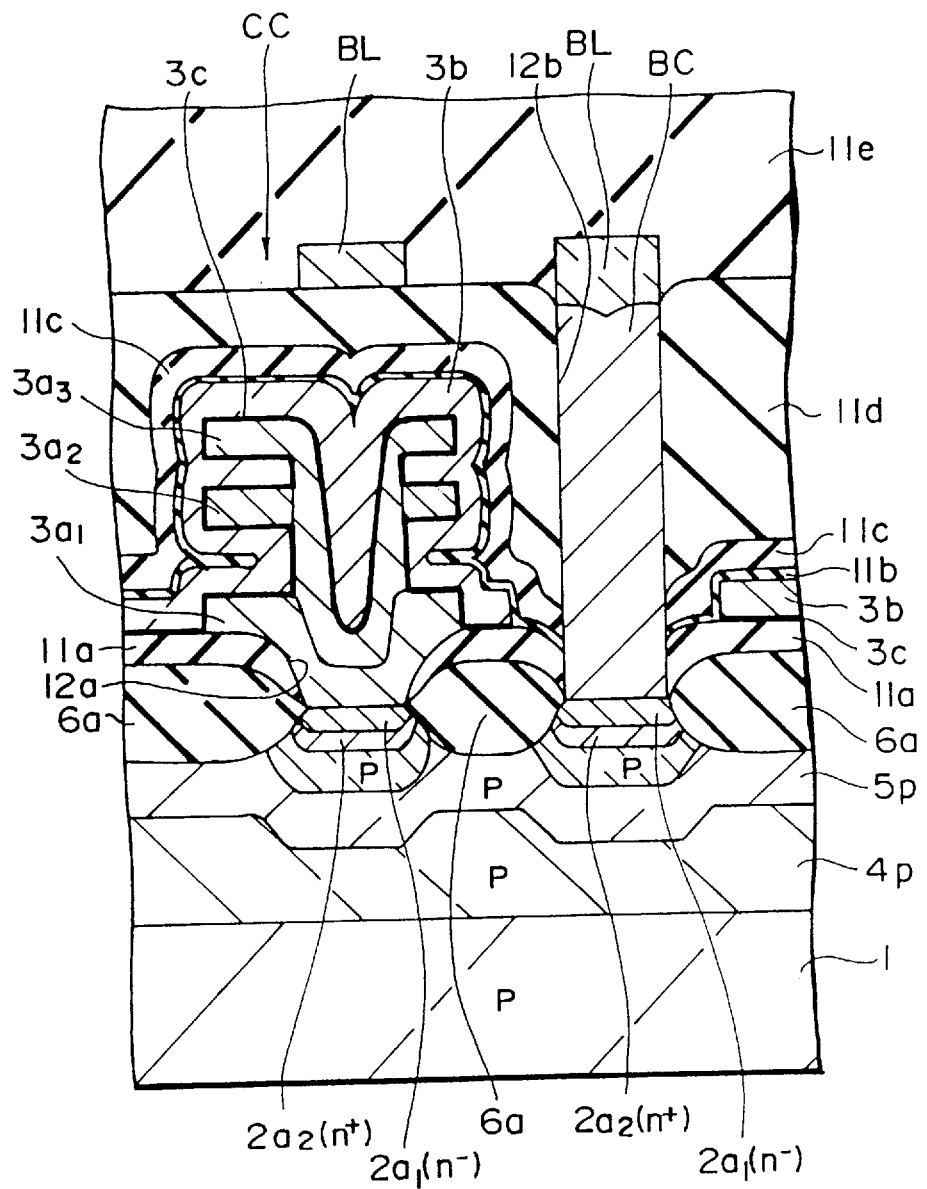

Referring next to FIG. 2B showing a cross-sectional view taken along line IIB—IIB in FIG. 1, which is similar to FIG. 2A, a variety of films and the like formed over the insulating film 11e are however omitted for simplicity sake. Considering that the mask is displaced, due to mis-alignment, from an originally defined position for forming contact holes for connecting two switching transistors constituting two memory cells in each memory cell pair unit structure to the three semiconductor regions 2a1, as will be understood also from FIG. 17, contact holes 12a each for providing a contact (capacitor connection member CC) to the semiconductor region 2a1 which is connected with the capacitor 3 are only formed through the single insulating film 11a (for example, a SiO$_2$ film having a thickness of approximately 100 nm), so that there is few possibility that the field insulating film 6 be excessively removed by more than an allowable limit.

On the other hand, the contact holes 12b, each for providing a contact to the semiconductor region 2a1 which is connected to the bit line connection member BC (n-type polysilicon film 22e in Embodiment 1) for connection with the bit line conductor BL, are formed through three layers (having a thickness of approximately 700 nm) including the etched back insulating film 11d (for example, a BPSG film having a thickness of approximately 500 nm), the insulating film 11c (for example, a SiO$_2$ film having a thickness of approximately 100 nm), and the insulating film 11a (a SiO$_2$ film having a thickness of approximately 100 nm, as mentioned above) (FIG. 35), so that it is possible that the field insulating film 6 for one of the semiconductor regions 2a1 be removed by more than an allowable limit. If the field insulating film 6 were excessively removed, the bit line connection member BC would be formed unnecessarily too close to the semiconductor region 2a1 of the transistor which is connected to the capacitor in the memory cell pair unit structure formed under a bit line conductor adjacent to the bit line connection member BC (on the right or left side on FIG. 2B). The bit line connection member BC thus formed would result in incomplete separation or isolation between the bit line connection member BC placed under a bit line conductor and the capacitor connection member CC placed under a bit line conductor adjacent to that bit line conductor, thus causing an undesired leak current to flow therebetween. As a result, defective memory cells would be manufactured.

To solve this problem, all of the elongated element forming regions 6b are sloped in the same direction relative to the bit line conductors BL so as to prevent the longitudinal direction thereof from coinciding with the extending (lengthwise) direction of the bit line conductors. In FIG. 1, the sloping direction of each element forming region 6b is defined such that a left side portion of the element forming region 6b from the bit line connection member BC, which is placed, for example, under the bit line conductor BL (though it is not necessarily placed there), is directed upwardly relative to the center line of the bit line conductor, and a right side portion of same is directed upwardly relative to the center line of the bit line conductor (the element forming region 6b as a whole is rising toward the right), when viewed in FIG. 1. By thus positioning the semiconductor regions 7p, a wider spacing can be provided between the bit line connection member BC of a memory cell pair unit structure formed under a bit line conductor and the capacitor connection member CC for a switching transistor in a memory cell pair unit structure formed under the adjacent bit line conductor, so that even if the positions of the contact holes are shifted, due to a mask displacement, from originally designed positions at which they would have been formed, the structure is free from the above-mentioned incomplete separation or isolation between the bit line connection member BC and the adjacent capacitor connection member CC, thus making it possible to effectively prevent an undesired leak current from flowing therebetween.

Further, the elongated unit structures or element forming regions 6b formed under the bit line conductors BL and sloped thereto as mentioned above are arrange in the following manner. Namely, the distance d21 between the node electrode 3a of a first one of the capacitors 3 of a sloped unit structure formed under a bit line conductor and that of a first one of the capacitors 3 of a sloped unit structure formed under a bit line conductor adjacent to the first-mentioned bit line conductor is determined or defined by delineation limits or minimal lithography sizes. And, the distance d22 between the node electrode 3a of a second one of the capacitors 3 of a sloped unit structure formed under a bit line conductor and that of a second one of the capacitors 3 of a sloped unit structure formed under a bit line conductor adjacent to the first-mentioned bit line conductor is determined or defined by delineation limits or minimal lithography sizes.

The above-described distances d1, d21 and d22 are substantially equal to each other. The term "delineation limits" or "minimal lithography sizes" is intended to indicate a limit or a size corresponding to a minimum wiring conductor width or minimum space between two wiring conductors formed in a predetermined conductor layer in a semiconductor chip.

(Embodiment 2)

FIGS. 47–56 are cross-sectional views showing main portions of a semiconductor substrate in manufacturing processes for a semiconductor integrated circuit device according to another embodiment of the present invention.

Embodiment 2 differs from Embodiment 1 in the method of forming the capacitors which constitute memory cells. This method is carried out, for example, in the following processes. It should be noted that for clarity of the drawings, the drawings used for illustrating Embodiment 2 omit the insulating film 9 formed on the side surface of the gate electrode 2g which is shown in FIG. 2.

Figure 47:
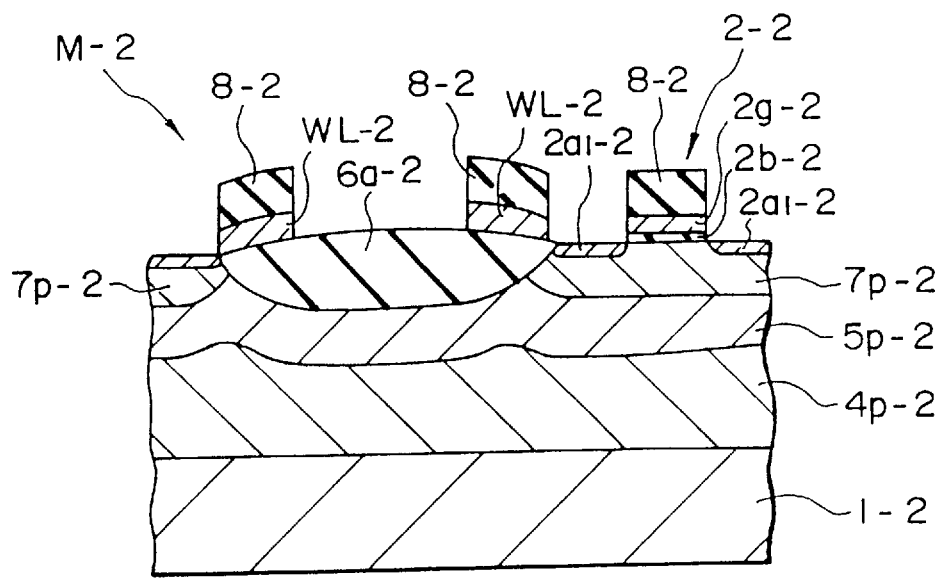
FIGS. 47–56 are cross-sectional views each showing a main portion of a semiconductor substrate including a memory cell array at a variety of stages of manufacturing a semiconductor integrated circuit device according to another embodiment of the present invention.

FIG. 47 is a cross-sectional view showing a main portion of a memory cell array M in a manufacturing process for the semiconductor integrated circuit device according to Embodiment 2, which illustrates a structure similar to that created at the manufacturing process shown in FIG. 13 of Embodiment 1. In an element forming region of a semiconductor substrate 1-2, a basic structure of nMOS 2-2 has already been formed.

Figure 48:
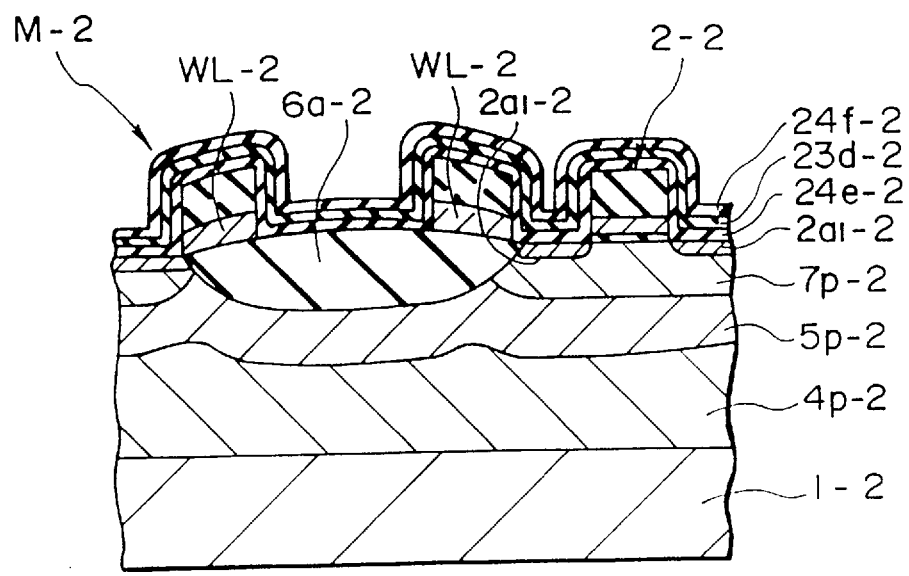

After an insulating film 24e-2 made of, for example, $SiO_2$ is first formed over the semiconductor substrate 1-2 by the CVD method or the like, as shown in FIG. 48, an insulating film (for protection) 23d-2 made of, for example, $Si_3N_4$ is deposited on the insulating film 24e-2 by the CVD method or the like. Furthermore, an insulating film (second insulating film) 24f-2 made of, for example, $SiO_2$, which has a different etching rate from the insulating film 23d-2, is deposited on the protective insulating film 23d-2 by the CVD method or the like.

Figure 49:
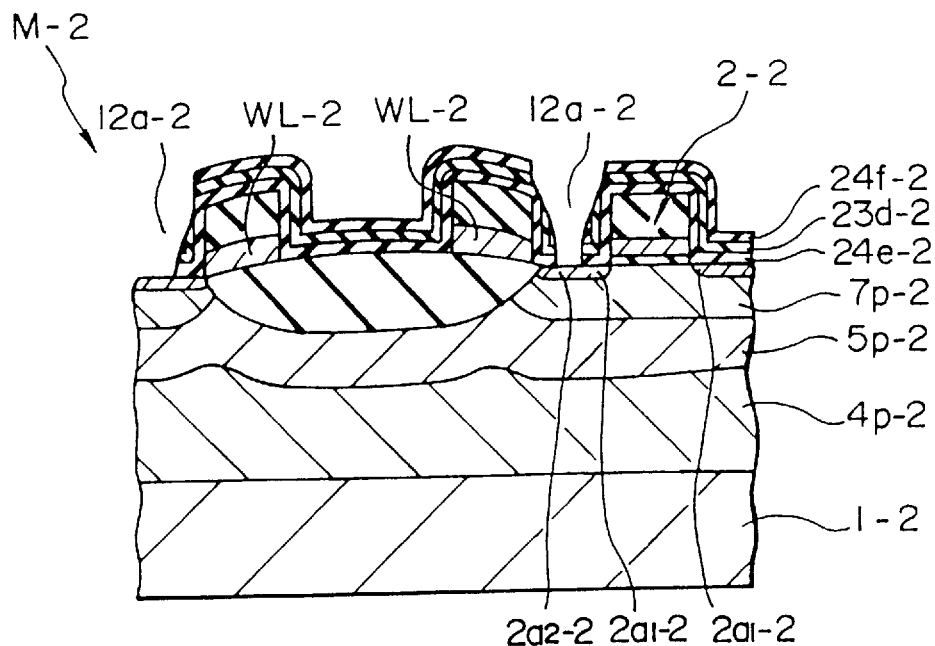

Subsequently, as shown in FIG. 49, contact holes 12-2 are formed through the insulating films 23d-2, 24e-2, 24f-2 by photolithography techniques for exposing portions of an n⁻-type semiconductor region 2a1-2 of the nMOS 2-2.

Figure 50:
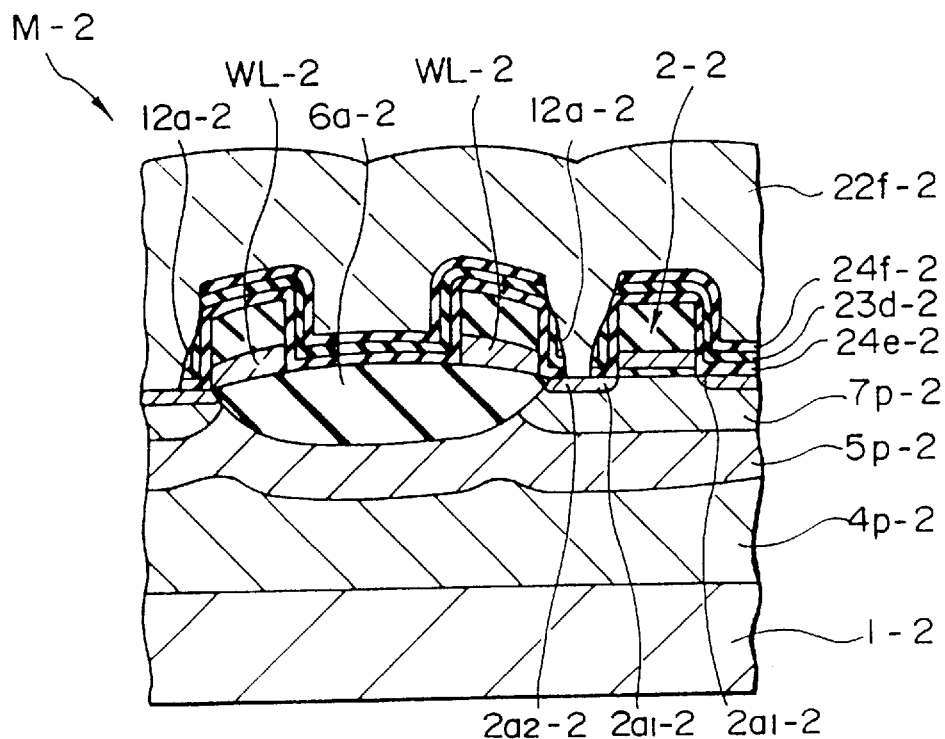

After the formation of the contact holes 12-2, a conductive film 22f-2 made of, for example, n-type low-resistance polysilicon is deposited over the semiconductor substrate 1-2 by the CVD method or the like, as shown in FIG. 50. In Embodiment 2, the conductive film 22f-2 is deposited in this process to such a degree that the top surface thereof becomes substantially planar. This conductive film 22f-2 is provided for forming a first fin for capacitors.

Next, the semiconductor substrate 1-2 with the films so far formed thereon is annealed, for example, in a $N_2$ gas atmosphere to diffuse n-type impurities in the conductive film 22f-2 toward the semiconductor substrate 1-2 in order to form an n+ semiconductor region 2a2-2.

Figure 51:
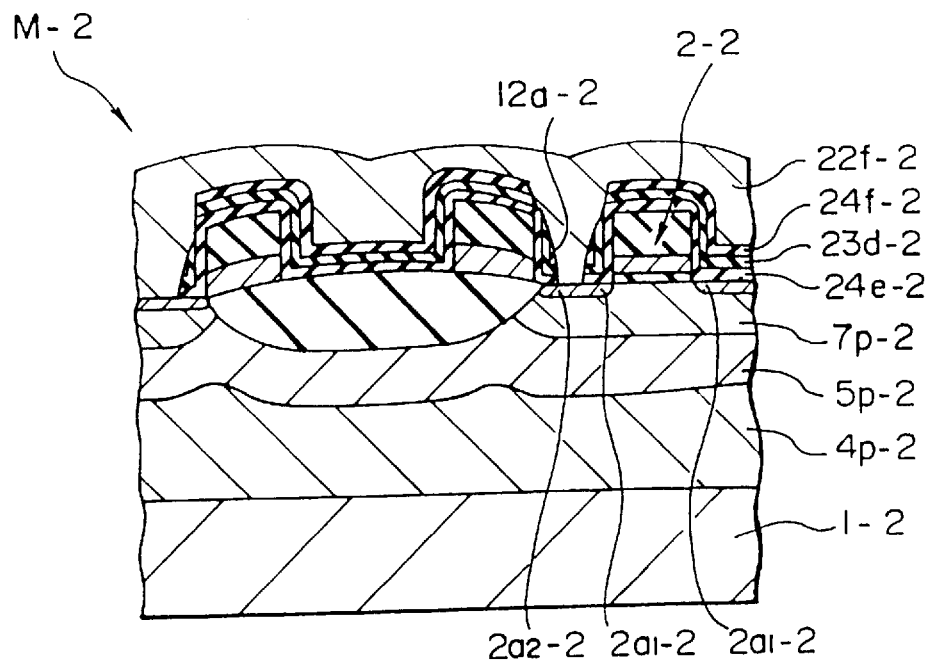

Subsequent to the annealing process, the top surface of the conductive film 22f-2 is etched back to further flatten the top surface of the conductive film 22f-2, as shown in FIG. 51.

Figure 52:
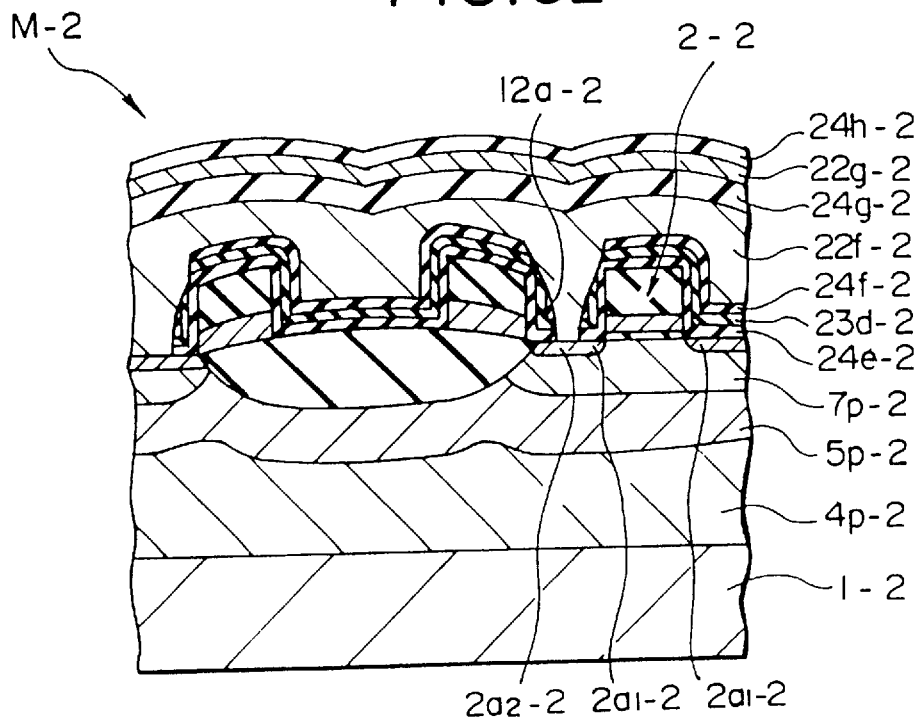

Then, as shown in FIG. 52, after an insulating film 24g-2 made of, for example, $SiO_2$ is deposited on the conductive film 22f-2 by the CVD method or the like, a conductive film 22g-2 made of, for example, n-type low-resistance polysilicon is deposited on the top surface of the insulating film 24g-2 by the CVD method or the like. Further, an insulating film 24h-2 made of, for example, $SiO_2$ is deposited on the conductive film 22g-2 by the CVD method or the like. The conductive film 22g-2 is provided for forming a second fin for the capacitors.

Figure 53:
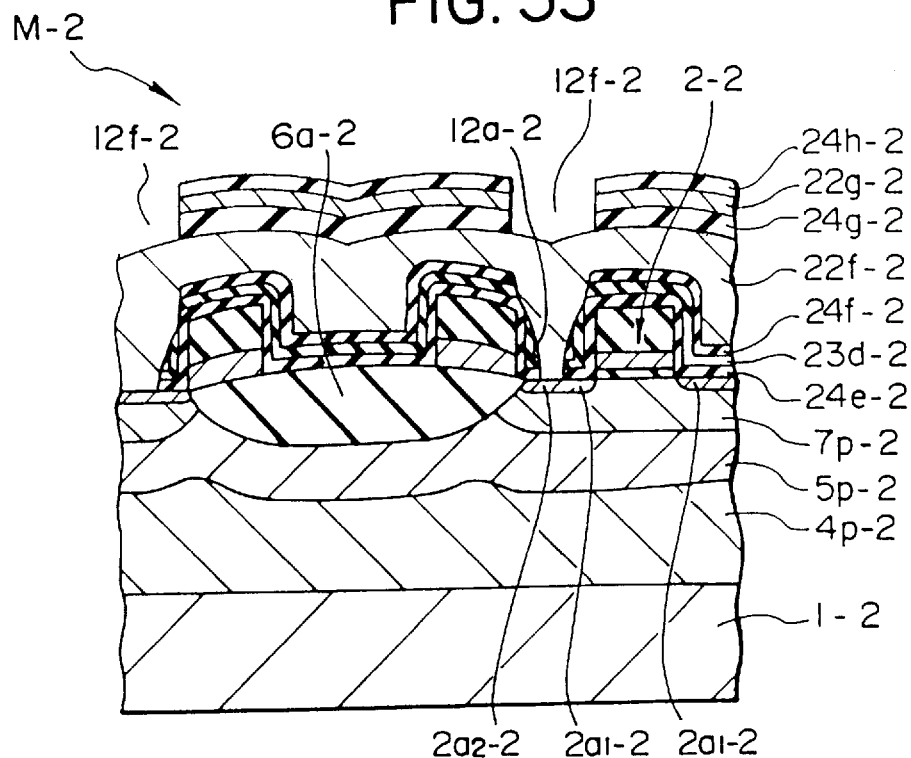
Figure 54:
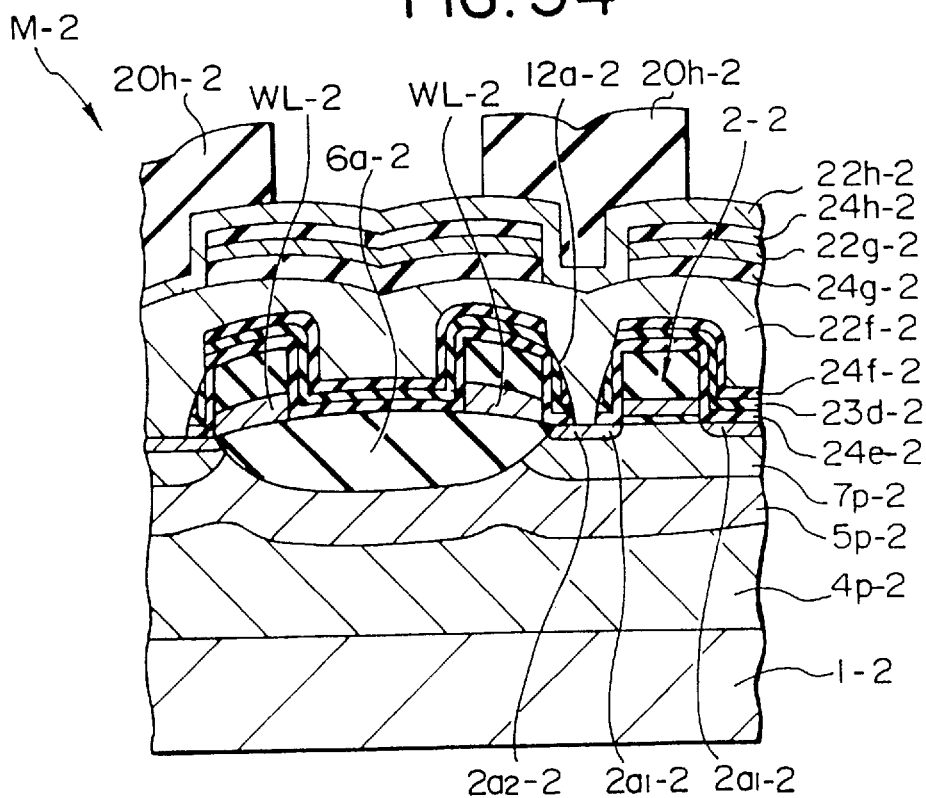

Next, as shown in FIG. 53, contact holes 12f-2, each for exposing a portion of the conductive film 22f-2, are formed through the conductive film 22g-2 and the insulating films 24g-2, 24h-2 by the photolithography techniques. Then, as shown in FIG. 54, a conductive film 22h-2 made of, for example, n-type low-resistance polysilicon is deposited over the semiconductor substrate 1-2 by the CVD method or the like. This conductive film 22h-2 is provided for forming a third fin for the capacitors.

Briefly, in Embodiment 2, the top surface of the conductive film 22f-2 for forming the first fin for the capacitors is flattened, and on the flattened top surface, the conductive films 22g-2, 22h-2 are deposited for forming the second and third fins for the capacitors.

By thus forming the structure for the capacitors, the processing for flattening can be easily realized without excessively increasing the number of processes, as compared with the processing of flattening the underlying insulating film prior to the formation of the conductive films 22g-2, 22h-2 for providing the second and third fins of the capacitors.

It is therefore possible to produce effects with respect to the reliability of the capacitors, similar to those of Embodiment 1, in an easier manner and without excessively increasing the number of manufacturing processes.

Figure 55:
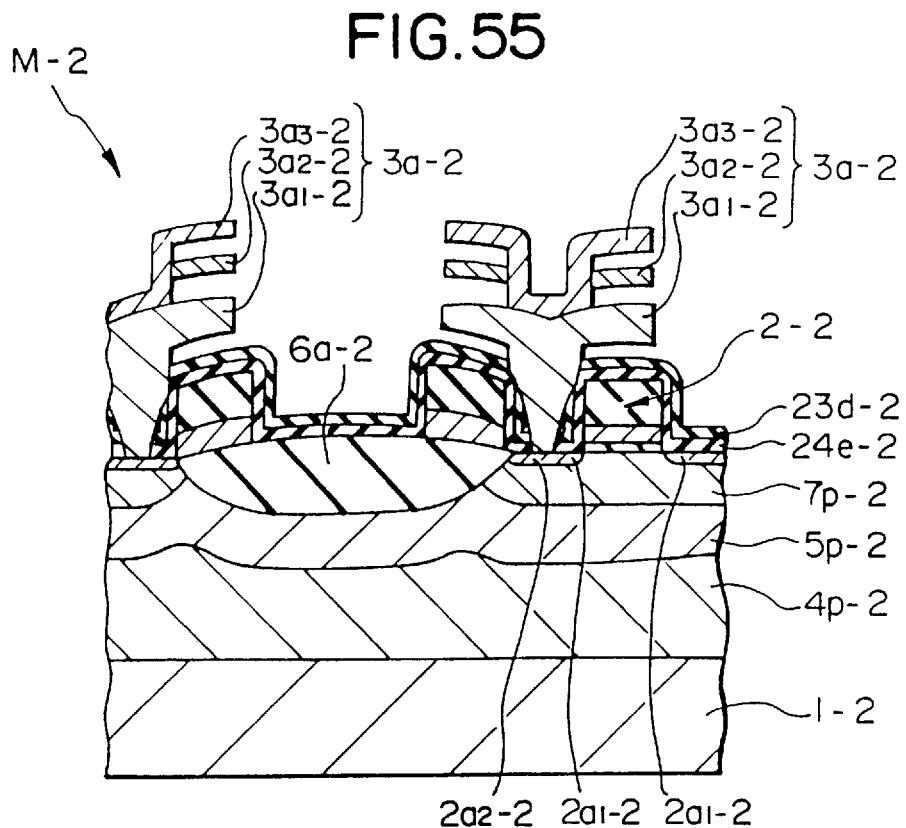

Subsequent to the deposition of the conductive films 22g-2, 22h-2, a resist pattern 20h-2 for forming capacitors is formed on the conductive film 22h-2 by the photolithography techniques. Then, with this resist pattern 20h-2 used as an etching mask, the conductive films 22f-2–22h-2 and the insulating films 24f-2–24h-2 are patterned to form capacitor electrodes 3a-2 as well as to expose the surface of the capacitors, as shown in FIG. 55.

It should be noted that in Embodiment 2 the insulating film 23d-2 serves as a protection film having a function of an etching stopper in the patterning process. With this protection film, the insulating film 24f-2 which underlies the first fin 3a1-2, can also be removed when patterning is performed for forming the fins 3a1-2–3a3-2, so that the lower surface of the first fin 3a1-2 can also be used as a storage portion of the capacitor, whereby the capacitance of the capacitor can be increased in comparison with the aforementioned Embodiment 1.

Figure 56:
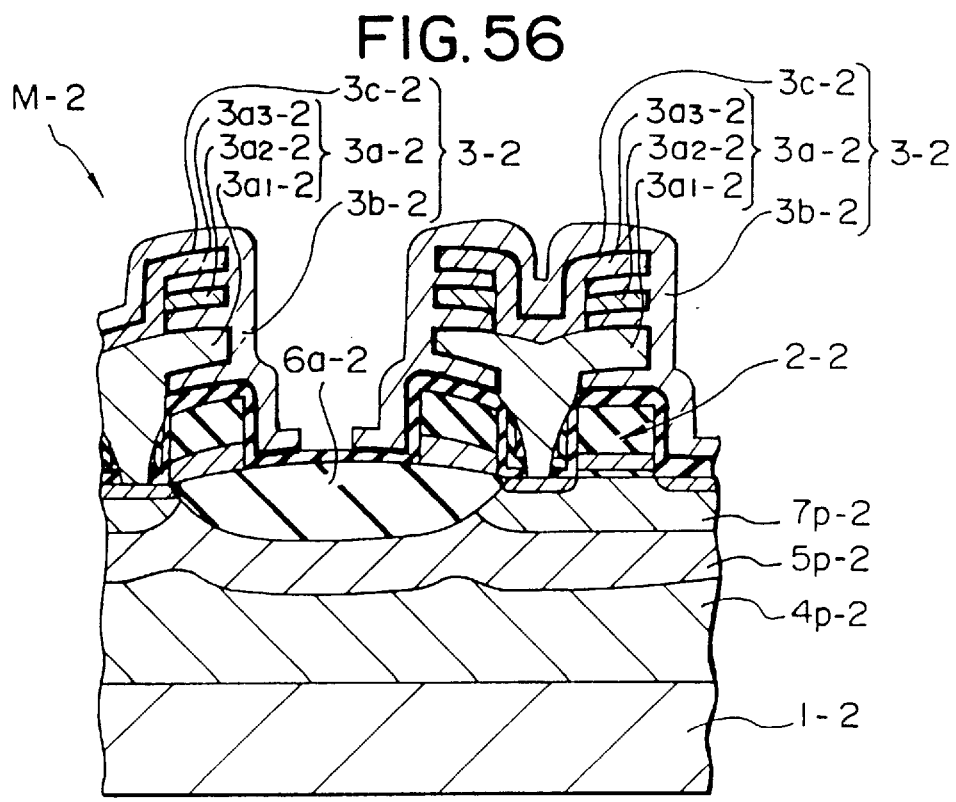

Then, after removing the insulating film 23d-2, for example, by hot phosphoric acid processing or the like, a capacitor electrode 3b-2 and a capacitor insulating film 3c-2 are formed, as shown in FIG. 56, to complete capacitors 3-2, in a manner similar to Embodiment 1.

According to Embodiment 2 as described above, the following effects can be produced in addition to the effects produced by Embodiment 1.

(1) In forming the capacitors 3-2 each having the three fins 3a1–3a3, after the top surface of the conductive film 22f-2 for forming the first fin 3a1-2 is flattened, the conductive films 22g-2, 22h-2 for forming the second and third fins 3a2-1, 3a3-2 are formed on the flattened top surface of the conductive film 22f-2, whereby good capacitors 3-2 can be formed more easily than the way the capacitors of Embodiment 1 are created, without extremely increasing the number of manufacturing processes.

(2) The insulating film 23d-2 for protection has previously been formed under the conductive film 22f-2 for forming the first fin 3a1-2 so as to sandwich the predetermined insulating film 24f-2 therebetween, such that the insulating film 23d-2 is utilized as an etching stopper layer to remove the insulating film 24f-2. In this way, the lower surface of the fin 3a1-2 can also be used as a storage portion of the capacitor, so that the total capacitance of the capacitor 3-2 can be made larger than the capacitor 3 of Embodiment 1.

(Embodiment 3)

FIGS. 57–65 are cross-sectional views each showing a main portion of a semiconductor substrate in a manufacturing process for a semiconductor integrated circuit device according to a further embodiment of the present invention.

Briefly, Embodiment 3 differs from Embodiments 1, 2 in the method of forming capacitors which constitute memory cells. The method includes, for example, the following processes. It should be noted that, for clarity of the drawings, the drawings used for illustrating Embodiment 3 also omit the insulating film 9 formed on the side surface of the gate electrode 2g, which is shown in FIG. 2.

Figure 57:
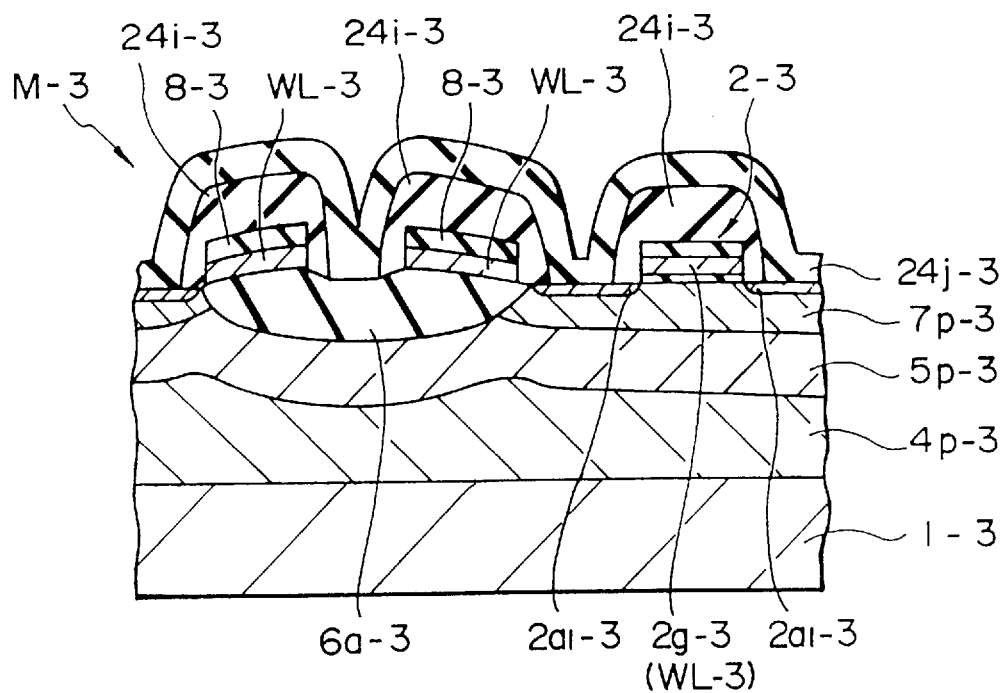
FIGS. 57–65 are cross-sectional views each showing a main portion of a semiconductor substrate including a memory cell array at a variety of stages of manufacturing a semiconductor integrated circuit device according to a further embodiment of the present invention.
Figure 58:
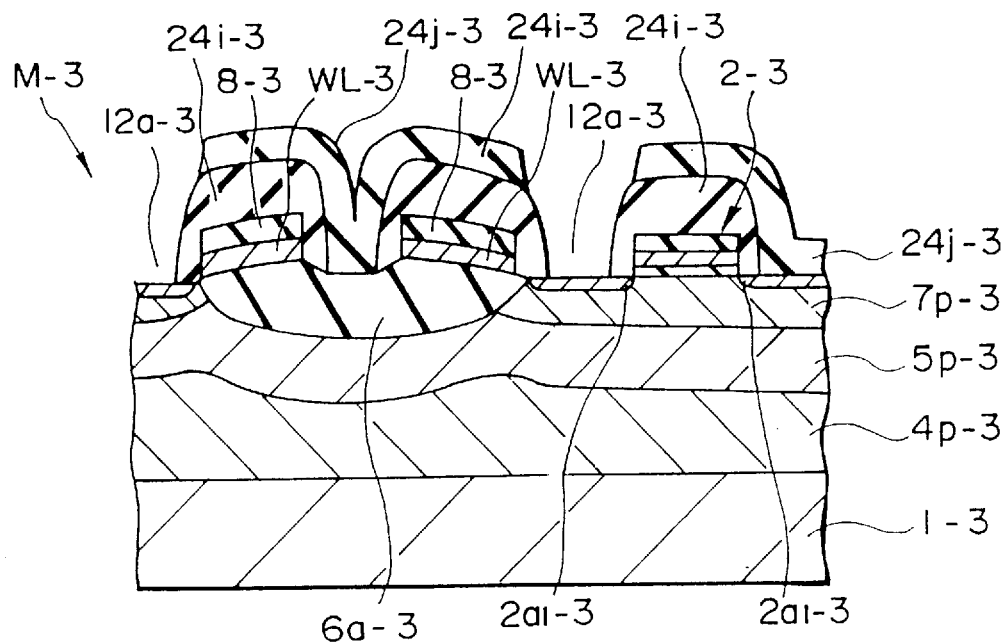

FIG. 57 is a cross-sectional view showing a main portion of a memory cell array M-3 in a manufacturing process for the semiconductor integrated circuit device according to Embodiment 3, which illustrates a structure similar to that created in the manufacturing process shown in FIG. 15 of Embodiment 1. A basic structure of nMOS 2-3 has already been formed in an element forming region of a semiconductor substrate 1-3. An insulating film 24i-3 made of, for example, $SiO_2$ corresponds to the insulating film 11a in FIG. 15. As shown in FIG. 57, after an insulating film 24j-3 made of, for example, $SiO_2$ is deposited by the CVD method or the like, contact holes 12a-3 each for exposing a portion of an n⁻-type semiconductor region 2a1-3 of the nMOS 2-3 are formed through the insulating films 24i-3, 24j-3 by the photolithography techniques, as shown in FIG. 58.

Figure 59:
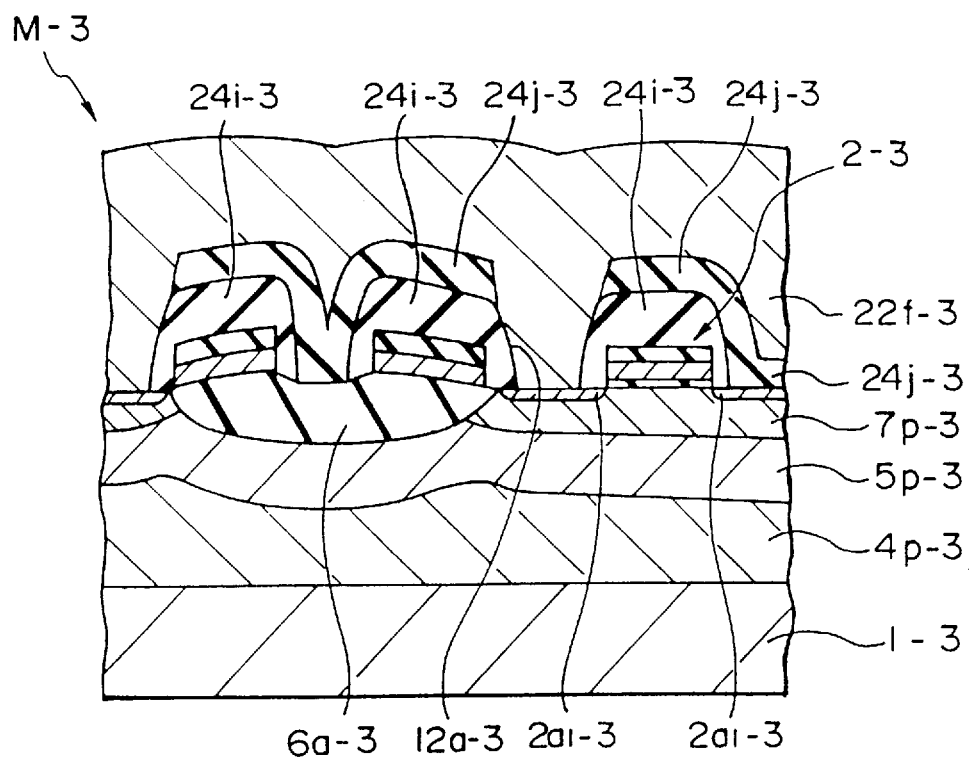

Subsequent to the formation of the contact holes 12a-3, a conductive film 22f-3 made of, for example, n-type low-resistance polysilicon is deposited over the semiconductor substrate 1-3 by the CVD method or the like, as shown in FIG. 59. Also in Embodiment 3, the conductive film 22f-3 is deposited in this process to such a degree that the top surface thereof becomes substantially planar. This conductive film 22f is provided for forming a first fin for capacitors.

Figure 60:
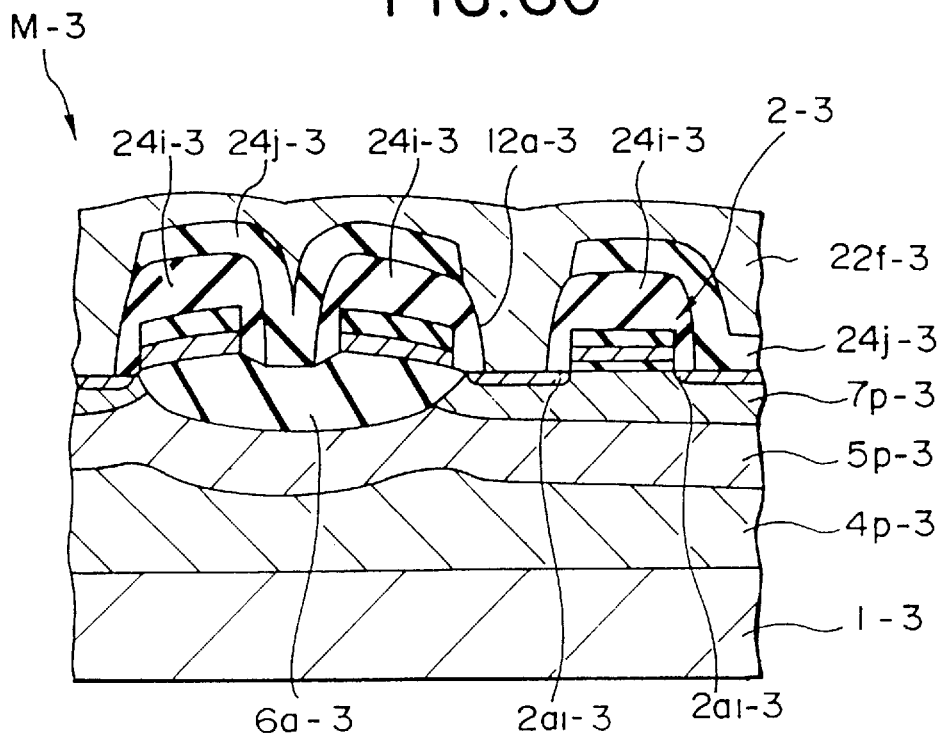

Thereafter, the top surface of the conductive film 22f-3 is etched back to further flatten the top surface of the conductive film 22f-3, as shown in FIG. 60.

Figure 61:
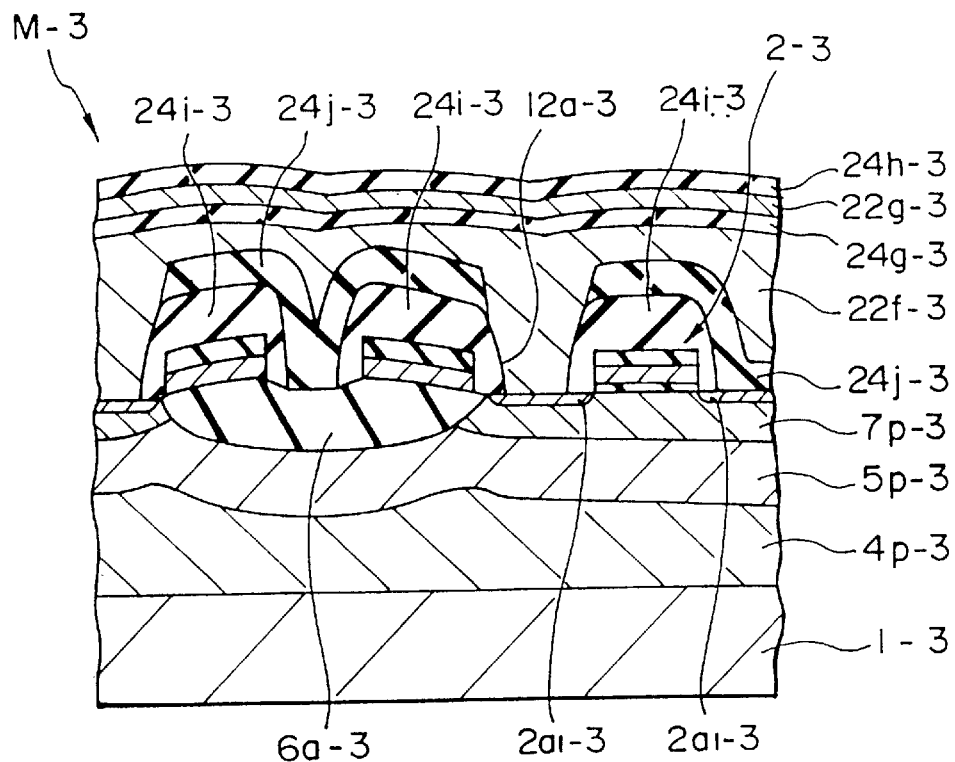

Next, as shown in FIG. 61, after an insulating film 24g-3 made of, for example, $SiO_2$ is deposited on the conductive film 22f-3 by the CVD method or the like, a conductive film 22g-3 made of, for example, n-type low-resistance polysilicon is deposed on the top surface of the insulating film 24g-3 by the CVD method or the like, followed by further depositing an insulating film 24h-3 made of, for example, $SiO_2$ by the CVD method or the like. The conductive film 22g-3 is provided for forming the second fin for the capacitors.

Figure 62:
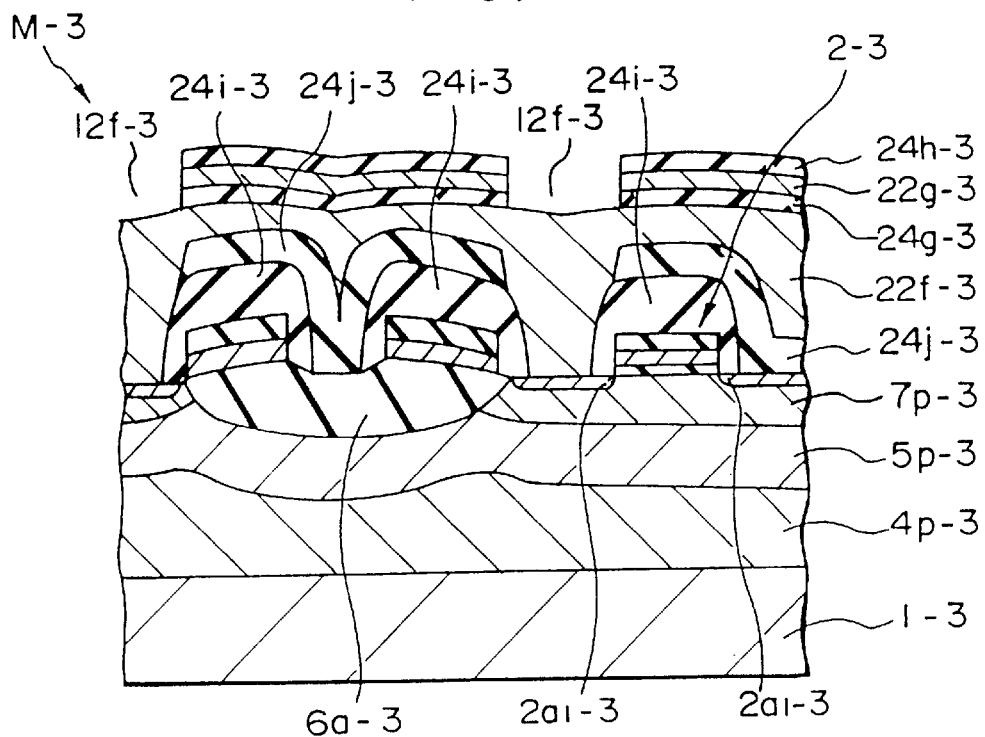
Figure 63:
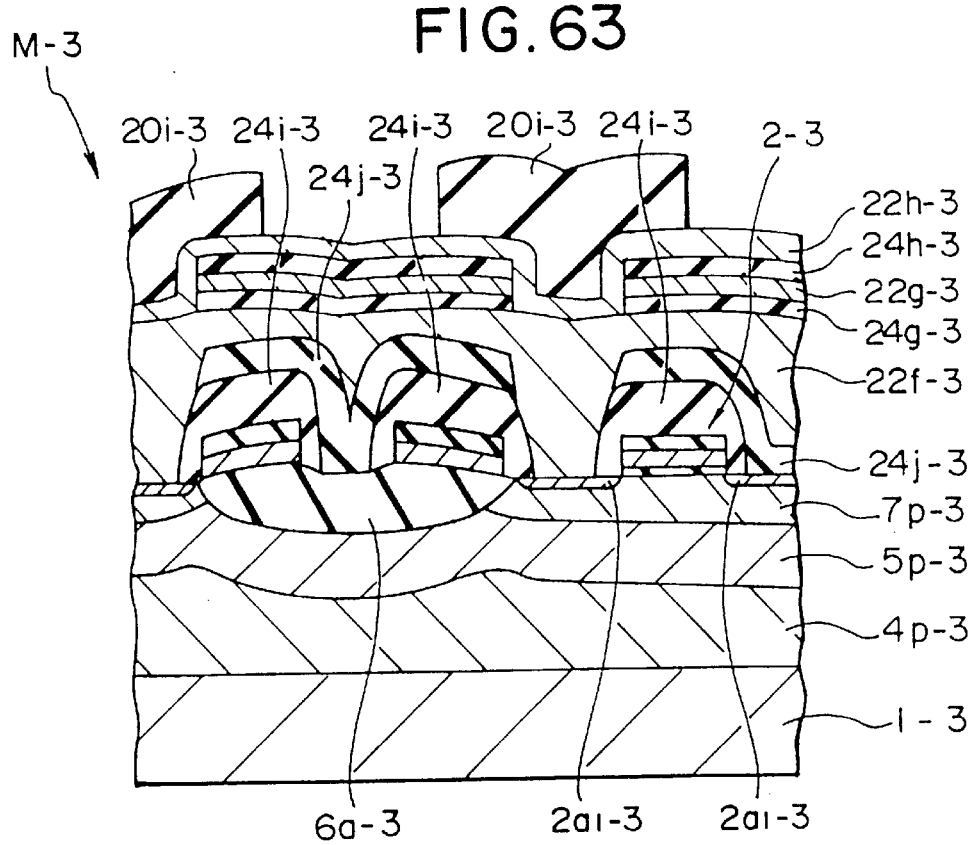

Next, as shown in FIG. 62, contact holes 12f-3, each for exposing a portion of the conductive film 22f-3, are formed through the conductive film 22g-3 and the insulating films 24g-3, 24h-3 by the photolithography techniques. Then, as shown in FIG. 63, a conductive film 22h-3 made of, for example n-type low-resistance polysilicon is deposited over the semiconductor integrated circuit 1-3 by the CVD method or the like. This conductive film 22h-3 is provided for forming the third fin for the capacitors.

Briefly, in Embodiment 3, the top surface of the conductive film 22f-3 for forming the first fin for the respective capacitors is flattened, and the conductor films 22g-3, 22h-3 for forming the second and third fins for the respective capacitors are deposited on the flattened top surface. In this way, Embodiment 3 can more easily produce similar effects to those of the aforementioned Embodiment 1 without excessively increasing the number of manufacturing processes, like the Embodiment 2.

Subsequent to the deposition of the conductive films 22g-3, 22h-3 for the second and third fins, a resist pattern 20i-3 is formed on the conductive film 22h-3 for forming the capacitors by the photolithography techniques, and is used as an etching mask to pattern the conductive films 22g-3, 22h-3 and the insulating films 24g-3, 24h-3. In this process, the conductive film 22f-3 for forming the first fin is used as a protection film which functions as a stopper for the etching.

Figure 64:
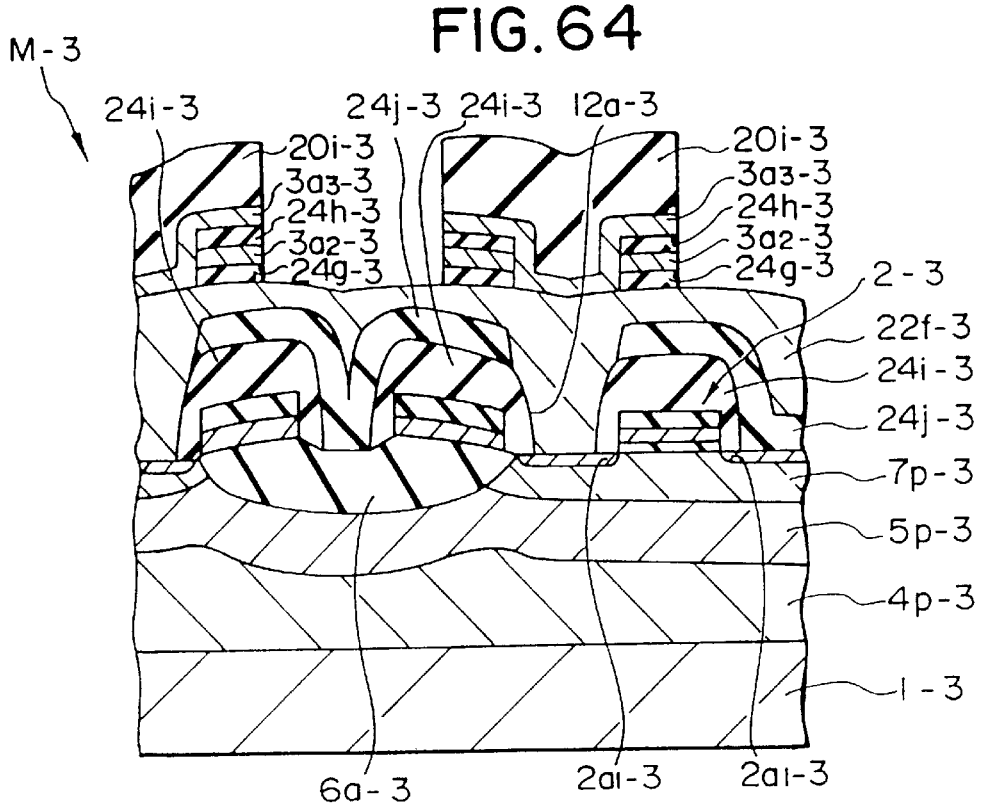
Figure 65:
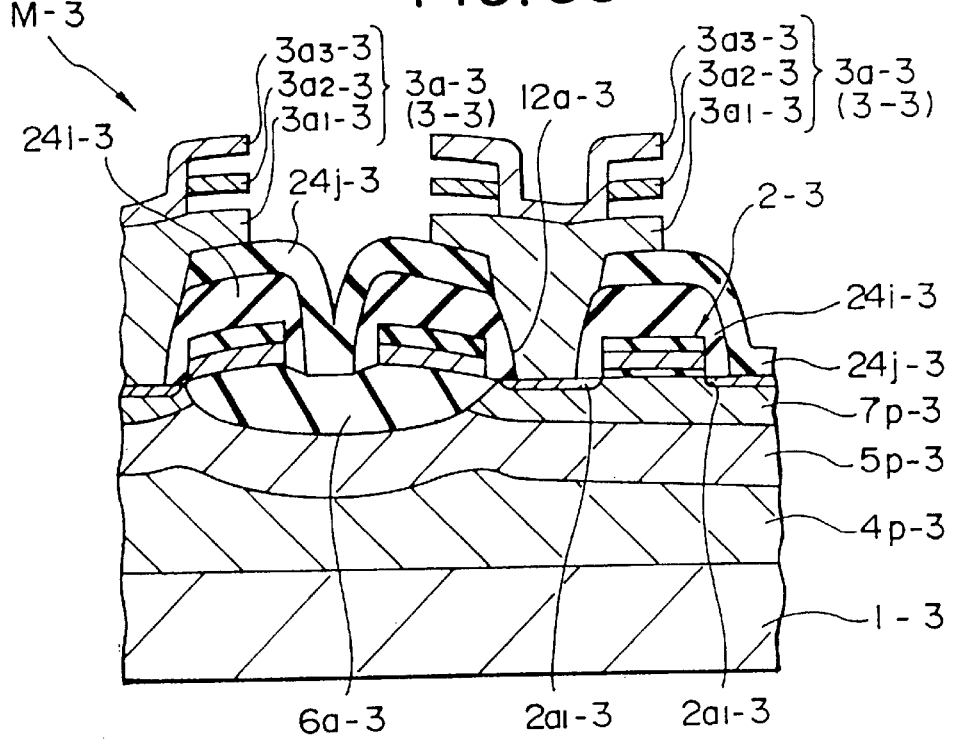

In this way, the second and third fins 3a2-1, 3a3-3 for the capacitors 3-3 are patterned as shown in FIG. 64. Subsequently, the insulating film 24h-3 sandwiched between the second and third fins 3a2-3, 3a3-3 and the insulating film 24g-3 sandwiched between the fin 3a2-3 and the conductive film 22f-3 are removed. Then, exposed portions of the conductive film 22f-3 are etched away to complete the capacitor electrodes 3a for the respective capacitors 3-3, as shown in FIG. 65.

According to Embodiment 3 as described above, since the insulating film 23d-2 for protection is not formed, the structure of Embodiment 3 has an effect of simplifying the formation processes therefor, in addition to the aforementioned effect (1) produced by Embodiment 2.

(Embodiment 4)

FIGS. 66–71 are cross-sectional views each showing a main portion of a semiconductor substrate in a manufacturing process for a semiconductor integrated circuit device according to a further embodiment of the present invention.

In summary, Embodiment 4 differs from the aforementioned Embodiment 1 in the method of forming the bit line conductors. The method is carried out, for example, by the following processes.

Figure 66:
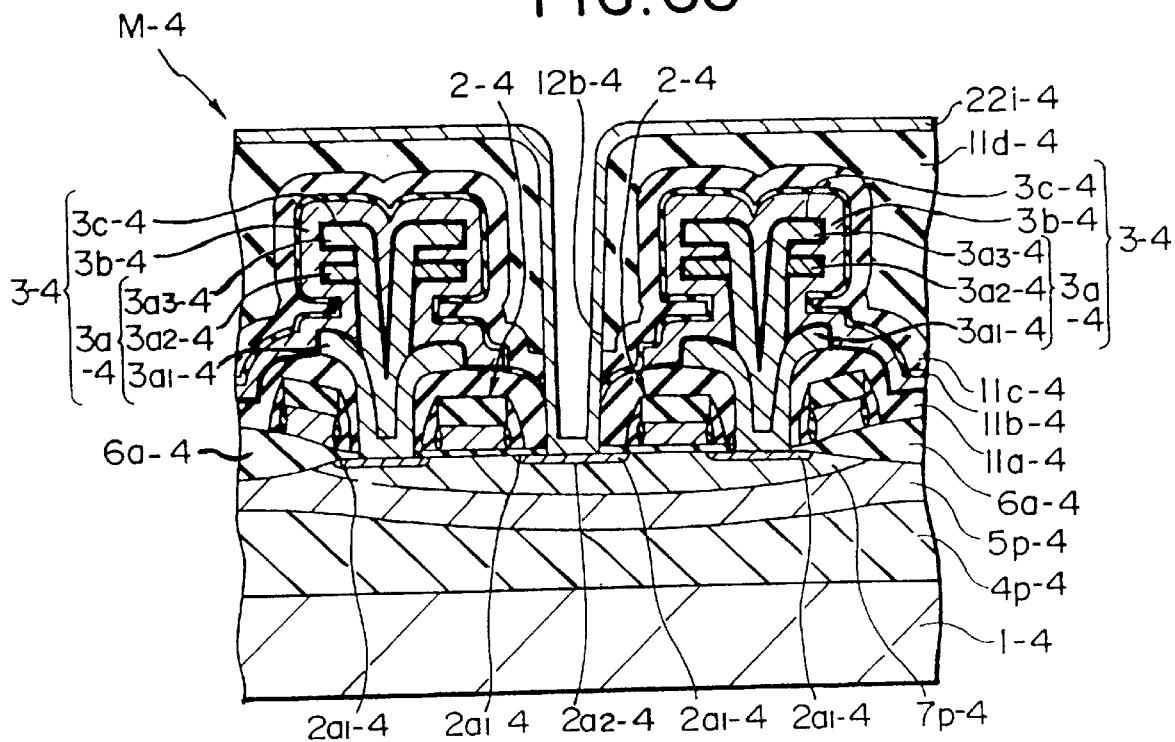
FIGS. 66–71 are cross-sectional views each showing a main portion of a semiconductor substrate including a memory cell array and cross-sectional views each showing a main portion of the semiconductor substrate including a peripheral circuit at a variety of stages of manufacturing a semiconductor integrated circuit device according to a further embodiment of the present invention.
Figure 67:
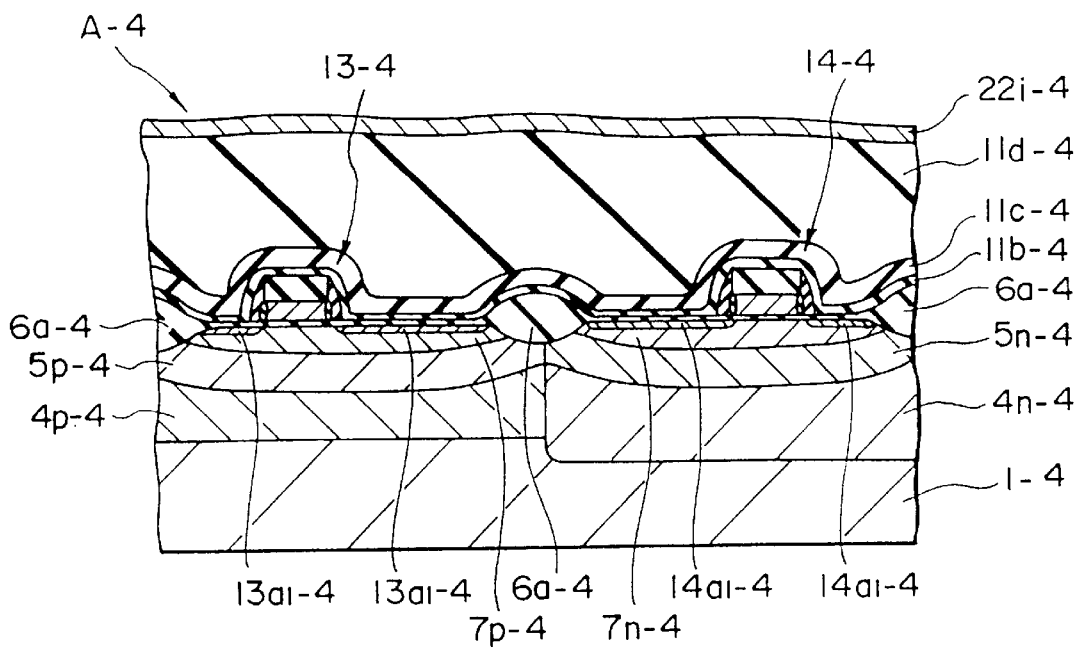

FIGS. 66 and 67 are cross-sectional views respectively showing a main portion of a memory cell array M-4 and a peripheral circuit region A-4 in a manufacturing process for the semiconductor integrated circuit device according to Embodiment 4. The drawings illustrate the structures similar to those created at the manufacturing process shown in FIGS. 35 and 36, wherein the insulating film 11a in FIGS. 35 and 36 is depicted as a flattened insulating film 11a-4 in FIGS. 66 and 67.

In the memory cell array M-4, the insulating film 11d-3 already has a contact hole 12b-3 formed therethrough so as to expose an n⁻-type semiconductor region 2a1-4 of an nMOS 2-4.

First, a conductive film 22i-4 made of, for example, n-type low-resistance polysilicon is deposited over the semiconductor substrate 1-4 as illustrated by the CVD method or the like.

The semiconductor substrate 1-4 is annealed, for example, in a N$_2$ gas atmosphere, so that the n-type impurity in the conductive film 22*i*-4 is diffused into the substrate 1-4 to form an n$^+$-type semiconductor region 2*a*2-4.

Figure 68:
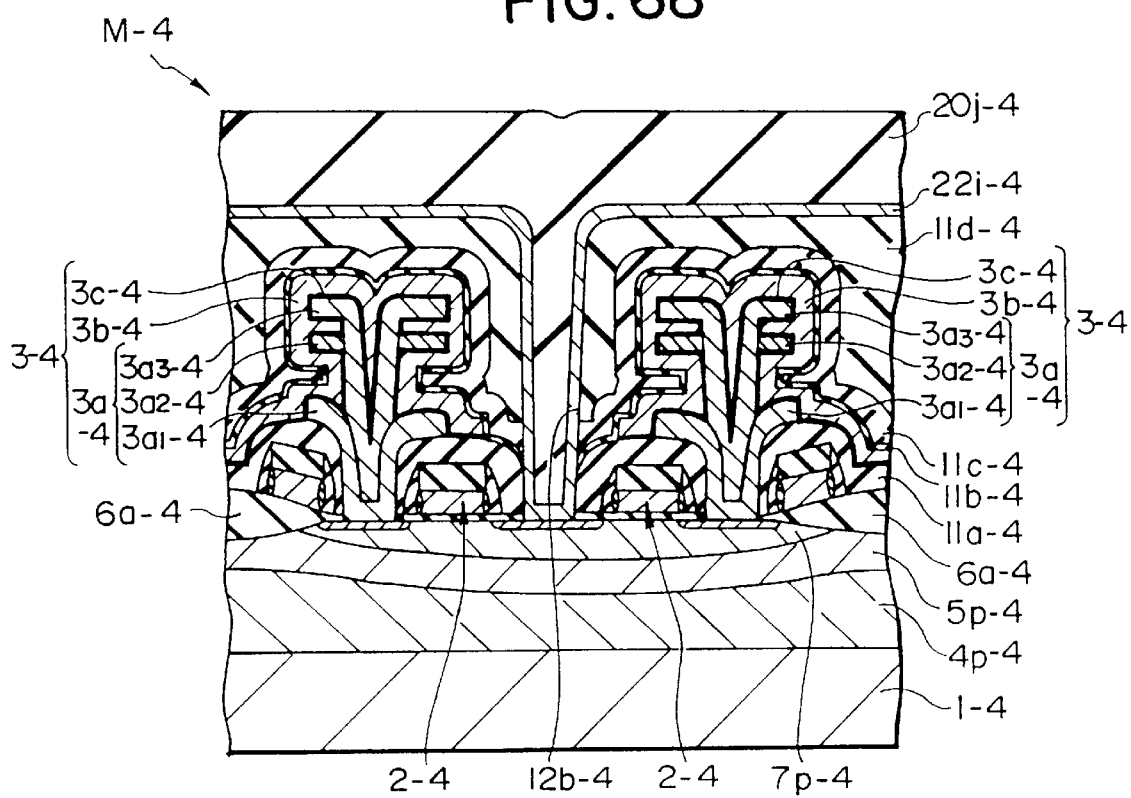
Figure 69:
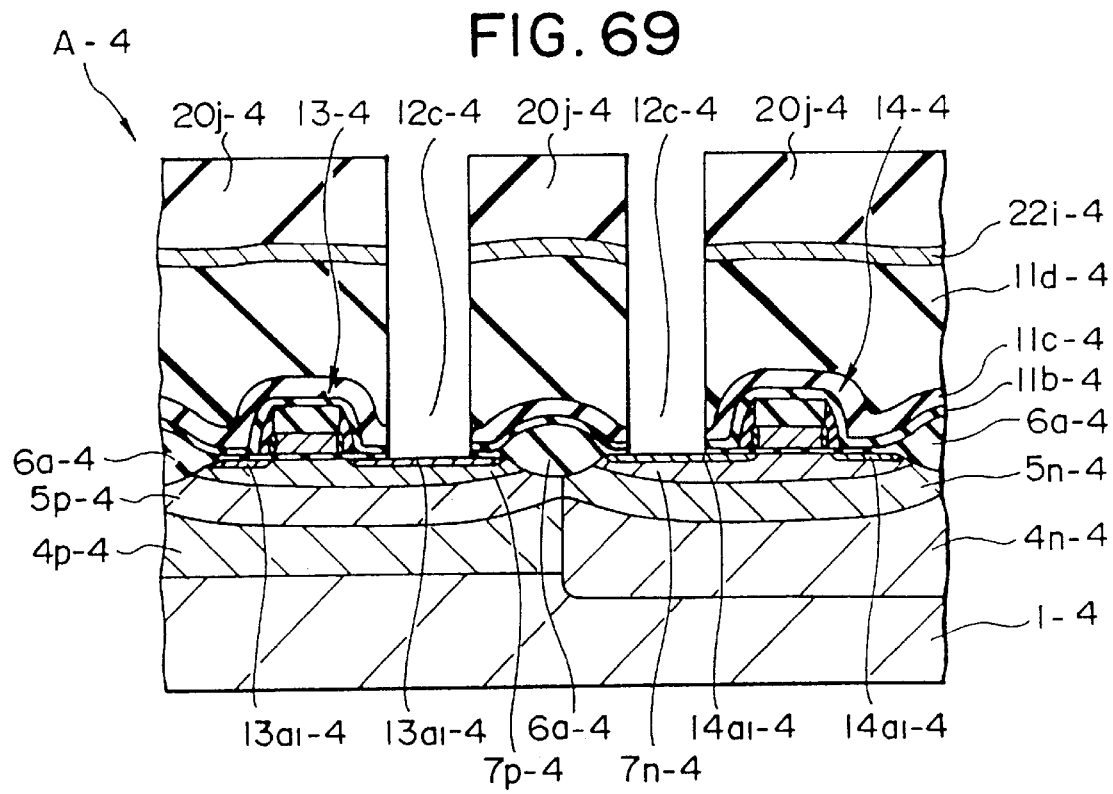

Subsequently, as shown in FIGS. 68 and 69, a resist pattern 20*j*-4 is formed by the photolithography techniques so as to expose an upper portion of respective one semiconductor region 13*a*1-4, 14*a*1-4 of nMOS 13-4 and pMOS 14-4 in the peripheral circuit region A-4.

Then, contact holes 12*c*-4, each for exposing a portion of the semiconductor regions 13*a*1-4, 14*a*1-4 of the nMOS 13-4 and pMOS 14-4 in the peripheral circuit region 4-A, are formed through the insulating film 11*d*-4, with the resist pattern 20*j*-4 used as an etching mask.

Figure 70:
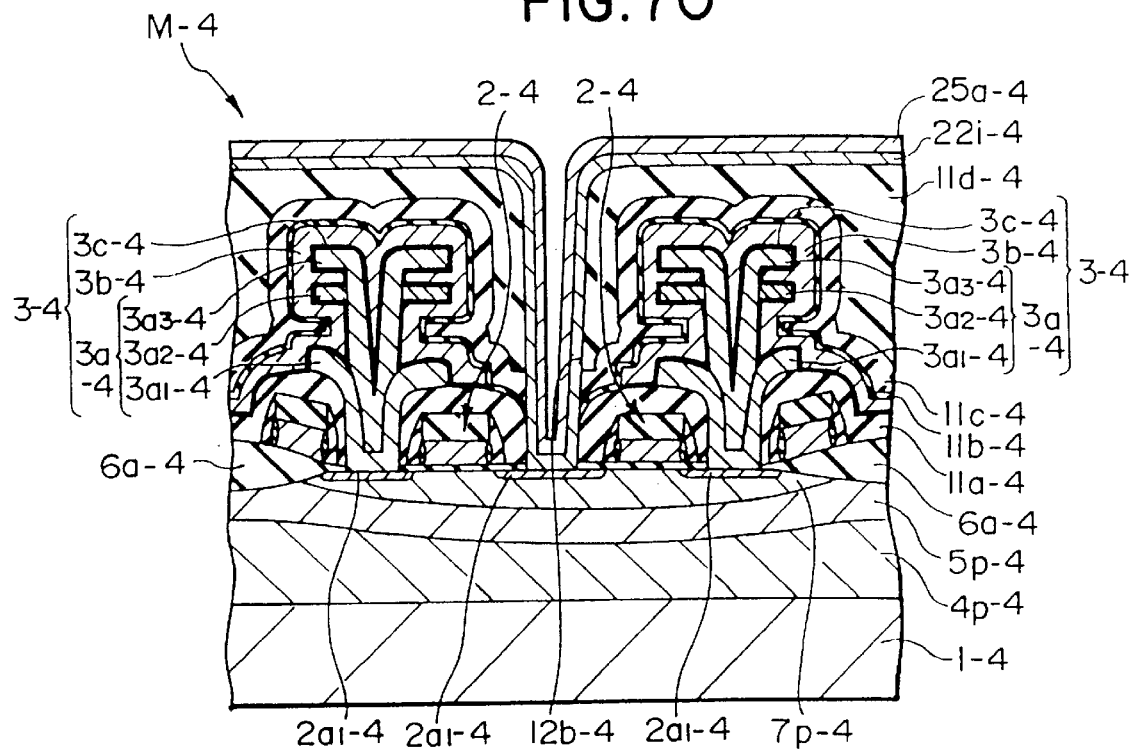
Figure 71:
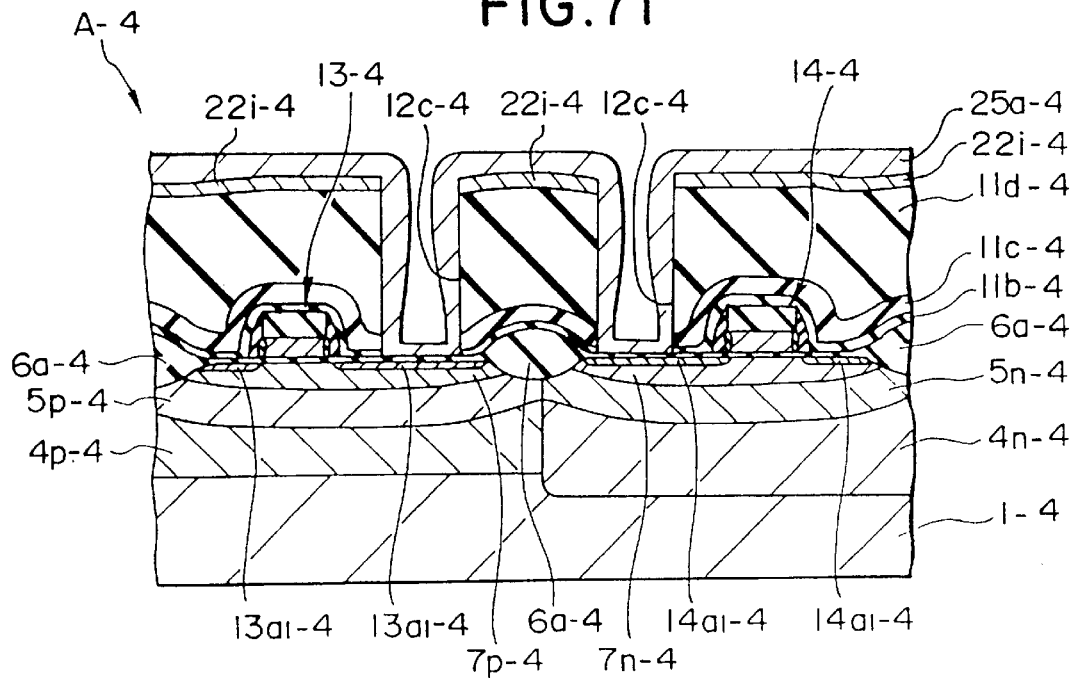

Next, as shown in FIGS. 70 and 71, after depositing a metal film 25*a*-4 made of, for example, tungsten in a manner similar to the aforementioned Embodiment 1, the metal film 25*a*-4 is patterned also in a manner similar to Embodiment 1 to form bit line conductors BL for memory circuits and first level wiring conductors 15*a*-4 (see FIG. 2) for peripheral circuits, as has been described in connection with Embodiment 1.

It will therefore be understood that Embodiment 4 can also produce effects similar to those listed in (3)–(5) of Embodiment 1.

While the invention made by the present inventors has been specifically described on the basis of preferred embodiments thereof, it goes without saying that the present invention is not limited to the above described Embodiments 1–4 but may be modified in various ways without departing from the gist thereof.

Figure 72:
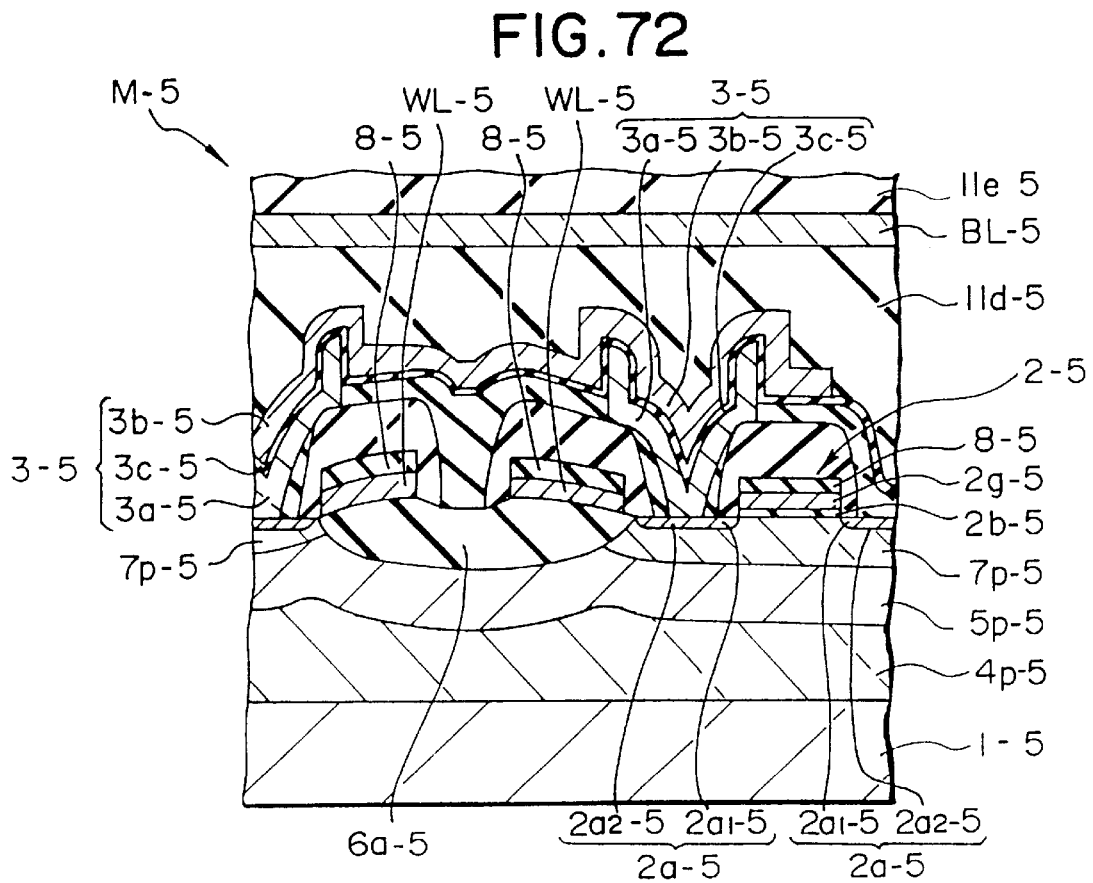
FIG. 72 is a cross-sectional view showing a main portion of a semiconductor integrated circuit device including a memory cell array according to a further embodiment of the present invention.

For example, while Embodiments 1–4 have been described for the case where the capacitors constituting memory cells each has a fin structure, the present invention is not limited to this particular structure but may be variously modified. For example, as shown in FIG. 72, capacitors 3-5 that have a crown structure may be employed.

The capacitors 3-5 are each constituted of a capacitor electrode 3*a*-5 formed, for example, in a cylindrical shape, a capacitor insulating film 3*c*-5 covering same, and a capacitor electrode 3*b*-5 further covering the insulating film 3*c*-5. The capacitor electrode 3*a*-5 is electrically connected with an n$^-$-type semiconductor region 2*a*1-5 of an nMOS 2-5. The capacitor electrode 3*b*-5 is electrically connected with a powering conductor 18-5 (see FIG. 4) and set at a predetermined potential. The capacitor electrodes 3*a*-5, 2*b*-5 are both made of, for example, n-type low-resistance polysilicon, while the capacitor insulating film 3*c*-5 is made of a lamination film consisting of, for example, a Si$_3$N$_4$ layer and a SiO$_2$ layer. Alternatively, n-type low-resistance polysilicon may be utilized only for the capacitor electrode 3*a*-5; tungsten or TiN for the capacitor electrode 3*b*-5; and tantalum oxide (Ta$_2$O$_5$) for the capacitor insulating film 3*c*-5, by way of example.

Figure 73:
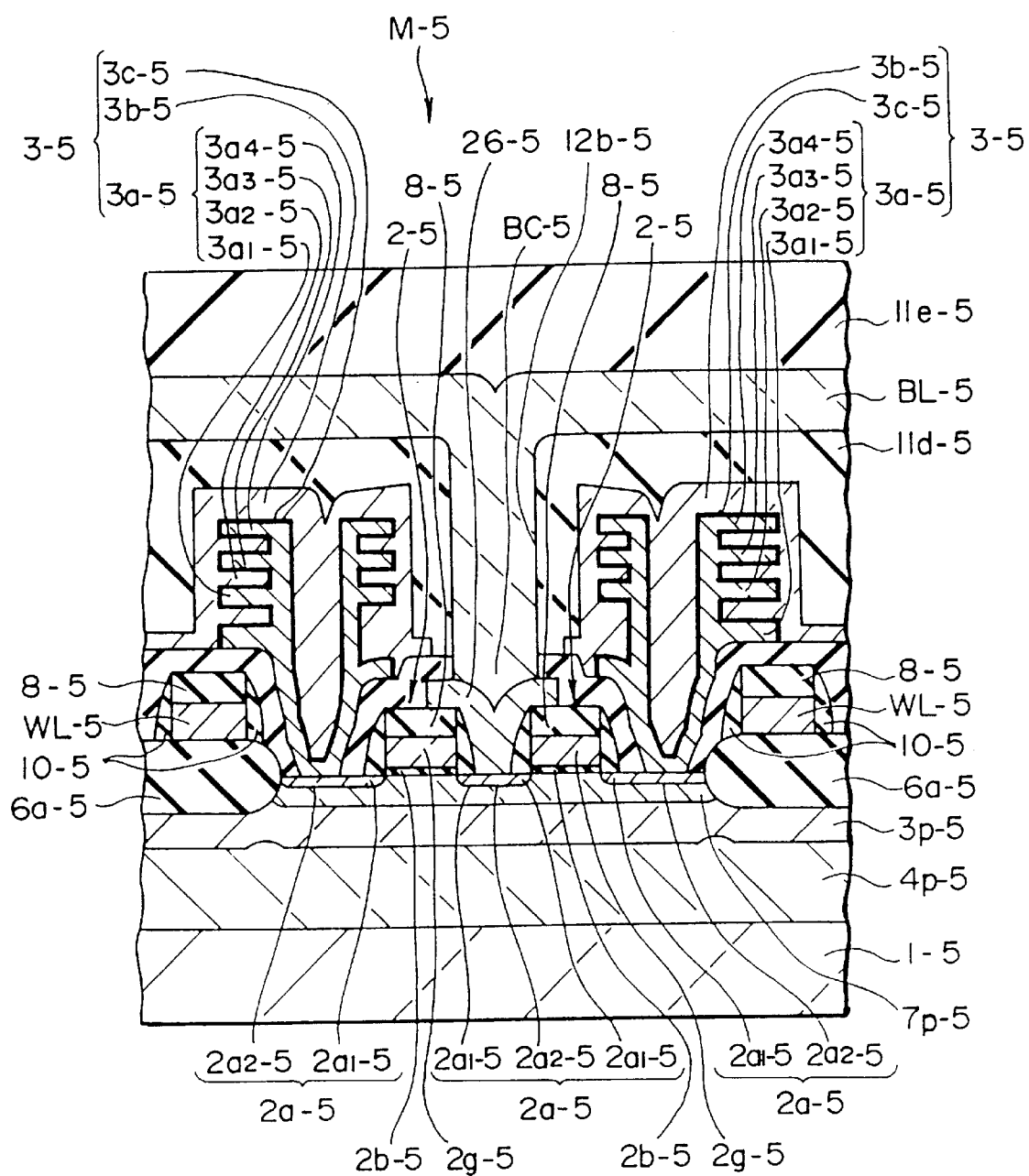
FIG. 73 is a cross-sectional view showing a main portion of a semiconductor integrated circuit device including a memory cell array according to a further embodiment of the present invention.

Also, while the Embodiments 1–3 have been described for the case where the bit line connection member BC is filled with low-resistance polysilicon, the present invention is not limited to this particular structure. Alternatively, as shown in FIG. 73, a pad film 26 made of, for example, n-type low-resistance polysilicon may be formed on the bottom of the bit line connection member BC. In this case, the bit line conductors BL-5 may be made of, for example, tungsten or Al-Si-Cu alloy. The capacitor electrode 3*a*-5 may have, for example, four fins 3*a*1-5–3*a*4-5.

In this case, by forming the pad film 26 in a self-alignment manner, the spacing between nMOS's 2 on both sides of the bit line connection member BC can be narrowed. In addition, since the top surface of the pad film 26, if made somewhat wider, can attend to shifted contact holes 12*b* or the like, the reliability with respect to the bit line conductors BL-5 can be ensured even if the spacing between the nMOS's 2 is narrowed. Furthermore, since impurities can be diffused from the pad film 26 toward the semiconductor substrate 1, the contact resistance of the nMOS 2 to the semiconductor region 2*a* can be reduced. On top of that, the metal film for the bit line conductors may be used also as wiring conductors for constituting peripheral circuits.

Although Embodiment 4 has been described for the case where, for forming the bit line conductors and the first level wiring conductors, contact holes reaching a semiconductor region of the MOS in the peripheral circuit region are formed after the underlying low-resistance polysilicon film 22*i*-4 (see FIG. 70) for constituting bit line conductors is deposited on the insulating film 11*d*-4, the present invention is not limited to this procedure. Alternatively, the following processes may be employed.

First, the underlying low-resistance polysilicon film 22*i*-4 for forming bit line conductors is deposited on the insulating film 11*d*-4, the polysilicon film 22*i*-4 is patterned such that it does not remain in the peripheral circuit region. Subsequently, contact holes reaching a semiconductor region of the MOS in the peripheral circuit region are formed through the insulating film 11*d*-4. After the formation of the contact holes, a predetermined metal film is deposited over the semiconductor substrate. Thereafter, the bit line conductors and the first level wiring conductors are formed by patterning the metal film.

While the present invention has been described for the case where the present invention is applied to a 64-megabit DRAM, which is a field of industrial utilization particularly related thereto, the present invention is not limited to this field, but may be applied to a variety of fields. It is also possible to apply the present invention to DRAM's having different capacities such as 4-megabit or 16-megabit DRAM's, and to other semiconductor integrated circuit devices, for example, a composite gate array having semiconductor memory circuits and so on.

We claim:

1. A semiconductor memory device comprising a memory cell array section and a peripheral circuit section, the memory cell array section including a plurality of memory cells having switching transistors and information storage elements, and bit lines electrically connected to source regions or drain regions of the switching transistors, the peripheral circuit section including wiring electrically connected to semiconductor regions in the peripheral circuit section, said semiconductor regions in the peripheral circuit section being of a conductivity type opposite to that of the source and drain regions of the switching transistor, wherein bit line connection members are provided between said source regions or said drain regions, to which the bit lines are electrically connected, and said bit lines, whereby electrical connection between the bit lines and the source or drain regions is via the bit line connection members, said bit line connection members being made of doped silicon of a same conductivity type as that of said source regions or said drain regions, and wherein said wiring is formed of a same metal layer from which the bit lines are formed.

2. The semiconductor memory device according to claim 1, wherein the information storage elements are information storage capacitors, respectively electrically connected to the other of the source regions and drain regions of the switching transistors, to which the bit lines are not electrically connected.

3. The semiconductor memory device according to claim 1, wherein the source regions or drain regions to which the bit lines are electrically connected have first portions and second portions, the second portions having a higher impurity concentration than that of the first portions, and wherein the bit line connection members are directly connected to said second portions.

4. The semiconductor memory device according to claim 3, wherein said second portions are portions formed by diffusing impurities from the bit line connection members into the source regions or the drain regions to which the bit lines are electrically connected.

5. The semiconductor memory device according to claim 4, wherein said same conductivity type, of the bit line connection members and the source regions or the drain regions to which the bit lines are electrically connected, is n-type conductivity, said second portions being an $n^+$-regions.

6. The semiconductor memory device according to claim 3, wherein said same conductivity type, of the bit line connection members and the source regions or the drain regions to which the bit lines are electrically connected, is n-type conductivity, said second portions being an $n^+$-regions.

7. The semiconductor memory device according to claim 1, wherein said same metal layer is made of tungsten.

8. The semiconductor memory device according to claim 1, wherein the bit lines and the wiring are formed by providing said same metal layer and selectively etching said same metal layer to simultaneously form the bit lines and the wiring.

9. The semiconductor memory device according to claim 1, wherein said semiconductor regions in the peripheral circuit section, to which the wiring is electrically connected, include at least one of source regions and drain regions of transistors of the peripheral circuit section.

10. The semiconductor memory device according to claim 1, wherein the bit line connection members are members buried in contact holes for exposing said source regions or said drain regions to which the bit lines are electrically connected.

11. The semiconductor memory device according to claim 1, wherein the plurality of memory cells include adjacent memory cells sharing a common source region or drain region for respective switching transistors, a respective bit line being electrically connected to said common source region or drain region.

12. The semiconductor memory device according to claim 1, wherein the bit line connection members are made of doped polycrystalline silicon.

13. The semiconductor memory device according to claim 1, wherein said bit line connection members are a layer of doped silicon extending between the bit lines and the source regions or drain regions to which the bit lines are electrically connected such that the bit line connection members and the bit lines form a laminate.

14. The semiconductor memory device according to claim 13, wherein said doped silicon is doped polycrystalline silicon.

15. The semiconductor memory device according to claim 13, wherein said wiring is made of a metal, of said same metal layer, which directly contacts the semiconductor regions in the peripheral circuit section.

16. A semiconductor memory device comprising a memory cell array section and a peripheral circuit section, the memory cell array section including a plurality of memory cells having switching transistors and information storage elements, and bit lines electrically connected to source regions or drain regions of the switching transistors, the peripheral circuit section including wiring electrically connected to semiconductor regions in the peripheral circuit section, said semiconductor regions in the peripheral circuit section being of opposite conductivity type to that of the source regions or drain regions of the switching transistors to which the bit lines are electrically connected, wherein bit line connection members are provided between said source regions or said drain regions, to which the bit lines are electrically connected, and said bit lines, whereby electrical connection between the bit lines and the source or drain regions is via the bit line connection members, said bit line connection members being made of doped silicon of a same conductivity type as that of said source regions or said drain regions, and wherein said wiring and said bit lines are provided on a same insulating film, the bit line connection members extending through the insulating film so as to provide electrical connection between the source regions or drain regions and the bit lines, said doped silicon of a same conductivity type as that of said source regions or said drain regions not being provided between said wiring and said semiconductor regions in the peripheral circuit section.

17. A semiconductor memory device comprising a memory cell array section and a peripheral circuit section, the memory cell array section including a plurality of memory cells having switching transistors and information storage elements, and bit lines electrically connected to source regions or drain regions of the switching transistors, the peripheral circuit section including wiring electrically connected to semiconductor regions in the peripheral circuit section, said semiconductor regions in the peripheral circuit section being of a conductivity type opposite to that of the source regions or drain regions of the switching transistors, wherein said bit lines are made of a laminate of a doped silicon layer as a lower layer and a metal layer as an upper layer, the doped silicon layer being doped a same conductivity type as the source regions or the drain regions to which the bit lines are electrically connected, and said wiring is made of said metal layer, said metal layer directly contacting the semiconductor regions in the peripheral circuit section.

18. The semiconductor memory device according to claim 17, wherein the doped silicon layer is a doped polycrystalline silicon layer.

19. The semiconductor memory device according to claim 17, wherein the metal layer is a tungsten layer.

20. The semiconductor memory device according to claim 16, wherein said wiring and said bit lines are made of a metal, and said wiring is directly electrically connected to said semiconductor regions in the peripheral circuit section.

21. The semiconductor memory device according to claim 16, wherein said wiring and said bit lines are of a same metal, formed from a same metal layer.

22. A semiconductor memory device comprising a memory cell array section and a peripheral circuit section, the memory cell array section including a plurality of memory cells each having a switching transistor and an information storage element, and a bit line electrically connected to a source region or a drain region of the switching transistor, the peripheral circuit section including wiring electrically connected to a semiconductor region in the peripheral circuit section, said semiconductor region in the peripheral circuit section being of a conductivity type opposite to that of the source or drain region of the switching transistor, and a bit line connection member provided between said source region or drain region, to which said bit line is electrically connected, and said bit line, whereby electrical connection between the bit line and the source region or drain region is via the bit line connection member, said bit line connection member being made of doped silicon of a same conductivity type as that of said source region or drain region of said switching transistor, and wherein said wiring and said bit line are made of tungsten, and said wiring is electrically connected to the semiconductor region in the peripheral circuit section.

23. The semiconductor memory device according to claim 22, wherein said wiring is directly electrically connected to the semiconductor region in the peripheral circuit section.

24. The semiconductor memory device according to claim 22, wherein said source region or drain region has N-type conductivity and said semiconductor region in said peripheral circuit section has P-type conductivity.

25. The semiconductor memory device according to claim 24, further comprising:

a further semiconductor region having N-type conductivity in said peripheral circuit section; and a further wiring formed in said peripheral circuit section and electrically connected to said further semiconductor region, wherein said further wiring is made of said tungsten.

* * * * *